United States Patent
Takasu et al.

(10) Patent No.: US 12,154,648 B2
(45) Date of Patent: Nov. 26, 2024

(54) SEMICONDUCTOR DEVICE, SEMICONDUCTOR MEMORY DEVICE, AND MANUFACTURING METHOD OF SEMICONDUCTOR DEVICE

(71) Applicant: Kioxia Corporation, Tokyo (JP)

(72) Inventors: Yoshiyuki Takasu, Yokohama (JP); Fumiharu Nakajima, Yokohama (JP)

(73) Assignee: Kioxia Corporation, Tokyo (JP)

( * ) Notice: Subject to any disclaimer, the term of this patent is extended or adjusted under 35 U.S.C. 154(b) by 207 days.

(21) Appl. No.: 17/931,604

(22) Filed: Sep. 13, 2022

(65) Prior Publication Data
US 2023/0307010 A1 Sep. 28, 2023

(30) Foreign Application Priority Data
Mar. 24, 2022 (JP) ................. 2022-048592

(51) Int. Cl.
*H01L 23/528* (2006.01)
*G11C 5/02* (2006.01)
*G11C 16/08* (2006.01)

(52) U.S. Cl.
CPC .............. *G11C 5/025* (2013.01); *G11C 16/08* (2013.01); *H01L 23/5283* (2013.01)

(58) Field of Classification Search
CPC .................................. H01L 23/5283
USPC .......................................... 257/773
See application file for complete search history.

(56) References Cited

U.S. PATENT DOCUMENTS

| 8,884,436 | B2 | 11/2014 | Yang |
| 9,786,556 | B2 | 10/2017 | Wang et al. |
| 2010/0155959 | A1 | 6/2010 | Park et al. |
| 2011/0062595 | A1 | 3/2011 | Sim et al. |
| 2013/0241072 | A1* | 9/2013 | Sato ................. H01L 21/0337 257/773 |
| 2015/0021790 | A1 | 1/2015 | Nagashima et al. |

FOREIGN PATENT DOCUMENTS

| JP | 2010-153869 A | 7/2010 |
| JP | 2011-66409 A | 3/2011 |
| JP | 2015-23225 A | 2/2015 |

* cited by examiner

*Primary Examiner* — Hoai V Ho
(74) *Attorney, Agent, or Firm* — Oblon, McClelland, Maier & Neustadt, L.L.P.

(57) ABSTRACT

A semiconductor device according to one embodiment includes first and second conductors, a first insulator, and first and second contacts. The first conductor includes a first pad portion. The first pad portion includes first and second sub portions. Each of the first and second sub portions includes one and another end portions. The first sub portion is adjacent to the second pad portion. The second sub portion is adjacent to the first insulator. A length of the second sub portion of the first pad portion is less than a length of the first sub portion of the first pad portion.

14 Claims, 29 Drawing Sheets

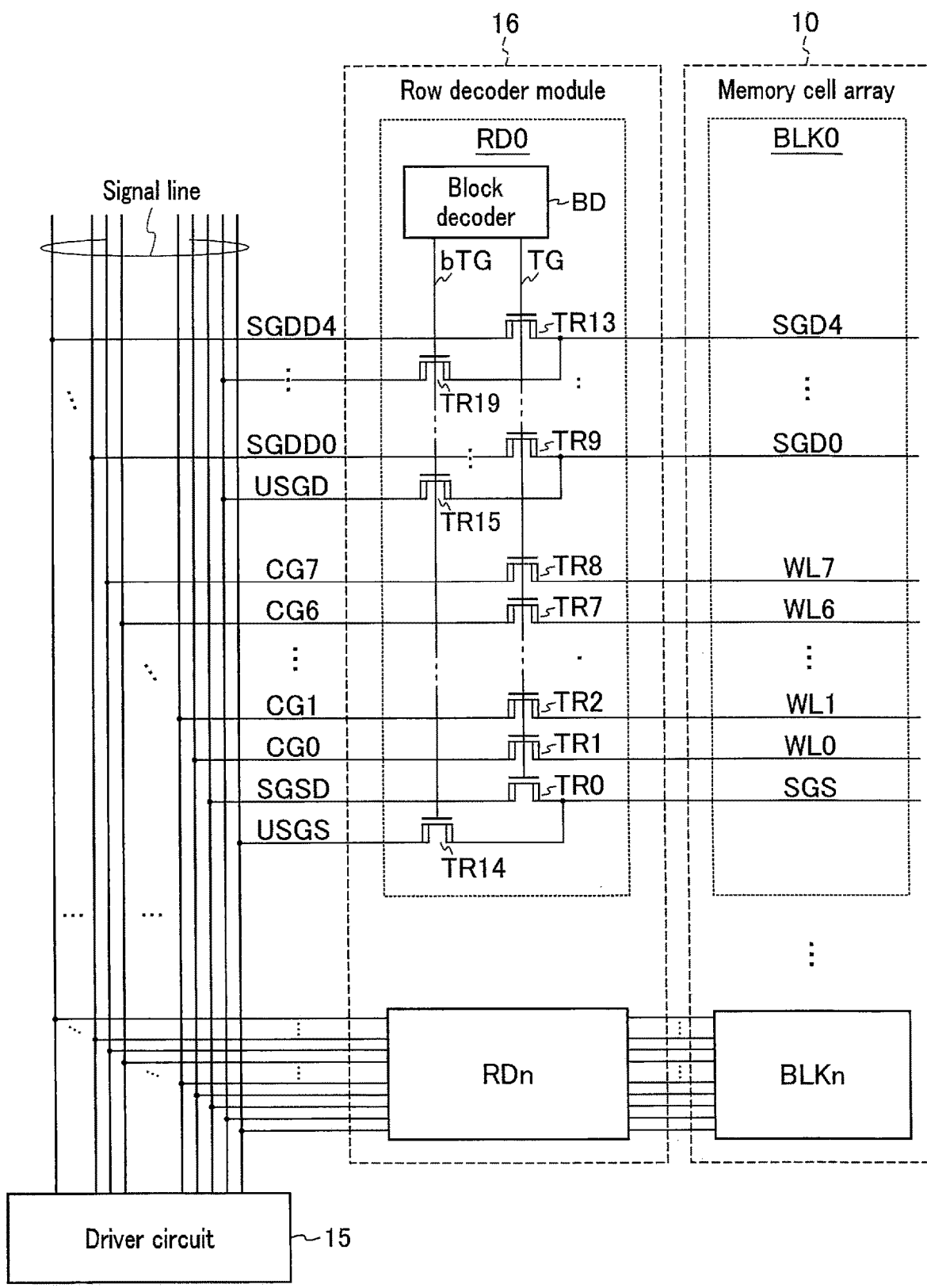
F I G. 3

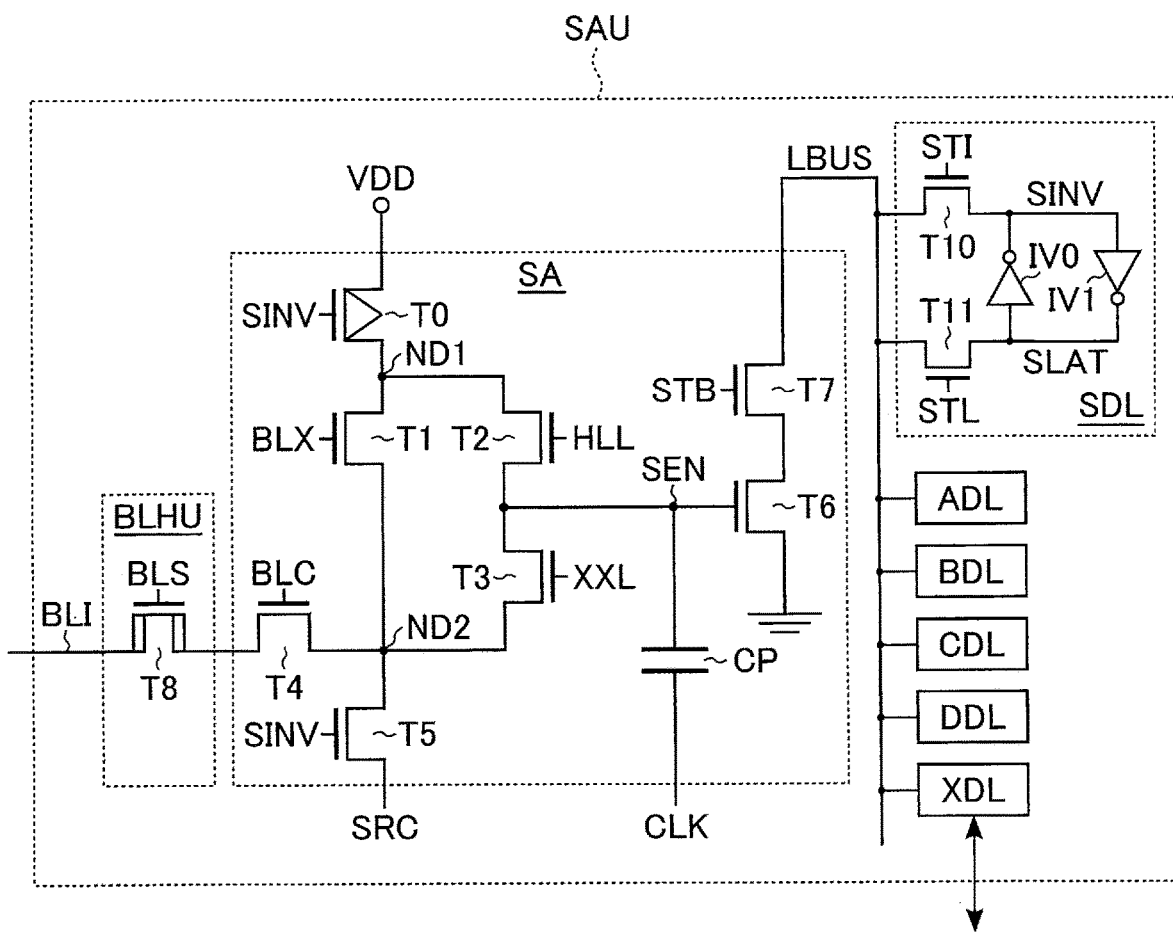
F I G. 4

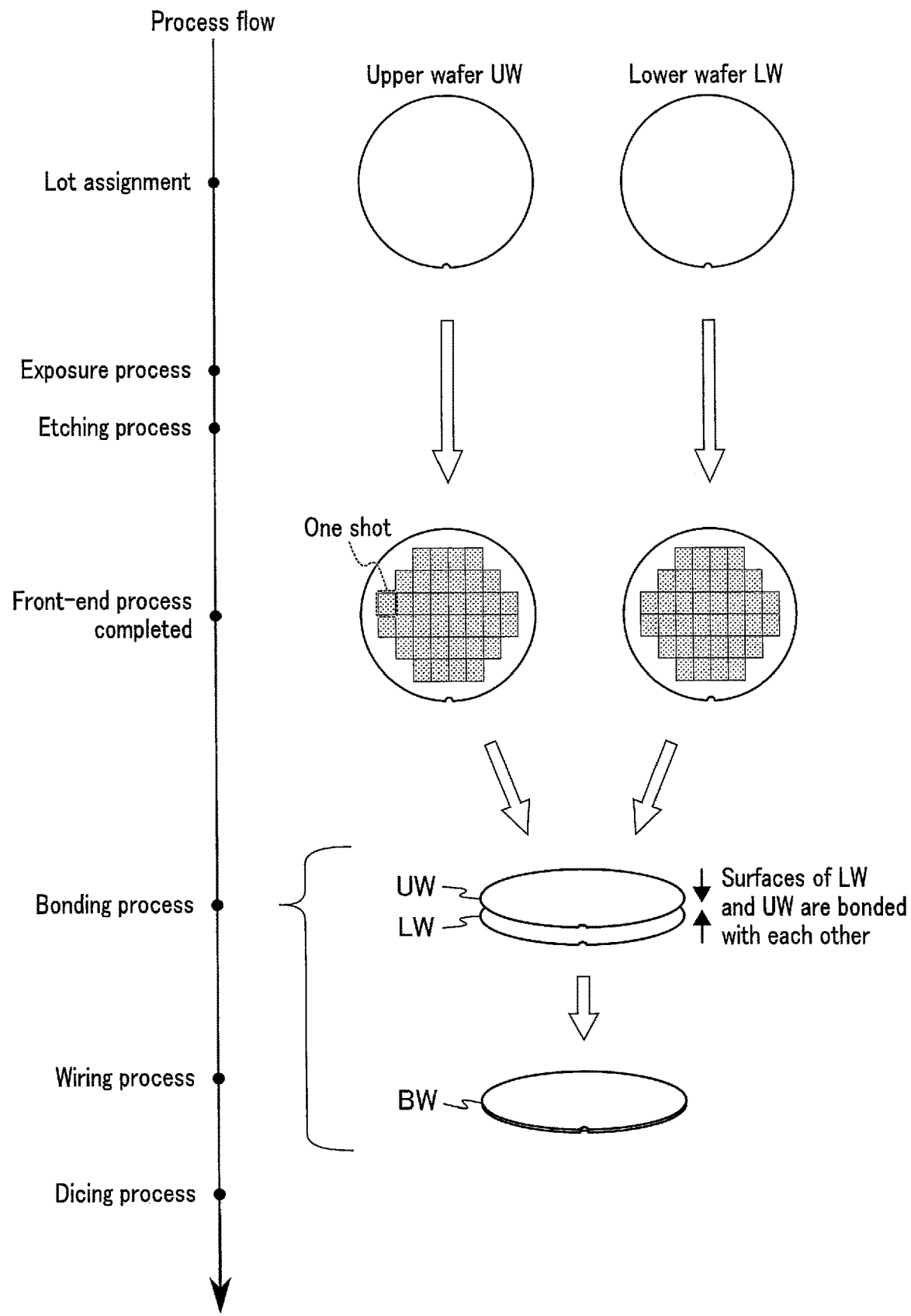
F I G. 5

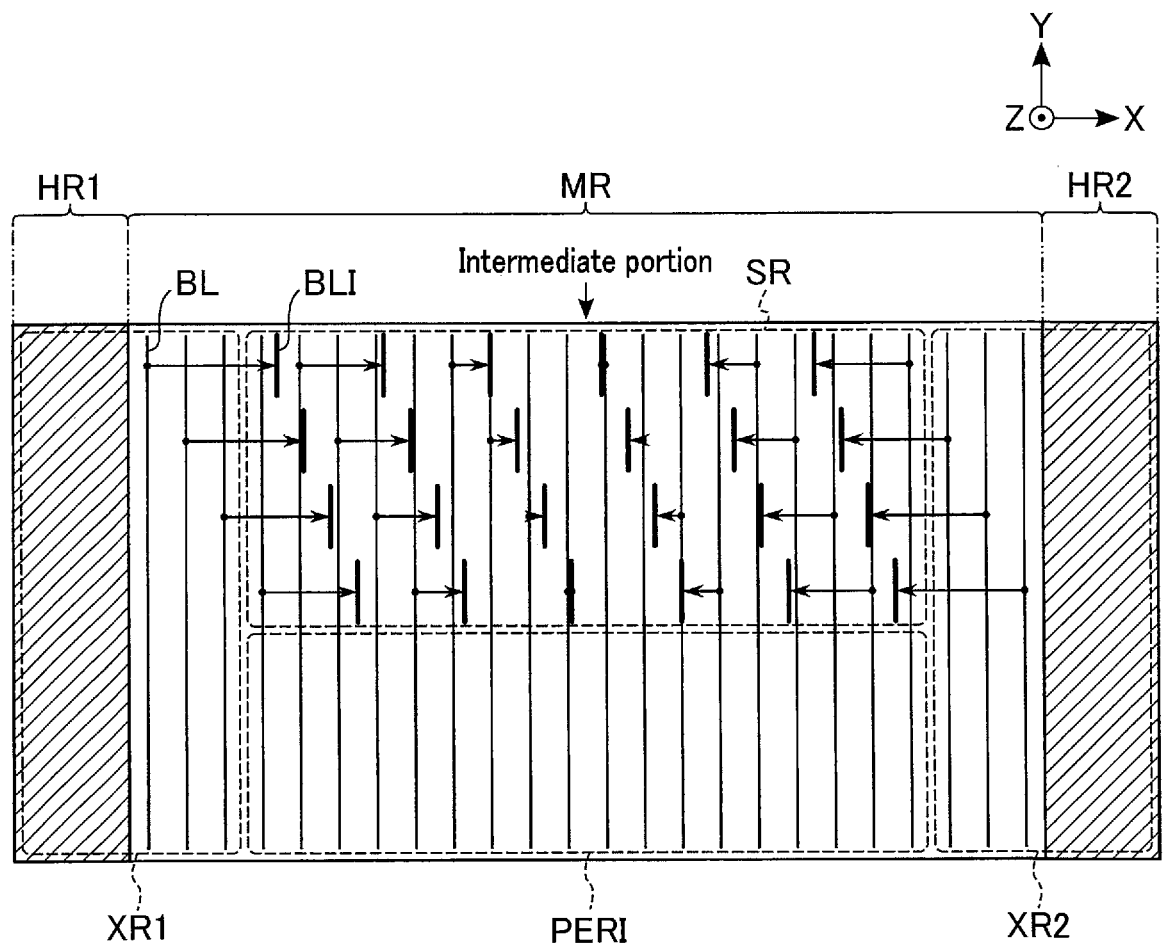
F I G. 15

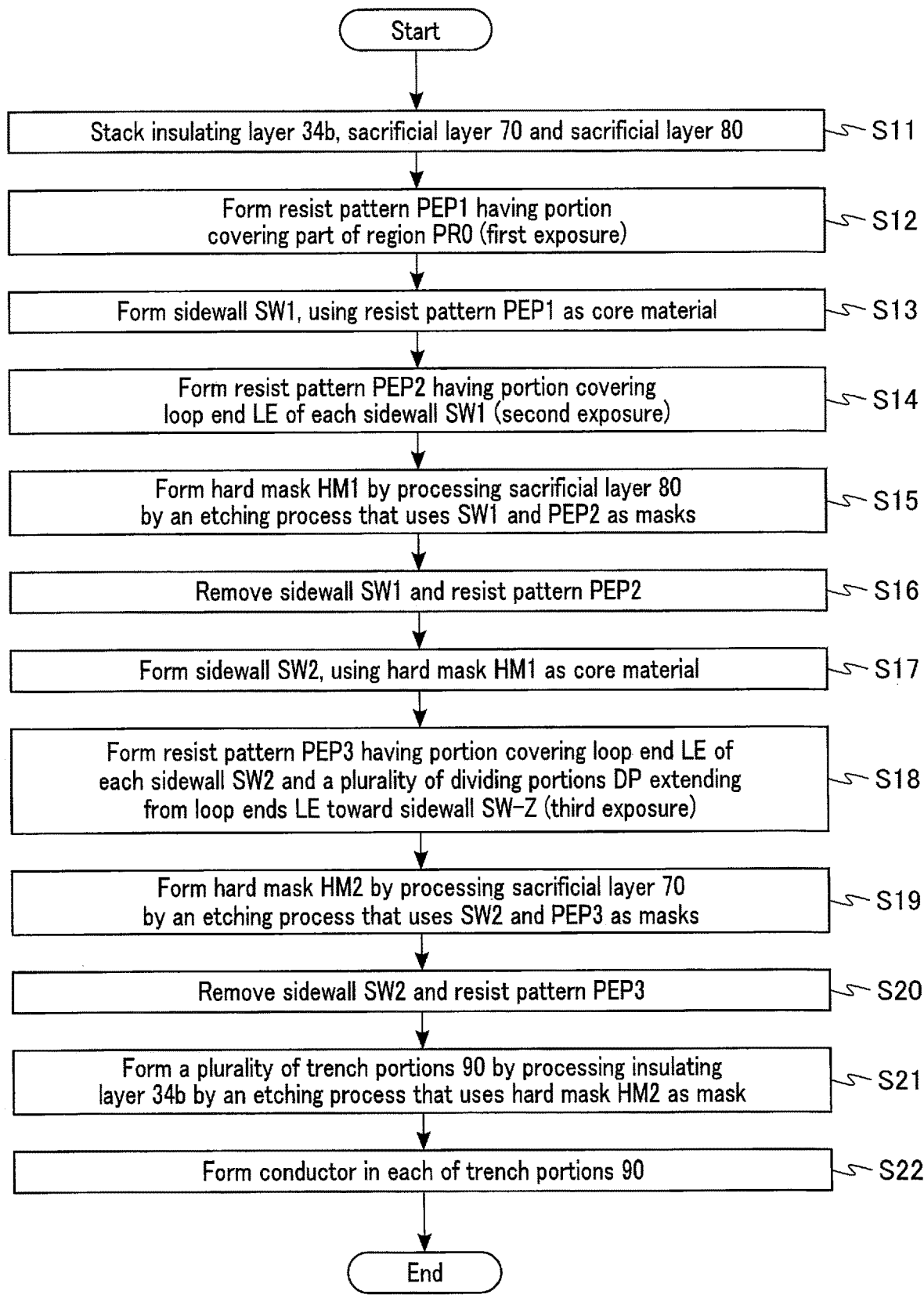
F I G. 17

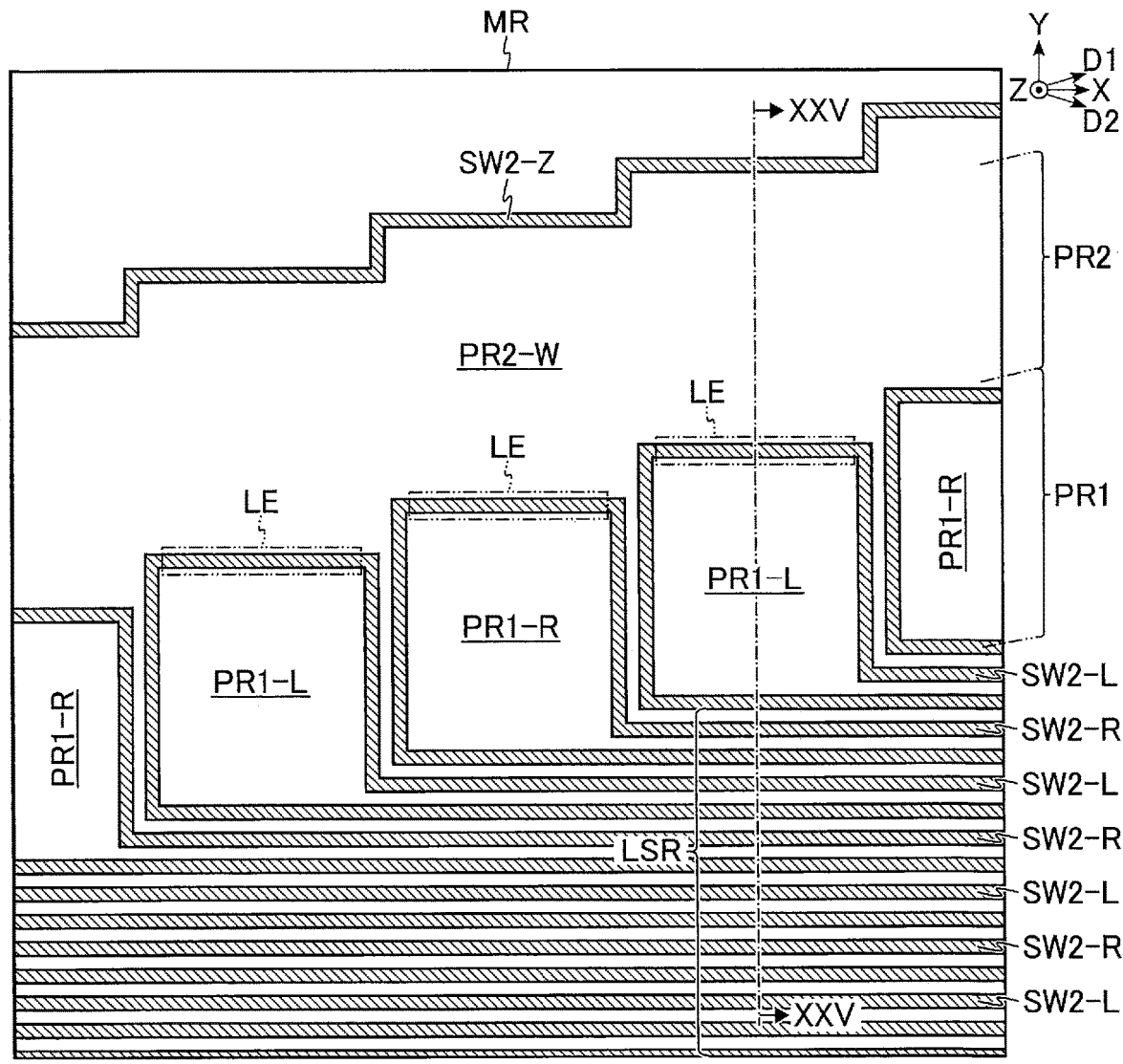
F I G. 24
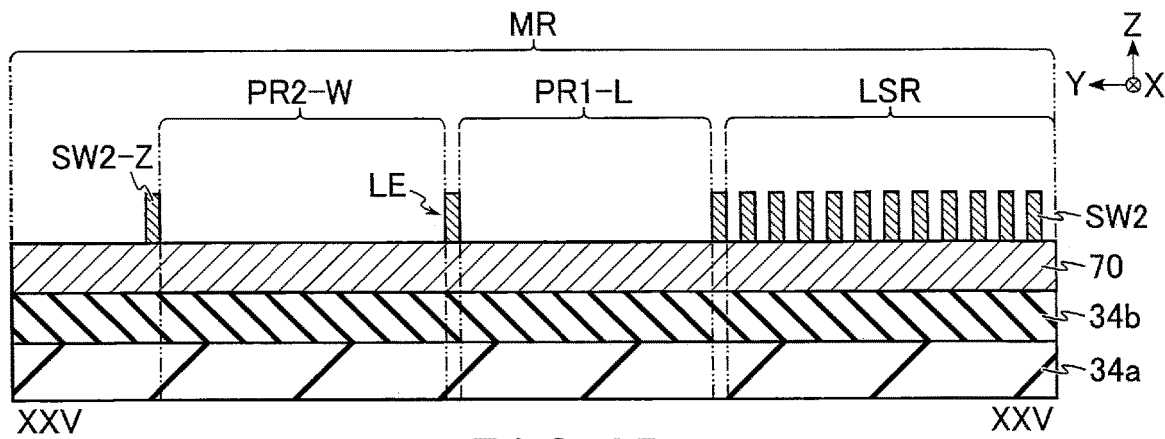
F I G. 25

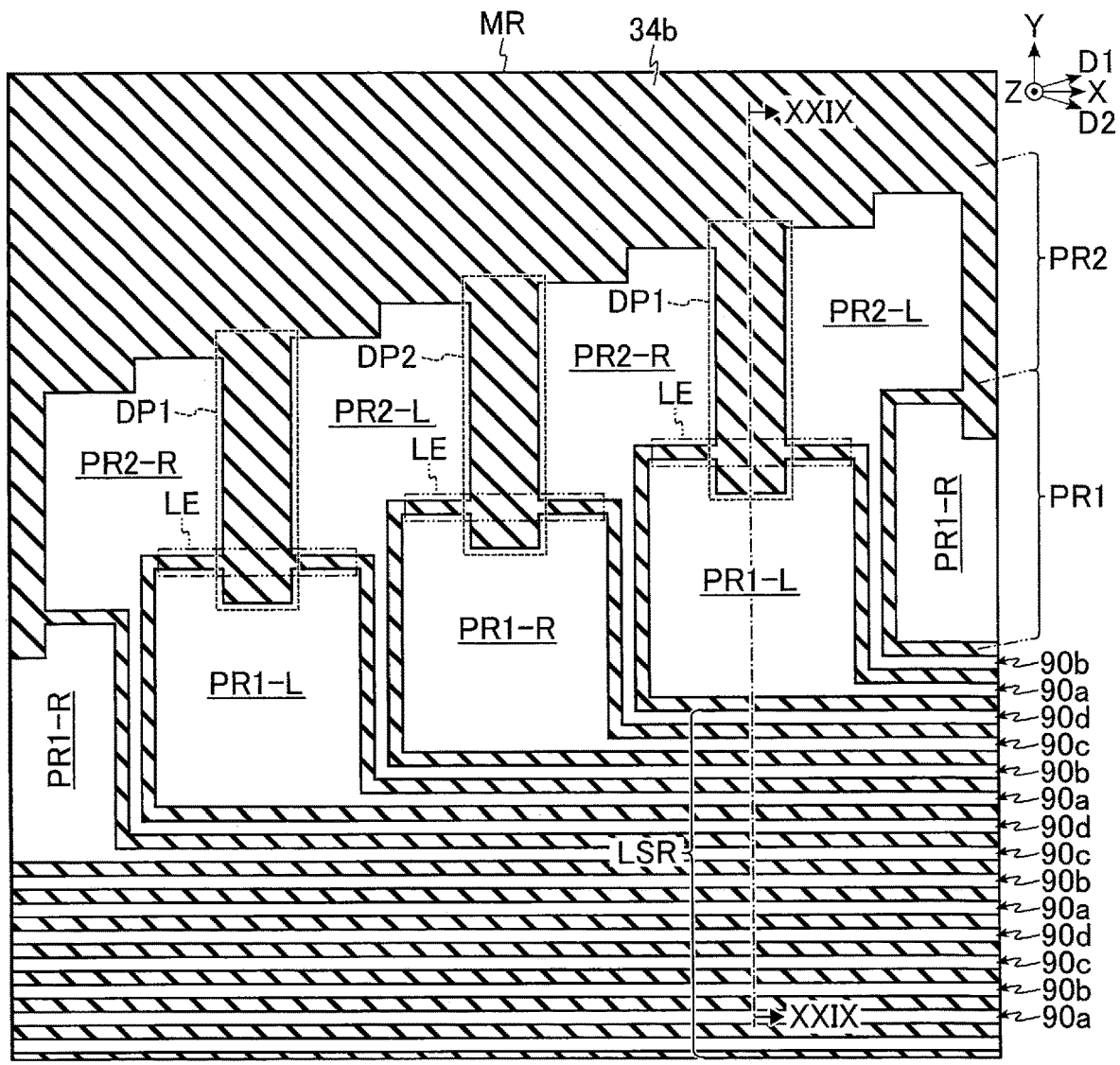
F I G. 28
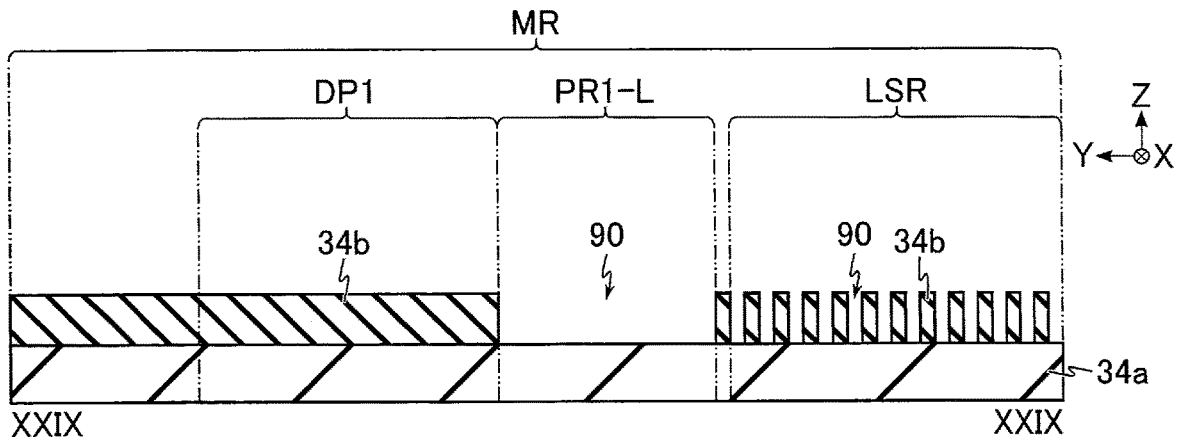
F I G. 29

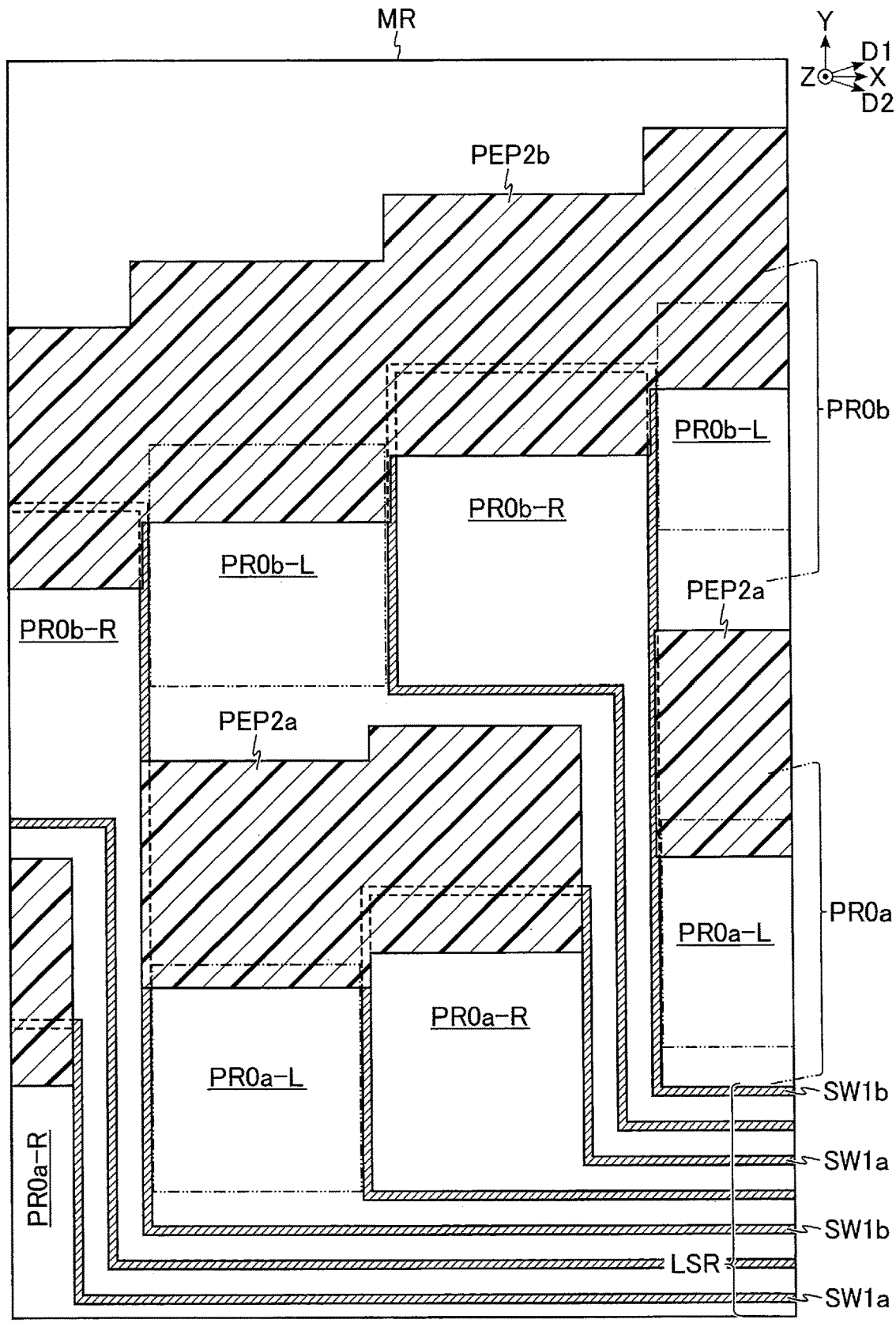
F I G. 35

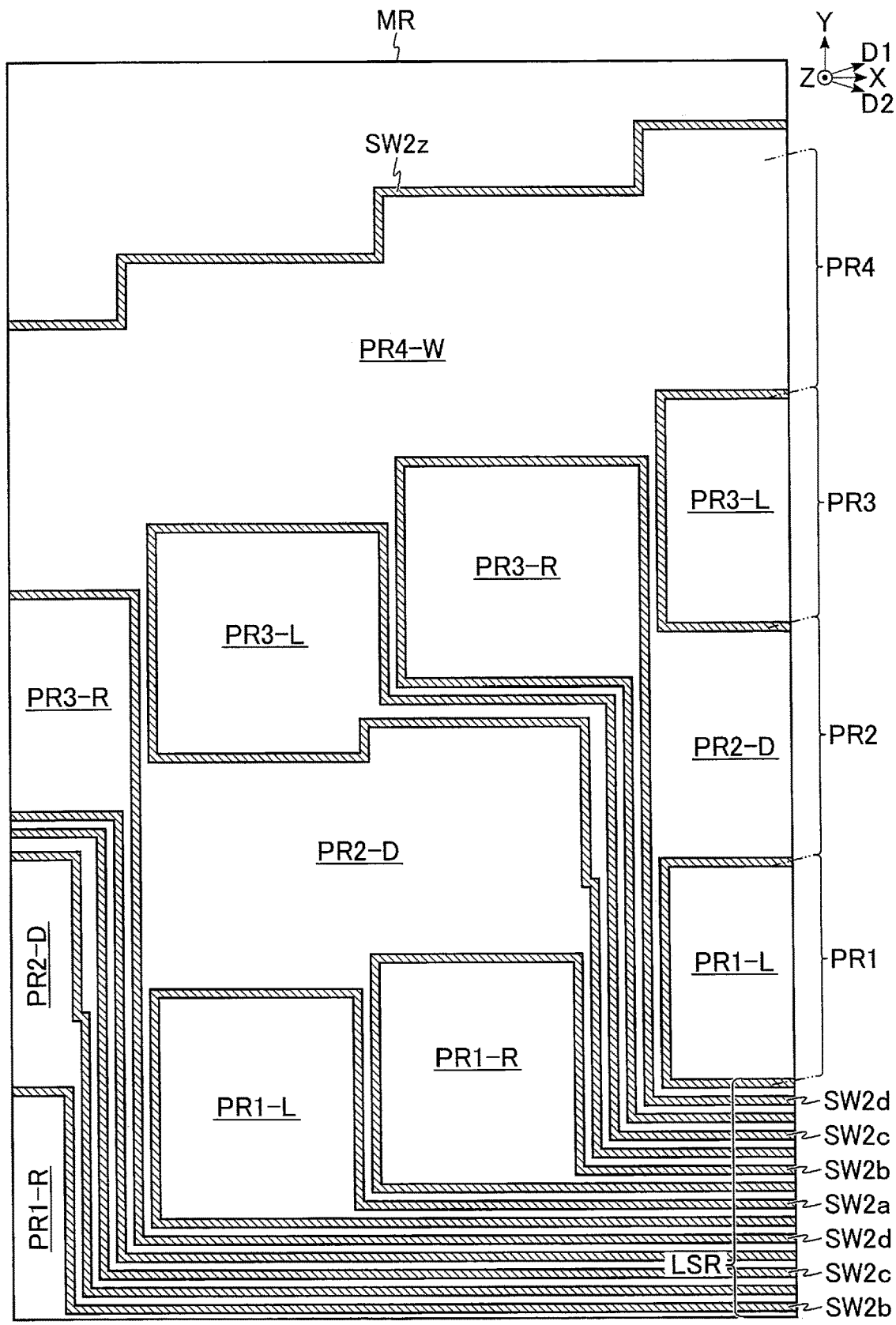
F I G. 36

SEMICONDUCTOR DEVICE, SEMICONDUCTOR MEMORY DEVICE, AND MANUFACTURING METHOD OF SEMICONDUCTOR DEVICE

CROSS-REFERENCE TO RELATED APPLICATIONS

This application is based upon and claims the benefit of priority from Japanese Patent Application No. 2022-048592, filed Mar. 24, 2022, the entire contents of which are incorporated herein by reference.

FIELD

Embodiments described herein relate generally to a semiconductor device, a semiconductor memory device, and a manufacturing method of a semiconductor device.

BACKGROUND

A NAND flash memory capable of storing data in a nonvolatile manner is known in the art.

BRIEF DESCRIPTION OF THE DRAWINGS

FIG. 3 is a circuit diagram illustrating an example of a circuit configuration of a row decoder module provided in the semiconductor memory device of the first embodiment.

FIG. 4 is a circuit diagram illustrating an example of a circuit configuration of a sense amplifier module provided in the semiconductor memory device of the first embodiment.

FIG. 5 is a schematic diagram showing an outline of a bonding structure of the semiconductor memory device of the first embodiment.

FIG. 15 is a plan view showing an example of an interconnect layout used for coupling a bit line and a sense amplifier unit in the semiconductor memory device of the first embodiment.

FIG. 17 is a flowchart illustrating an example of a method of manufacturing the semiconductor memory device 1 of the first embodiment.

FIG. 24 is a plan view showing an example of a planar layout in which the structure of the interconnect layer M1 is formed in the memory region of the memory cell array of the semiconductor memory device of the first embodiment.

FIG. 25 is a cross-sectional view taken along line XXV-XXV of FIG. 24 and showing an example of a cross-sectional structure depicting how the structure of the interconnect layer M1 is formed in the semiconductor memory device of the first embodiment.

FIG. 28 is a plan view showing an example of a planar layout in which the structure of the interconnect layer M1 is formed in the memory region of the memory cell array of the semiconductor memory device of the first embodiment.

FIG. 29 is a cross-sectional view taken along line XXIX-XXIX of FIG. 28 and showing an example of a cross-sectional structure depicting how the structure of the interconnect layer M1 is formed in the semiconductor memory device of the first embodiment.

FIG. 35 is a plan view showing an example of a planar layout in which the structure of an interconnect layer M1 is formed in the memory region of the memory cell array of the semiconductor memory device of the second embodiment.

FIG. 36 is a plan view showing an example of a planar layout in which the structure of an interconnect layer M1 is formed in the memory region of the memory cell array of the semiconductor memory device of the second embodiment.

DETAILED DESCRIPTION

Figure 1:
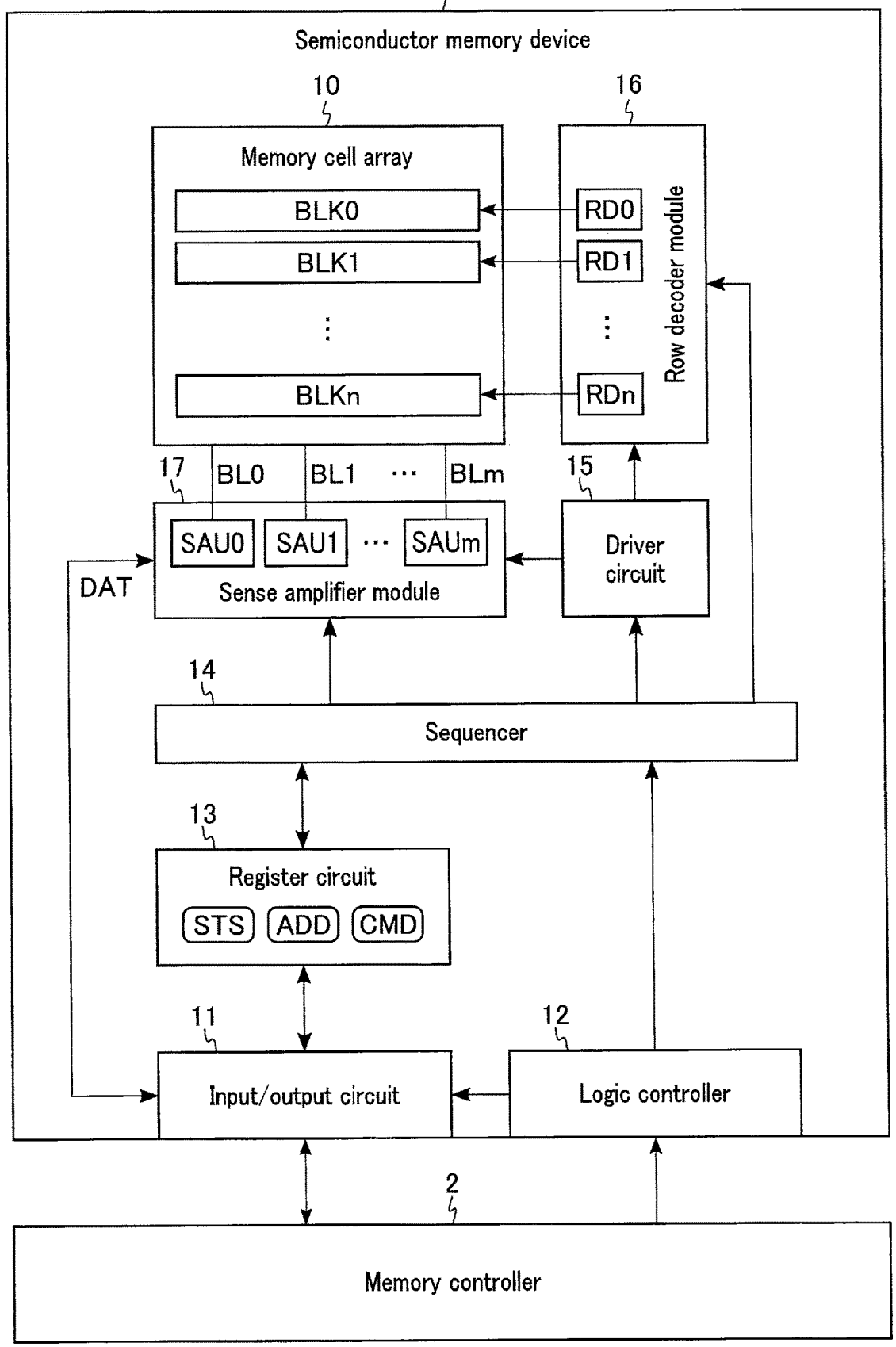
FIG. 1 is a block diagram illustrating an example of an overall configuration of a semiconductor memory device 1 according to the first embodiment.

In general, according to one embodiment, a semiconductor device includes a first conductor, a second conductor, a first insulator, a first contact, and a second contact. The first conductor includes a first portion and a first pad portion. The first portion is provided to extend in a first direction. The first pad portion includes a portion extending from an end portion of the first portion in a second direction that intersects the first direction. The second conductor includes a second portion, a third portion and a second pad portion and is provided away from the first conductor. The second portion is provided to extend in the first direction. The third portion is provided to extend in the second direction from an end portion of the second portion. The second pad portion includes a portion extending from an end portion of the third portion in the first direction. The first insulator is adjacent to the second pad portion in the first direction. The first contact is coupled to the first pad portion. The second contact is coupled to the second pad portion. The first pad portion includes a first sub portion and a second sub portion adjacent to each other in the first direction. Each of the first sub portion and the second sub portion includes one end portion and another end portion of the first pad portion, as viewed in the second direction. The first sub portion is adjacent to the second pad portion in the second direction. the second sub portion is adjacent to the first insulator in the second direction. A length of the second sub portion of the first pad portion, as viewed along the second direction, is less than a length of the first sub portion of the first pad portion, as viewed along the second direction.

Embodiments will now be described with reference to the accompanying drawings. Each embodiment illustrates a device and a method for embodying the technical idea of the invention. The drawings are schematic or conceptual. The dimensions and scales of the drawings are not necessarily the same as those of actual products. The illustration of a structure is omitted as appropriate. The hatching added to the plan views is not necessarily related to the materials or characteristics of the structural components. In the present specification, the same symbols are added to the components or elements having substantially the same function and configuration. Numbers, letters, etc. added to the reference symbols are referred to by the same reference symbols and are used to distinguish between similar elements.

[1] First Embodiment

The first embodiment relates to a layout and a formation method of a pad portion of an interconnect used in a semiconductor device. In the description below, a semiconductor memory device 1 of the first embodiment will be described as one type of semiconductor device of the first embodiment. The semiconductor memory device 1 is, for example, a NAND flash memory capable of storing data in a nonvolatile manner.

[1-1] Configuration

[1-1-1] Overall Configuration of Semiconductor Memory Device 1

FIG. 1 is a block diagram showing an example of an overall configuration of a semiconductor memory device 1 according to the first embodiment. As shown in FIG. 1, the semiconductor memory device 1 can be controlled by an external memory controller 2. The semiconductor memory device 1 includes, for example, a memory cell array 10, an input/output circuit 11, a logic controller 12, a register circuit 13, a sequencer 14, a driver circuit 15, a row decoder module 16, and a sense amplifier module 17.

The memory cell array 10 is a memory circuit including a plurality of blocks BLK0 to BLKn ("n" is an integer of 1 or more). Each block BLK is a set of memory cells. The block BLK contains a plurality of pages. A "page" corresponds to a unit of data reading and a unit of data writing in a NAND flash memory. The block BLK corresponds to, for example, a unit of data erasing. The memory cell array 10 is provided with a plurality of bit lines BL0 to BLm ("m" is an integer of 1 or more) and a plurality of word lines WL. Each memory cell is associated, for example, with one bit line and one word line. A block address is assigned to each block BLK. A column address is assigned to each bit line BL. A page address is assigned to each word line WL.

The input/output circuit 11 is an interface circuit that controls the transmission/reception of input/output signals to/from the memory controller 2. The input/output signals include, for example, data. DAT, status information STS, address information ADD, commands CMD, and the like. The input/output circuit 11 can input or output data DAT between the sense amplifier module 17 and the memory controller 2. The input/output circuit 11 can output the status information STS transferred from the register circuit 13 to the memory controller 2. The input/output circuit 11 can output each of the address information ADD and the command CMD, which are transferred from the memory controller 2, to the register circuit 13.

The logic controller 12 is a circuit that controls each of the input/output circuit 11 and the sequencer 14, based on the control signal input from the memory controller 2. For example, the logic controller 12 controls the sequencer 14, based on the control signal, and enables the semiconductor memory device 1. The logic controller 12 notifies the input/output circuit 11 that the input/output signal received by the input/output circuit 11 based on the control signal is a command CMD, address information ADD, or the like. The logic controller 12 commands the input/output circuit 11 to input or output an input/output signal, based on the control signal.

The register circuit 13 is a circuit that temporarily stores the status information STS, the address information ADD, and the command CMD. The status information STS is updated based on the control of the sequencer 14, and is transferred to the input/output circuit 11. The address information ADD includes a block address, a page address, a column address, and the like. The command CMD includes commands related to various operations of the semiconductor memory device 1.

The sequencer 14 is a controller that controls the overall operation of the semiconductor memory device 1. The sequencer 14 executes a read operation, a write operation, an erase operation, and the like, based on the commands CMD and the address information ADD stored in the register circuit 13.

The driver circuit 15 is a circuit that generates voltages used in a read operation, a write operation, an erase operation, and the like. The driver circuit 15 supplies the generated voltages to the row decoder module 16, the sense amplifier module 17, and the like.

The row decoder module 16 is a circuit used for selecting a block BLK to be operated and transferring a voltage to such an interconnect as a word line WL. The row decoder module 16 includes a plurality of row decoders RD0 to RDn. The row decoders RD0 to RDn are associated with the blocks BLK0 to BLKn, respectively.

The sense amplifier module 17 is a circuit used for transferring a voltage to each bit line BL and for reading data. The sense amplifier module 17 includes a plurality of sense amplifier units SAU0 to SAUm. The sense amplifier units SAU0 to SAUm are associated with a plurality of bit lines BL0 to BLm, respectively.

The combination of the semiconductor memory device 1 and the memory controller 2 may constitute one semiconductor device. Examples of such a semiconductor device include a memory card such as an SD™ card, and an SSD (solid state drive).

[1-1-2] Circuit Configuration of Semiconductor Memory Device 1

Next, a description will be given of the circuit configuration of the semiconductor memory device 1 of the first embodiment.

(1: Circuit Configuration of Memory Cell Array 10)

Figure 2:
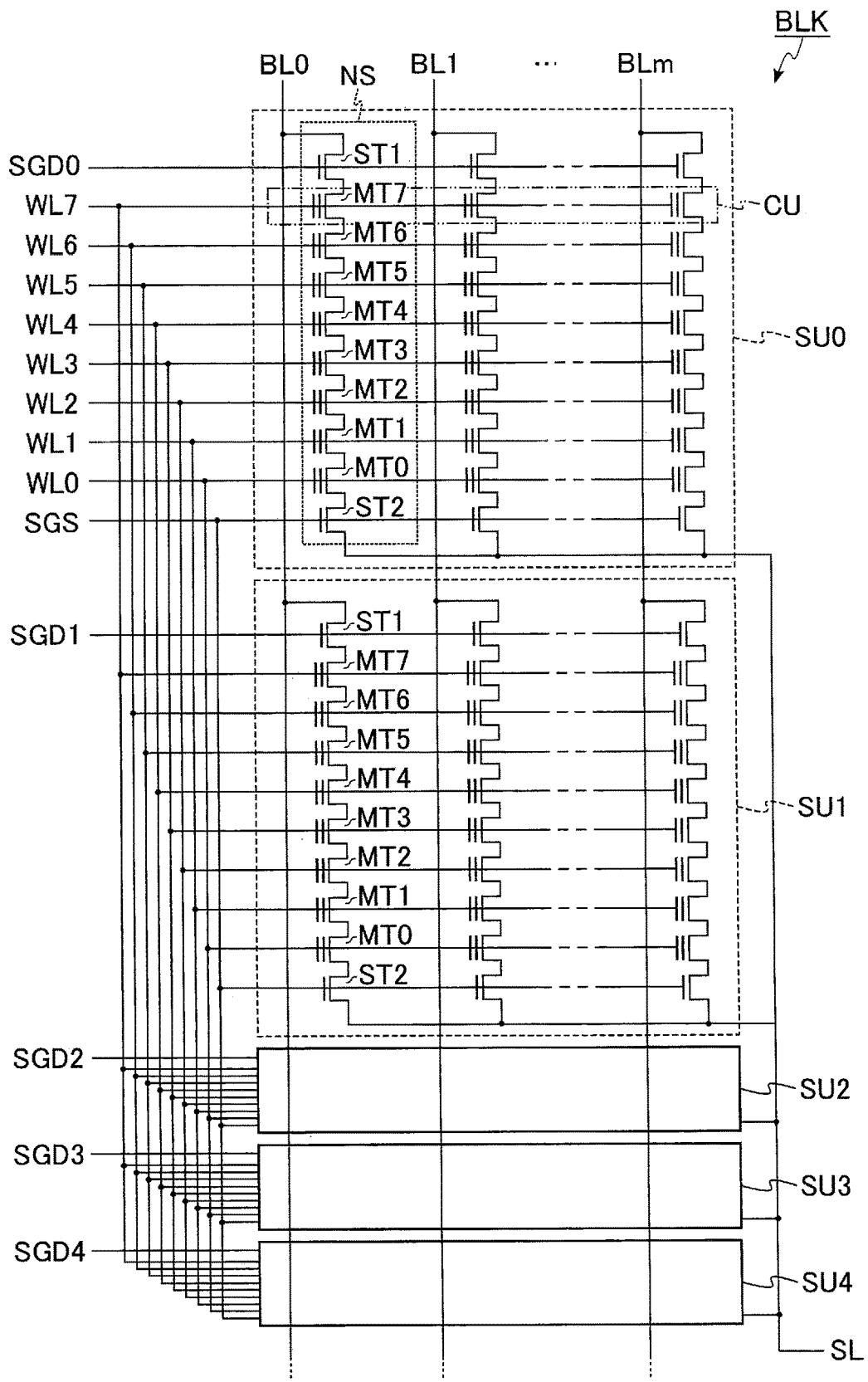
FIG. 2 is a circuit diagram illustrating an example of a circuit configuration of a memory cell array provided in the semiconductor memory device of the first embodiment.

FIG. 2 is a circuit diagram illustrating an example of a circuit configuration of a memory cell array 10 provided in the semiconductor memory device 1 of the first embodiment. FIG. 2 shows one block BLK that is among a plurality of blocks BLK included in the memory cell array 10. As shown in FIG. 2, the block BLK includes, for example, five string units SU0 to SU4. Select gate lines SGD0 to SGD4 and SGS and word lines WL0 to WL7 are provided for each block BLK. The bit lines BL0 to BLm and the source line SL are shared by a plurality of blocks BLK.

Each string unit SU includes a plurality of NAND strings NS. Each of the plurality of NAND strings NS is associated with bit lines BL0 to BLm ("m" is an integer of 1 or more), respectively. That is, each bit line BL is shared by the NAND strings NS which are included in the plurality of blocks BLK and to which the same column address is assigned. Each NAND string NS is coupled between the associated bit line BL and the source line SL. Each NAND string NS includes, for example, memory cell transistors MT0 to MT7 and select transistors ST1 and ST2. Each memory cell transistor MT includes a control gate and a charge storage layer, and holds (stores) data in a nonvolatile manner. Each of the select transistors ST1 and ST2 is used to select a string unit SU.

In each NAND string NS, the select transistor ST1, the memory cell transistors MT7 to MT0, and the select transistor ST2 are coupled in series in the order mentioned. Specifically, the drain and source of the select transistor ST1 are coupled to the associated bit line BL and the drain of the memory cell transistor MT7, respectively. The drain and source of the select transistor ST2 are coupled to the source of the memory cell transistor MT0 and the source line SL, respectively. The memory cell transistors MT0 to MT7 are coupled in series between the select transistors ST1 and ST2.

The select gate lines SGD0 to SGD4 are associated with the string units SU0 to SU4, respectively. Each select gate line SGD is coupled to the gate of the corresponding one of the plurality of the select transistors ST1 included in the associated string unit SU. The select gate line SGS is coupled to the gate of the corresponding one of the plurality of select transistors ST2 included in the associated block BLK. The word lines WL0 to WL7 are coupled to the control gates of the memory cell transistors MT0 to MT7, respectively.

The set of a plurality of memory cell transistors MT coupled to a common word line WL in the same string unit SU is referred to, for example, as a "cell unit CU". For example, the storage capacity which the cell unit CU has when each memory cell transistor MT stores 1-bit data is defined as "1 page data". The cell unit CU may have a storage capacity of two pages or more in accordance with the number of bits of data stored in each memory cell transistor MT.

The memory cell array 10 provided in the semiconductor memory device 1 of the first embodiment may have another circuit configuration. For example, the number of string units SU included in each block BLK and the numbers of memory cell transistors MT and select transistors ST1 and ST2 included in each NAND string NS can be designed to be optional numbers.

(2: Circuit Configuration of Row Decoder Module 16)

FIG. 3 is a circuit diagram illustrating an example of a circuit configuration of the row decoder module 16 provided in the semiconductor memory device 1 of the first embodiment. FIG. 3 shows how the row decoder module 16, the driver circuit 15 and the memory cell array 10 are coupled to each other, and also shows a detailed circuit configuration of the row decoder RD0 included among the row decoders RD0 to RDn. As shown in FIG. 3, each row decoder RD and the driver circuit 15 are coupled via signal lines CG0 to CG7, SGDD0 to SGDD4, SGSD, USGD, and USGS. Each row decoder RD and the associated block BLK are coupled via word lines WL0 to WL7 and select gate lines SGS and SGD0 to SGD4.

A description will be given of how the elements of the row decoder RD are coupled to the driver circuit 15 and the block BLK0, with attention paid to the row decoder RD0. The configuration of the other row decoders RD is similar to that of the row decoder RD0, except that the associated block BLK is different. The row decoder RD0 includes, for example, transistors TR0 to TR19, transfer gate lines TG and bTG, and a block decoder BD.

Each of the transistors TR0 to TR19 is a high breakdown voltage n-type MOS transistor. The drain and source of the transistor TR0 are coupled to the signal line SGSD and the select gate line SGS, respectively. The drains of the transistors TR1 to TR8 are coupled to the signal lines CG0 to CG7, respectively. The sources of the transistors TR1 to TR8 are coupled to the word lines WL0 to WL7, respectively. The drains of the transistors TR9 to TR13 are coupled to the signal lines SGDD0 to SGDD4, respectively. The sources of the transistors TR9 to TR13 are coupled to the select gate lines SGD0 to SGD4, respectively. The drain and source of the transistor TR14 are coupled to the signal line USGS and the select gate line SGS, respectively. The drains of the transistors TR15 to TR19 are coupled to the signal line USGD. The sources of the transistors TR15 to TR19 are coupled to select gate lines SGD0 to SGD4, respectively. The gates of the transistors TR0 to TR13 are coupled to the transfer gate line TG. The gates of the transistors TR14 to TR19 are coupled to the transfer gate line bTG.

The block decoder BD is a circuit having a function of decoding a block address. The block decoder BD applies predetermined voltages to the transfer gate lines TG and bTG, based on the decoding result of the block address. Specifically, the block decoder BD corresponding to a selected block BLK applies "H" level and "L" level voltages to the transfer gate lines TG and bTG, respectively. The block decoder BD corresponding to a non-selected block BLK applies "L" level and "H" level voltages to the transfer gate lines TG and bTG, respectively. As a result, the voltages of the signal lines CG0 to CG7 are transferred to the word lines WL0 to WL7 of the selected block BLK, respectively, the voltages of the signal lines SGDD0 to SGDD4 and SGSD are transferred to the select gate lines SGD0 to SGD4 and SGS of the selected block BLK, respectively, and the voltages of the signal lines USGD and USGS are transferred to the select gate lines SGD and SGS of the non-selected blocks BLK, respectively.

The row decoder module 16 may have another circuit configuration. For example, the number of transistors TR included in the row decoder module 16 can be changed in accordance with the number of interconnects provided in each block BLK. Since the signal line CG is shared by a plurality of blocks BLK, it may be referred to as a "global word line". Since the word line WL is provided for each block, it may be referred to as a "local word line". Since each of the signal lines SGDD and SGSD is shared by a plurality of blocks BLK, it may be referred to as "global transfer gate lines". Since each of the select gate lines SGD and SGS is provided for each block, it may be referred to as "local transfer gate lines".

(3: Circuit Configuration of Sense Amplifier Module 17)

FIG. 4 is a circuit diagram illustrating an example of the circuit configuration of the sense amplifier module 17 provided in the semiconductor memory device 1 of the first embodiment. In FIG. 4, the circuit configuration of one sense amplifier unit SAU is extracted and shown. As shown in FIG. 4, the sense amplifier unit SAU includes, for example, a sense amplifier unit SA, a bit line connection unit BLHU, latch circuits SDL, ADL, BDL, CDL, DDL and XDL, and a bus LBUS. The sense amplifier unit SA and the latch circuits SDL, ADL, BDL, CDL, DDL and XDL are configured such that they can transmit and receive data via the bus LBUS.

The sense amplifier unit SA is a circuit used for determining data based on the voltage of the bit line BL and for applying a voltage to the bit line BL. When the control signal STB is asserted during the read operation, the sense amplifier unit SA determines whether the data read from the selected memory cell transistor MT is "0" or "1", based on the voltage of the associated bit line BL. Each of the latch circuits SDL, ADL, BDL, CDL, DDL and XDL is a circuit capable of temporarily holding data. The latch circuit XDL is used for inputting or outputting data DAT between the sense amplifier unit SAU and the input/output circuit 11. The latch circuit XDL can be used as a cache memory as well.

The sense amplifier unit SA includes transistors T0 to T7, a capacitor CP, and nodes ND1, ND2, SEN and SRC. The bit line connection unit BLHU includes a transistor T8. The latch circuit SDL includes inverters IV0 and IV1, transistors T10 and T11, and nodes SINV and SLAT. The transistor T0 is a p-type MOS transistor. Each of the transistors T1 to T8, T10 and T11 is an n-type MOS transistor. The transistor T8 is an n-type MOS transistor having a higher breakdown voltage than that of each of the n-type transistors of the sense amplifier unit SA.

The gate of the transistor T0 is coupled to the node SINV. The source of the transistor T0 is coupled to the power supply line. The drain of the transistor T0 is coupled to the node ND1. The node ND1 is coupled to the drains of the transistors T1 and T2. The sources of the transistors T1 and T2 are coupled to the nodes ND2 and SEN, respectively. The nodes ND2 and SEN are coupled to the source and drain of the transistor T3, respectively. The node ND2 is coupled to the drains of the transistors T4 and T5. The source of the transistor T5 is coupled to the node SRC. The gate of the transistor T5 is coupled to the node SINV. The node SEN is coupled to the gate of the transistor T6 and to one electrode of the capacitor CP. The source of the transistor T6 is grounded. The drain and source of the transistor T7 are coupled to the bus LBUS and the drain of the transistor T6, respectively. The drain of the transistor T8 is coupled to the source of the transistor T4. The source of the transistor T8 is coupled to the interconnect BLI. The interconnect BLI is electrically coupled to the bit line BL associated with the sense amplifier unit SAU.

For example, a power supply voltage VDD is applied to the source of the transistor T0. For example, a ground voltage VSS is applied to the node SRC. Control signals BLX, HLL, XXL, BLC and STB are input to the gates of the transistors T1, T2, T3, T4 and T7, respectively. A control signal BLS is input to the gate of the transistor T8. A clock signal CLK is input to the other electrode of the capacitor CP.

The input node and output node of the inverter IV0 are coupled to the nodes SLAT and SINV, respectively. The input node and output node of the inverter IV1 are coupled to the nodes SINV and SLAT, respectively. One end and the other end of the transistor T10 are coupled to the node SINV and the bus LBUS, respectively. A control signal ST1 is input to the gate of the transistor T10. One end and the other end of the transistor T11 are coupled to the node SLAT and the bus LBUS, respectively. A control signal STL is input to the gate of the transistor T11. The latch circuit SDL holds data at the node SLAT, and holds the inverted data of the data of the node SLAT at the node SINV.

The circuit configurations of the latch circuits ADL, BDL, CDL, DDL and XDL are similar to the circuit configuration of the latch circuit SDL. For example, the latch circuit ADL holds data at the node ALAT and its inverted data at the node AINV. A control signal ATI is input to the gate of the transistor T10 of the latch circuit ADL, and a control signal ATL is input to the gate of the transistor T11 of the latch circuit ADL. The latch circuit BDL holds data at the node BLAT and holds its inverted data at the node BINV. A control signal BTI is input to the gate of the transistor T10 of the latch circuit BDL, and a control signal BTL is input to the gate of the transistor T11 of the latch circuit BDL. Since the same applies to the latch circuits CDL, DDL and XDL as well, the description thereof will be omitted.

Each of the control signals BLX, HLL, XXL, BLC, STB, BLS, ST1 and STL and the clock signal CLK are generated by the sequencer 14, for example. The sense amplifier module 17 may have other circuit configurations. For example, the number of latch circuits included in each sense amplifier unit SAU can be changed in accordance with the number of bits of data stored in the memory cell transistor MT. The sense amplifier unit SAU may include an arithmetic circuit capable of executing a simple logical operation. The sense amplifier module 17 can confirm (determine) the data stored in the memory cell transistor MT by appropriately executing arithmetic processing using the latch circuits during the read operation of each page.

[1-1-3] Configuration of Semiconductor Memory Device 1

Next, a description will be given of the configuration of the semiconductor memory device 1 of the first embodiment. In the drawings referenced below, a three-dimensional Cartesian coordinate system is used. The X direction corresponds to the direction in which the word line WL extends. The Y direction corresponds to the direction in which the bit line BL extends. The Z direction corresponds to the vertical direction that is vertical to the surface of the substrate used for forming the semiconductor memory device 1. As used herein, "up" and "down" are defined based on a direction along the Z direction, and for example, a direction away from a reference substrate (wafer) corresponds to a positive direction (upward).

(1: Outline of Bonding Structure)

FIG. 5 is a schematic diagram showing an outline of the bonding structure of the semiconductor memory device 1 of the first embodiment. The outline of the bonding structure of the semiconductor memory device 1 will be described below with reference to FIG. 5. In the description below, the process of bonding two wafers will be referred to as a "bonding process". A device that executes the bonding process will be referred to as a "bonding device". The wafer arranged on the upper side in the bonding process will be referred to as an "upper wafer UW". The wafer arranged on the lower side in the bonding process will be referred to as a "lower wafer LW". The two wafers bonded together by the bonding process will be referred to as a "bonded wafer BW".

First, a lot including the upper wafer UW and a lot including the lower wafer LW are prepared ("lot assignment"). Then, front-end process ("exposure process", "etching process", etc.) are executed for the lot including the upper wafer UW and the lot including the lower wafer LW, and a semiconductor circuit is formed on each of the upper wafer UW and the lower wafer LW. A plurality of shots on the upper wafer UW and a plurality of shots on the lower wafer LW are determined at the same positions.

After the front-end process is completed for the upper wafer UW and the lower wafer LW, the bonding process is executed. The bonding process is a process of bonding the upper wafer UW and the lower wafer LW together. Specifically, the bonding device arranges the surface of the upper wafer UW and the surface of the lower wafer LW such that they face each other. Then, the bonding device adjusts (aligns) the position of the pattern formed on the surface of the upper wafer UW with reference to the position of the pattern formed on the surface of the lower wafer LW, and the surfaces of the upper wafer UW and the lower wafer LW are bonded with each other. As a result, the bonded wafer BW is formed. A heat treatment may be performed after the surfaces of the upper wafer UW and the lower wafer LW are bonded with each other.

Thereafter, a wiring process is executed for the bonded wafer BW. The wiring process includes a process of removing the substrate from the upper wafer UW, a process of forming a contact for the wiring provided on the back surface side of the upper wafer UW, a process of forming a pad used for coupling the semiconductor memory device 1 and the memory controller 2, a process of forming a pad for supplying power to the semiconductor memory device 1, and the like. The bonded wafer BW for which the wiring process has been completed is divided into chip units including the semiconductor memory device 1 by executing a dicing process. As a result, the semiconductor memory device 1 having a bonding structure is formed.

In the semiconductor memory device 1 of the first embodiment, a memory cell array 10 is formed on the upper wafer UW, and an input/output circuit 11, a logic controller 12, a register circuit 13, a sequencer 14, a driver circuit 15, a decoder module 16, a sense amplifier module 17, etc. are formed on the lower wafer LW. In the description below, the chip including the memory cell array 10 will be referred to as a "memory chip" as well. A chip including a peripheral circuit for controlling the memory cell array 10 will be referred to as a "CMOS chip" as well. The "front surface" of a wafer corresponds to that side of the two opposing wafer surfaces on which the semiconductor circuit is formed. The "back surface" of the wafer corresponds to the opposite side of the two opposing wafer surfaces.

(2: Bonding Structure of Semiconductor Memory Device 1)

Figure 6:
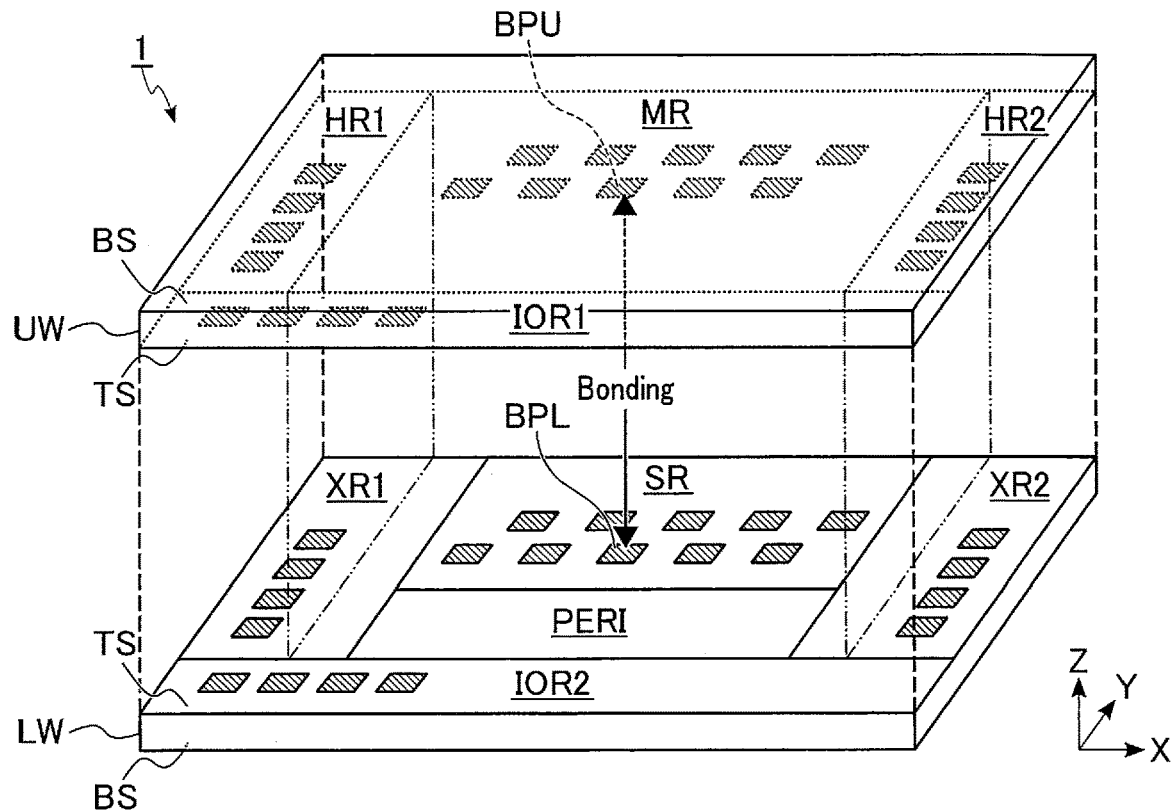
FIG. 6 is a perspective view showing an example of the planar layout in which an upper wafer and a lower wafer are arranged in the bonding structure of the semiconductor memory device of the first embodiment.

FIG. 6 is a perspective view showing an example of the planar layout in which the upper wafer and the lower wafer are arranged in the bonding structure of the semiconductor memory device 1 of the first embodiment. FIG. 6 schematically shows opposing regions of the upper wafer UW and the lower wafer LW, and the coordinate axes indicated therein are based on the coordinate axes of the lower wafer LW. In this example, the upper wafer UW corresponds to the memory chip and the lower wafer LW corresponds to the CMOS chip. As shown in FIG. 6, the upper surface and lower surface of the upper wafer UW correspond to the back surface BS and front surface TS of the upper wafer UW, respectively. The upper surface and lower surface of the lower wafer LW correspond to the front surface TS and the back surface BS of the lower wafer LW, respectively. The region of the upper wafer UW is divided into, for example, a memory region MR, hookup regions HR1 and HR2, and an input/output region IOR1. The region of the lower wafer LW is divided into, for example, a sense amplifier region SR, a peripheral circuit region PERI, transfer regions XR1 and XR2, and an input/output region IOR2.

The memory region MR is used for storing data and includes a plurality of NAND strings NS. The hookup regions HR1 and HR2 sandwich the memory region MR in the X direction. The hookup regions HR are regions used for coupling the stacked interconnects provided in the memory region MR and the transistors provided in the transfer regions XR and opposed to the interconnects in the Z direction. The input/output region IOR1 is adjacent to the memory region MR and the hookup regions HR1 and HR2 in the Y direction. The input/output region IOR1 includes a circuit related to the input/output circuit 11.

The sense amplifier region SR includes a sense amplifier module 17. The peripheral circuit region PERI includes the sequencer 14, etc. The sense amplifier region SR and the peripheral circuit region PERI are arranged adjacent to each other in the Y direction and overlap the memory region MR in the Z direction. The transfer regions XR1 and XR2 include a row decoder module 16. The transfer regions XR1 and XR2 sandwich the sense amplifier region SR and the peripheral circuit region PERI in the X direction, and overlap the hookup regions HR1 and HR2 in the Z direction, respectively. The input/output region IOR2 includes an input/output circuit 11, etc. The input/output region IOR2 overlaps the input/output region IOR1 in the Z direction.

The upper wafer UW includes a plurality of bonding pads BPU that are exposed on the surface TS before the bonding process. The plurality of bonding pads BPU are arranged in each of the memory region MR, the hookup regions HR1 and HR2, and the input/output region IOR1. The bonding pads BPU in the memory region MR are coupled to bit lines BL, for example. The bonding pads BPU of the hookup regions HR are coupled, for example, to the stacked interconnects (for example, to the word lines WL) provided in the memory region MR. The bonding pads BPU of the input/output region IOR1 are electrically coupled to pads that are formed on the memory chip after the wiring process. The pads formed on the memory chip are used for coupling the semiconductor memory device 1 and the memory controller 2 to each other.

The lower wafer LW includes a plurality of bonding pads BPL that are exposed on the surface TS before the bonding process. The plurality of bonding pads BPL are arranged in each of the sense amplifier region SR, the peripheral circuit region PERI, the transfer regions XR1 and XR2, and the input/output region IOR2. The bonding pads BPU of the transfer regions XR1 and XR2 are coupled, for example, to the transistors in the row decoder RD. The bonding pads BPU of the sense amplifier region SR are coupled, for example, to the transistors of the sense amplifier unit SAU. The bonding pads BPU of the input/output region IOR2 are coupled to the transistors of the input/output circuit 11.

The plurality of bonding pads BPU of the upper wafer UW are arranged in such a manner as to oppose the plurality of bonding pads BPL of the lower wafer LW. Specifically, the bonding pads BPU of the memory region MR are arranged to overlap the bonding pads BPL of the sense amplifier region SR. The bonding pads BPL of the transfer regions XR1 and XR2 are arranged to overlap the bonding pads BPU of the hookup regions HR1 and HR2. The bonding pads BPL of the input/output region IOR1 are arranged to overlap the bonding pads BPU of the input/output region IOR2. A pair of bonding pads BPU and BPL arranged and opposed to each other between the upper wafer UW and the lower wafer LW are bonded by a bonding process ("bonding" in FIG. 6). As a result, the circuit in the upper wafer UW and the circuit in the lower wafer LW are electrically coupled to each other. Each of the bonding pads BPU and BPL may be referred to as a bonding metal.

In the semiconductor memory device 1 of the first embodiment, the width of the transfer region XR1 as viewed in the X direction is more than the width of the hookup region HR1 as viewed in the X direction, and the width of the transfer region XR2 as viewed in the X direction is more than the width of the hookup region HR2 as viewed in the X direction. In addition, each of the transfer regions XR1 and XR2 partly overlaps the memory region MR. Therefore, the bonding pads BPL of the transfer region XR1 are arranged at positions overlapping the hookup region HR1, and the bonding pads BPL of the transfer region XR2 is arranged at positions overlapping the hookup region HR2.

The semiconductor memory device 1 of the first embodiment is not limited to the structure described above. For example, it suffices that at least one hookup region HR is provided. The semiconductor memory device 1 may include a plurality of memory regions MR. The arrangement of the memory region MR, the hookup regions HR, the sense amplifier region SR, the peripheral circuit region PERI, and the transfer regions XR can be changed as appropriate. The memory chip and the CMOS chip may be arranged in the reversed manner. In this case, pads used for coupling the semiconductor memory device 1 to external devices are provided on the CMOS chip.

(3: Planar Layout of Memory Cell Array 10)

Figure 7:
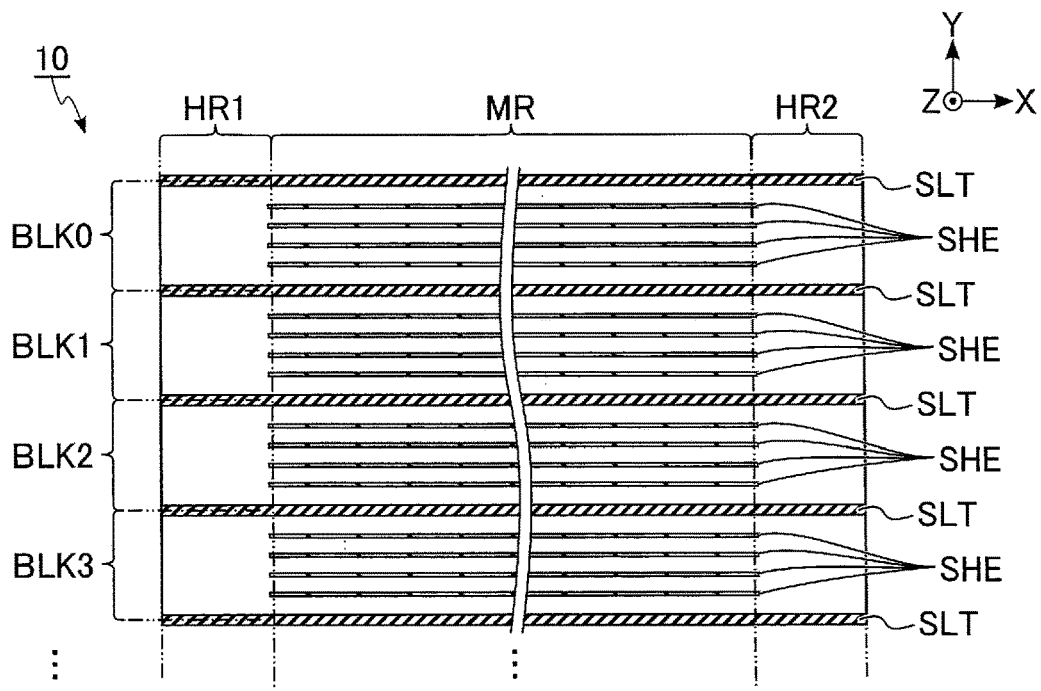
FIG. 7 is a plan view showing an example of a planar layout of a memory cell array 10 provided in the semiconductor memory device of the first embodiment.

FIG. 7 is a plan view showing an example of a planar layout of a memory cell array 10 provided in the semiconductor memory device 1 of the first embodiment. FIG. 7 shows a region corresponding to four blocks BLK0 to BLK3 included in the memory cell array 10. As shown in FIG. 7, the memory cell array 10 includes, for example, a plurality of slits SLT and a plurality of slits SHE.

Each slit SLT includes a portion extending along the X direction and crosses the hookup region HR1, the memory region MR and the hookup region HR2 along the X direction. The plurality of slits SLT are arranged in the Y direction. Each slit SLT has, for example, a structure in which an insulator is embedded. Each slit SLT divides adjacent interconnects (for example, word lines WL0 to WL7 and select gate lines SGD and SGS), which are adjacent to each other, with the slit SLT interposed. In the memory cell array 10, each of the regions partitioned by the slits SLT corresponds to one block BLK.

Each slit SHE has a portion extending along the X direction and crosses the memory region MR along the X direction. The plurality of slits SHE are arranged in the Y direction. In this example, four slits SHE are arranged between the two slits SLT that are adjacent to each other in the Y direction. Each slit SHE has, for example, a structure in which an insulator is embedded. Each slit SHE divides interconnects (at least the select gate line SGD), which are adjacent to each other with the slit SHE interposed. In the memory cell array 10, each of the regions partitioned by the slits SLT and SHE corresponds to one string unit SU.

The memory cell array 10 provided in the semiconductor memory device 1 of the first embodiment may be designed to have another planar layout. For example, the number of slits SHE arranged between two adjacent slits SLT can be designed to be any number. The number of string units SU included in each block BLK can be changed based on the number of slits SHE arranged between two adjacent slits SLT.

(4: Planar Layout of Memory Cell Array 10 in Memory Region MR)

Figure 8:
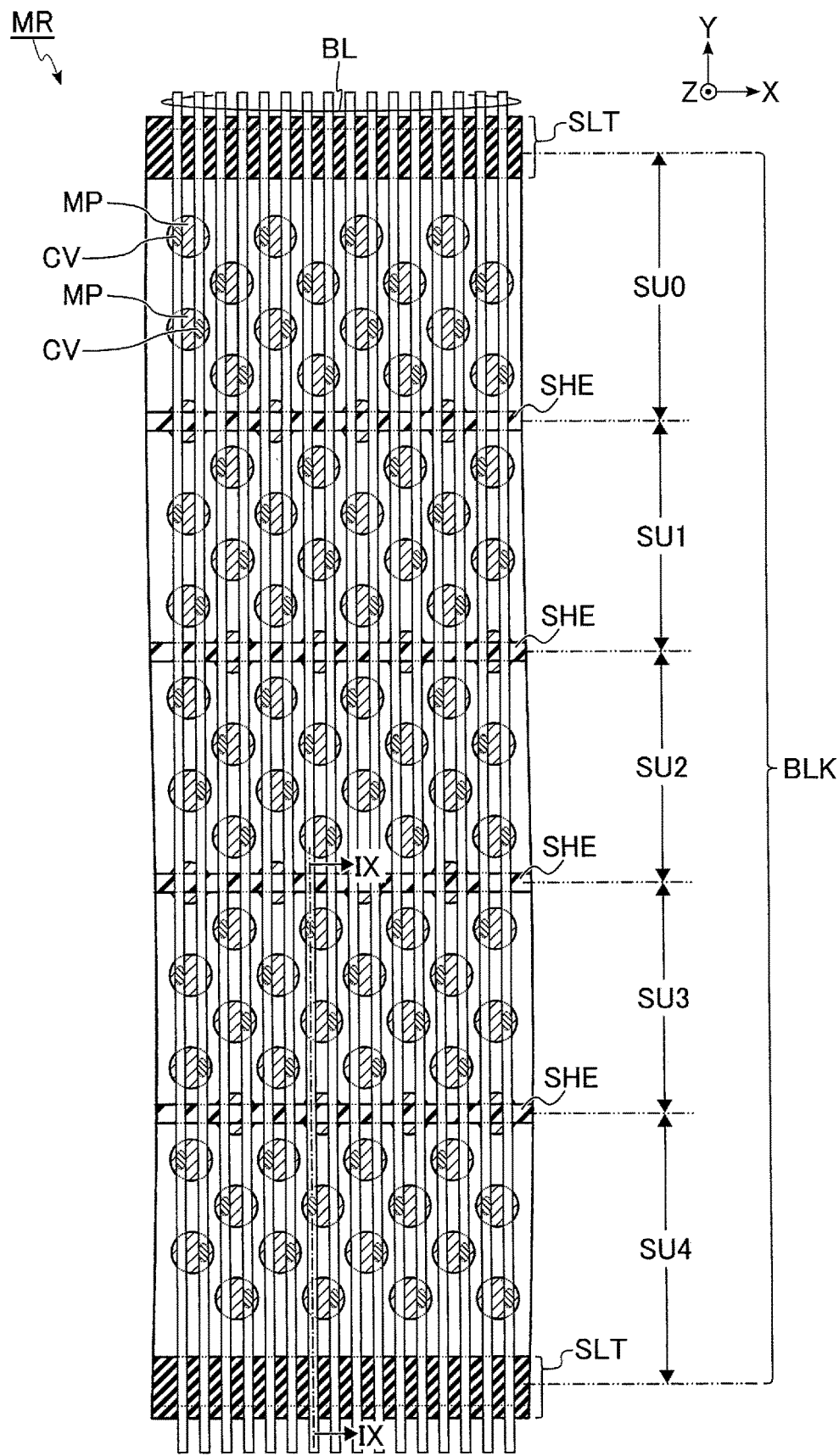
FIG. 8 is a plan view showing an example of a detailed planar layout of a memory region of the memory cell array 10 provided in the semiconductor memory device of the first embodiment.

FIG. 8 is a plan view showing an example of a detailed planar layout of a memory region of the memory cell array 10 provided in the semiconductor memory device 1 of the first embodiment. FIG. 8 shows a region including one block BLK (string units SU0 to SU4). As shown in FIG. 8, in the memory region MR, the semiconductor memory device 1 includes, for example, a plurality of memory pillars MP, a plurality of contacts CV, and a plurality of bit lines BL.

Each memory pillar MP functions as one NAND string NS. In the region between two adjacent slits SLT, the plurality of memory pillars MP are arranged, for example, in 24 rows and in a staggered fashion. For example, slits SHE are arranged such that one overlaps the memory pillars MP in the 5th row from the upper side of the drawing sheet, one overlaps the memory pillars MP in the 10th row, one overlaps the memory pillars MP in the 15th row, and one overlaps the memory pillars MP in the 20th row.

Each bit line BL has a portion extending in the Y direction. The plurality of bit lines are arranged in the X direction. Each bit line BL is arranged such that it overlaps at least one memory pillar MP in each string unit SU. In this example, the bit lines BL are arranged such that two bit lines overlap one memory pillar MP. The memory pillar MP is electrically coupled to one of the plurality of overlapping bit lines BL via the contacts CV. It should be noted that the contact CV between the memory pillar MP in contact with two different select gate lines SGD and the bit line BL may be omitted.

The memory region MR of the semiconductor memory device 1 of the first embodiment may be designed to have another layout. For example, the numbers of memory pillars MP and slits SHE arranged between two adjacent slits SLT, and how they are arranged can be changed as appropriate. The number of bit lines BL overlapping each memory pillar MP can be designed to be any number.

(5: Cross-Sectional Structure of Memory Cell Array 10 in Memory Region MR)

Figure 9:
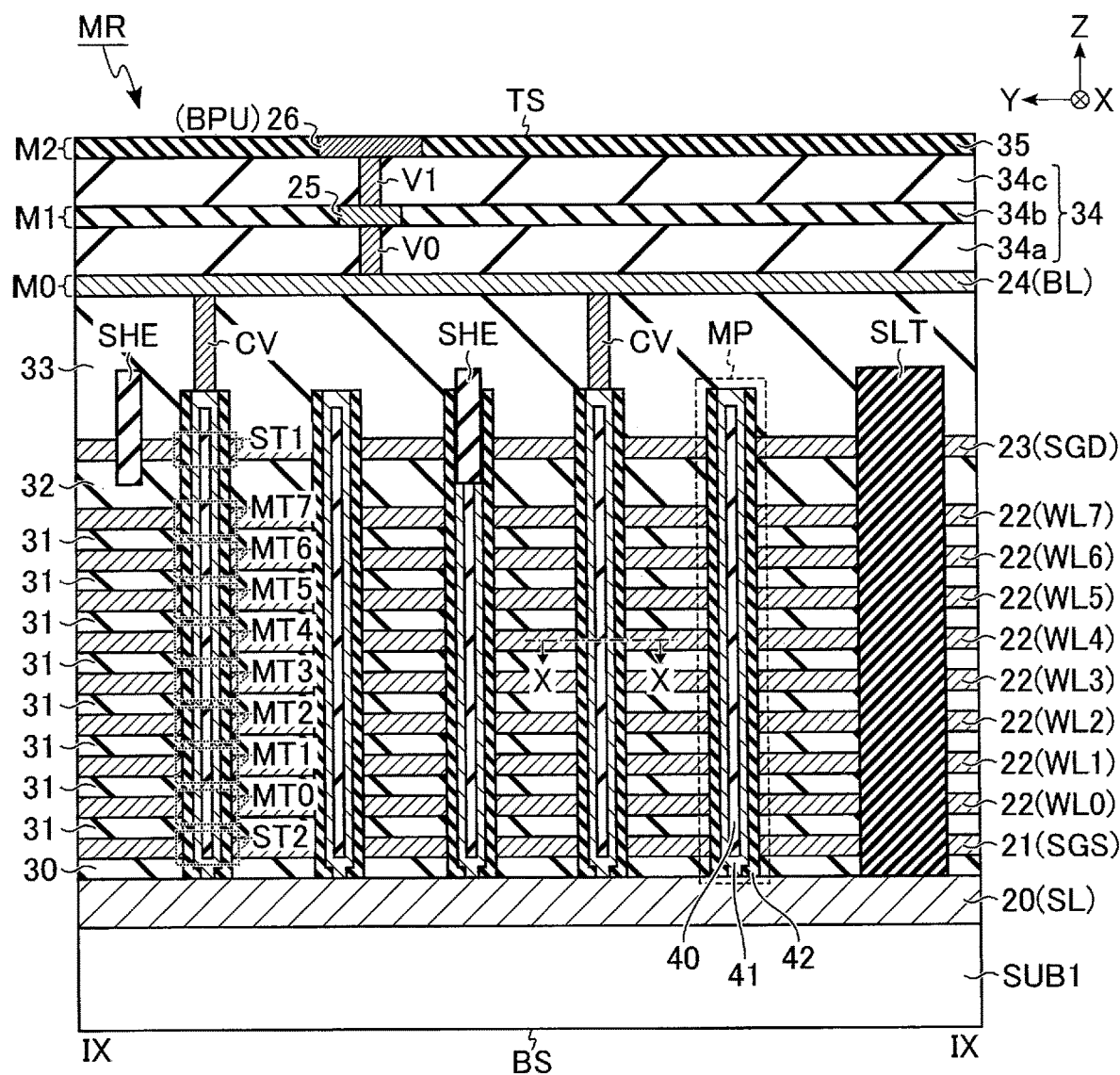
FIG. 9 is a cross-sectional view taken along line IX-IX of FIG. 8 and showing an example of how a cross-sectional structure of the memory cell array 10 is in the memory region provided in the semiconductor memory device of the first embodiment.

FIG. 9 is a cross-sectional view taken along line IX-IX of FIG. 8 and showing an example of how a cross-sectional structure of the memory cell array 10 is in the memory region MR provided in the semiconductor memory device 1 of the first embodiment. FIG. 9 shows an example of how the structure of the memory cell array 10 of the upper wafer UW is before the bonding process, and the coordinate axes indicated therein are based on the coordinate axes of the upper wafer UW. As shown in FIG. 9, in the memory region MR, the semiconductor memory device 1 includes, for example, a semiconductor substrate SUB1, conductive layers 20 to 26, insulating layers 30 to 35, and contacts V0 and V1.

The semiconductor substrate SUB1 is a silicon substrate used for forming a circuit on the upper wafer UW. In the semiconductor memory device 1, the semiconductor substrate SUB1 is removed after the bonding process.

Before the bonding process, a conductive layer 20 is provided on the semiconductor substrate SUB1. The conductive layer 20 is formed, for example, as a plate expanding in the XY plane, and is used as the source line SL. The conductive layer 20 contains, for example, polysilicon.

An insulating layer 30 is provided on the conductive layer 20. A conductive layer 21 is provided on the insulating layer 30. The conductive layer 21 is formed, for example, as a plate expanding in the XY plane, and is used as the select gate line SGS. The conductive layer 21 contains, for example, tungsten.

An insulating layers 31 and a conductive layers 22 are alternately stacked above the conductive layer 21. The conductive layers 22 are formed, for example, as plates expanding in the XY plane. The plurality of stacked conductive layers 22 are used as word lines WL0 to WL7 in order from the side of the semiconductor substrate SUB1. Each conductive layer 22 contains, for example, tungsten.

An insulating layer 32 is provided on the uppermost conductive layer 22 (that is, the word line WL7). A conductive layer 23 is provided on the insulating layer 32. The conductive layer 23 is formed, for example, as a plate expanding in the XY plane, and is used as the select gate line SGD. The conductive layer 23 contains, for example, tungsten.

An insulating layer 33 is provided on the conductive layer 23. A conductive layer 24 is provided on the insulating layer 33. The conductive layer 24 is formed, for example, as a linear shape extending along the Y direction, and is used as a bit line BL. In a region that is not shown, the plurality of conductive layers 24 are arranged in the X direction. The conductive layers 24 contain, for example, copper. In the description below, the interconnect layers provided with the conductive layers 24 will be referred to as "M0".

An insulating layer 34a is provided on the conductive layer 24. A contact V0 is provided in such a manner as to penetrate the insulating layer 34a. The bottom of the contact V0 is in contact with the conductive layer 24. An insulating layer 34b is provided on the insulating layer 34a. A conductive layer 25 is provided in such a manner as to penetrate the insulating layer 34b. The bottom of the conductive layer 25 is in contact with the contact V0. In the description below, the interconnect layer provided with the conductive layer 25 and the insulating layer 34b will be referred to as "M1".

An insulating layer 34c is provided on the insulating layer 34b. A contact V1 is provided in such a manner as to penetrate the insulating layer 34c. The bottom of the contact V1 is in contact with the conductive layer 25. An insulating layer 35 is provided on the insulating layer 34c. A conductive layer 26 is provided in such a manner as to penetrate the insulating layer 35. The bottom of the conductive layer 26 is in contact with the contact V1. The upper portion of the conductive layer 26 is exposed in the surface TS of the upper wafer UW. The conductive layer 26 corresponds to a bonding pad BPU of the memory region MR. The conductive layer 26 contains, for example, copper. In the description below, the interconnect layer provided with the conductive layer 26 and the insulating layer 35 will be referred to as "M2". The set consisting of the insulating layers 34a, 34b and 34c will be referred to as an "insulating layer 34" as well.

The set consisting of the conductive layers 25 and 26 and the contacts V0 and V1 is provided for each conductive layer 24 and corresponds to the interconnects and contacts for coupling the bit line BL and the sense amplifier module 17. In the illustrated region, the set consisting of conductive layers 25 and 26 and contacts V0 and V1 and corresponding to one conductive layer 24 (bit line BL) is shown.

Each memory pillar MP is provided to extend in the Z direction. Each memory pillar MP penetrates the insulating layers 30 to 32 and the conductive layers 21 to 23. The bottom of each memory pillar MP reaches the conductive layer 20. Each memory pillar MP includes, for example, a core member 40, a semiconductor layer 41, and a stacked film 42. The core member 40 is provided to extend in the Z direction. The semiconductor layer 41 covers the periphery of the core member 40. The bottom of the semiconductor layer 41 is in contact with the conductive layer 20. The stacked film 42 covers the side and the bottom surfaces of the semiconductor layer 41 except for the contact portion where the semiconductor layer 41 and the conductive layer 20 are in contact with each other. The core member 40 includes an insulator such as silicon oxide. The semiconductor layer 41 contains, for example, silicon. The portion where the memory pillar MP and the conductive layer 21 intersect functions as the select transistor ST2. The portion where the memory pillar MP and one conductive layer 22 intersect functions as a memory cell transistor MT. The portion where the memory pillar MP and the conductive layer 23 intersect functions as a select transistor ST1.

Contacts CV are provided as a columnar shape extending along the Z direction. Each contact CV is provided on the semiconductor layer 41 of the memory pillar MP. In the illustrated region, two contacts CV corresponding to two of the five memory pillars MP are depicted. One conductive layer 24 is in contact with each contact CV. A memory pillar MP provided between the adjacent slits SLT and SHE and a memory pillar MP provided between the two adjacent slits SHE are electrically coupled to each conductive layer 24.

The slit SLT includes, for example, a portion provided along the XZ plane, and divides the conductive layers 21 to 23 and the insulating layers 30 to 32. The upper end of the slit SLT is provided at a height between the upper end of the memory pillar MP and the conductive layer 24. The lower end of the slit SLT is in contact with the conductive layer 20. The slit SLT contains an insulator such as silicon oxide.

The slit SHE includes, for example, a portion provided along the XZ plane and divides at least the conductive layer 23. The upper end of the slit SHE is provided at a height between the upper end of the memory pillar MP and the conductive layer 24. The lower end of the slit SHE is provided at the height of the insulating layer 32. The slit SHE contains an insulator such as silicon oxide. The upper end of the slit SHE and the upper end of the slit SLT may be aligned or may not be aligned. The upper end of the slit SHE and the upper end of the memory pillar MP may be aligned or may not be aligned.

(6: Cross-Sectional Structure of Memory Pillar MP)

Figure 10:
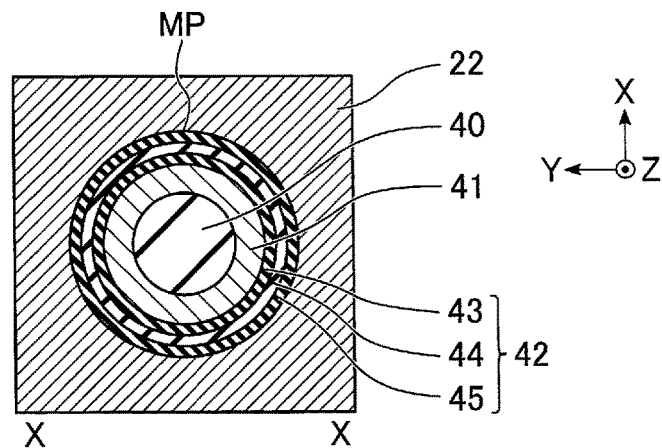
FIG. 10 is a cross-sectional view taken along line X-X of FIG. 9 and showing an example of a cross-sectional structure of a memory pillar provided in the semiconductor memory device of the first embodiment.

FIG. 10 is a cross-sectional view taken along line X-X of FIG. 9 and showing an example of a cross-sectional structure of a memory pillar MP provided in the semiconductor memory device 1 of the first embodiment. FIG. 10 shows how the cross-sectional structure of the memory pillar MP is in a layer parallel to the surface of the lower wafer LW and including the conductive layer 22. As shown in FIG. 10, the stacked film 42 includes, for example, a tunnel insulating film 43, an insulating film 44, and a block insulating film 45.

The core member 40 is provided in the central portion of the memory pillar MP. The semiconductor layer 41 surrounds the side surface of the core member 40. The tunnel insulating film 43 surrounds the side surface of the semiconductor layer 41. The insulating film 44 covers the side surface of the tunnel insulating film 43. The block insulating film 45 covers the side surface of the insulating film 44. The conductive layer 22 covers the side surface of the block insulating film 45. Each of the tunnel insulating film 43 and the block insulating film 45 contains, for example, silicon oxide. The insulating film 44 contains, for example, silicon nitride.

In the memory pillar MP described above, the semiconductor layer 41 is used as a channel (current path) of the memory cell transistors MT0 to MT7 and the select transistors ST1 and ST2. The insulating film 44 is used as charge storage layers of the memory cell transistors MT. The semiconductor memory device 1 allows a current to flow between the bit line BL and the source line SL via the memory pillar MP, by turning on the memory cell transistors MT0 to MT7 and the select transistors ST1 and ST2

(7: Planar Layout of Memory Cell Array 10 in Hookup Region HR)

In the semiconductor memory device 1 of the first embodiment, an even-numbered block BLK of the hookup region HR1 has a structure similar to that of an odd-numbered block BLK of the hookup region HR2, and an even-numbered block BLK of the hookup region HR2 has a structure similar to that of an odd-numbered block BLK of the hookup region HR1. For example, the planar layout of the block BLK0 in the hookup region HR2 is similar to the planar layout of the structure in which the block BLK1 of the hookup region HR1 is inverted with respect to the X direction and the Y direction. The planar layout of the block BLK1 of the hookup region HR2 is similar to the planar layout of the structure in which the block BLK0 in the hookup region HR1 is inverted with respect to the X direction and the Y direction. In the description below, the planar layout of the blocks BLK in the hookup regions HR1 and HR2 will be described with attention paid to the planar layout of the even-numbered block BLK in the hookup region HR1.

Figure 11:
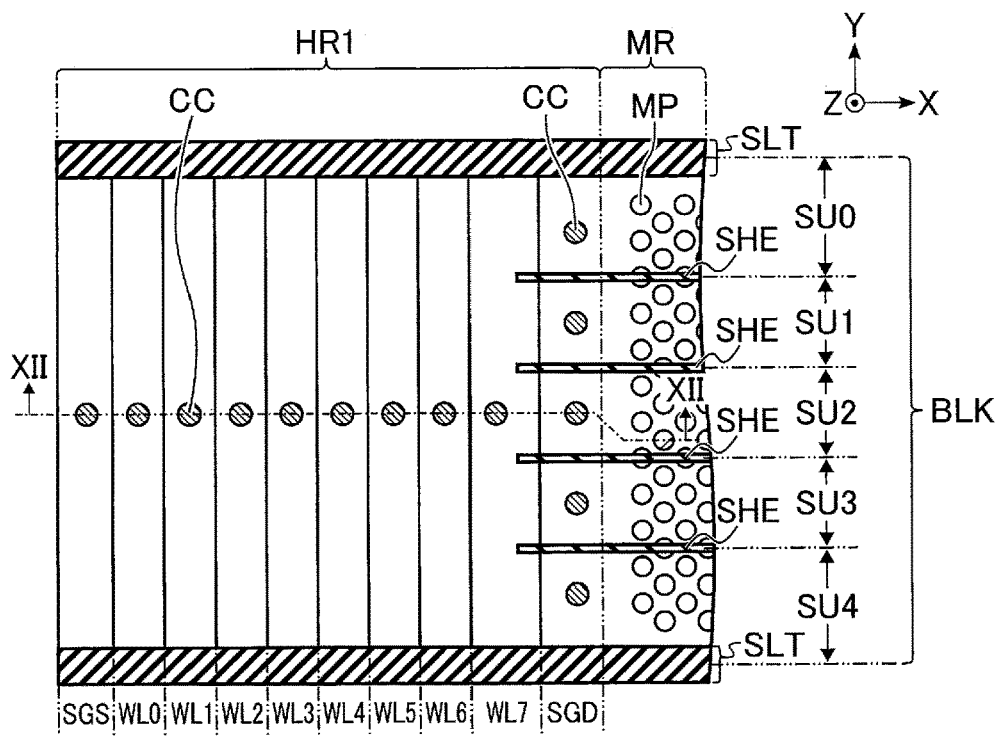
FIG. 11 is a plan view showing an example of how a detailed planar layout of a hookup region is in the memory cell array 10 of the semiconductor memory device of the first embodiment.

FIG. 11 is a plan view showing an example of how a detailed planar layout is in the hookup region HR1 of the memory cell array 10 of the semiconductor memory device 1 of the first embodiment. FIG. 11 also shows the memory region MR in the vicinity of the hookup region HR1. As shown in FIG. 11, in the hookup region HR1, each end of the select gate line SGS, the word lines WL0 to WL7 and the select gate line SGD has a terrace portion.

The terrace portion corresponds to that portion of the stacked interconnect which does not overlap an interconnect layer (conductive layer) located above. The structure formed by a plurality of terrace portions is similar to steps, terraces, rimstones, etc. In this example, a staircase structure having steps in the X direction is formed by an end portion of the select gate line SGS, end portions of the word lines WL0 to WL7, and an end portion of the select gate line SGD. In other words, a step is formed between the select gate line SGS and the word line WL0, between the word line WL0 and the word line WL1, between the word line WL6 and the word line WL7, and between the word line WL7 and the select gate line SGD.

The semiconductor memory device 1 includes a plurality of contacts CC in the even-numbered blocks BLK of the hookup region HR1. The contacts CC are members used for coupling the row decoder module 16 and the stacked interconnects to each other. Each contact CC is coupled to one of the stacked interconnects provided in the memory cell array 10 of the even-numbered blocks BLK, that is, one of the terrace portions of the conductive layers 21 to 23. Although not shown, the semiconductor memory device 1 includes a plurality of contacts CC in the odd-numbered blocks BLK of the hookup region HR2. The plurality of contacts CC provided in the odd-numbered blocks BLK are coupled to one of the stacked interconnects provided in the memory cell array 10 of the odd-numbered blocks BLK, that is, one of the terrace portions of the conductive layers 21 to 23.

(8: Cross-Sectional Structure of Memory Cell Array 10 in Hookup Region HR)

Figure 12:
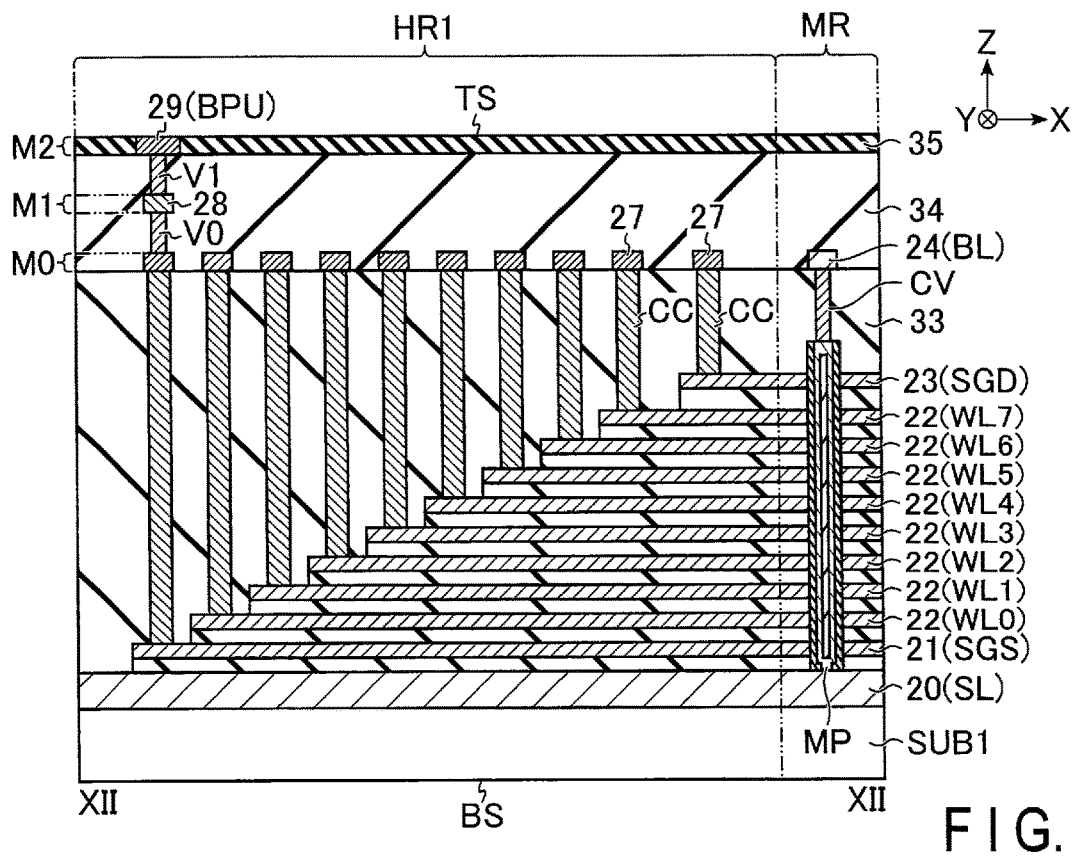
FIG. 12 is a cross-sectional view showing an example of how a cross-sectional structure is in the hookup region of the memory cell array 10 provided in the semiconductor memory device of the first embodiment.

FIG. 12 is a cross-sectional view showing an example of how a cross-sectional structure is in the hookup region HR of the memory cell array 10 of the semiconductor memory device 1 of the first embodiment. FIG. 12 shows a structure which the memory cell array 10 of the upper wafer UW has in the hookup region HR1 before the bonding process, and also shows the memory region MR in the vicinity of the hookup region HR1. As shown in FIG. 12, in the hookup region HR1, the semiconductor memory device 1 includes, for example, a plurality of conductive layers 27, conductive layers 28 and 29, and a plurality of contacts V0 and V1.

The end portions of the conductive layers 21 to 23 are provided in a staircase pattern and are covered with an insulating layer 33. In the hookup region HR1, an insulating layer 34 is provided on the insulating layer 33, and an insulating layer 35 is provided on the insulating layer 34. That is, each of the insulating layers 33, 34, and 35 extends from the memory region MR to the hookup region HR1. Of the portions of the insulating layer 34, the portion included in the interconnect layer M0 may be an insulating layer different from the insulating layer 34a.

A plurality of contacts CC are provided on the respective terrace portions of the select gate line SGS, the word lines WL0 to WL7 and the select gate line SGD. Each contact CC penetrates the insulating layer 33. One conductive layer 27 is provided on each of the plurality of contacts CC. The conductive layer 27 is included in the interconnect layer M0.

A contact V0 is provided on the conductive layer 27. In FIG. 12, the contact V0 included in the plurality of contacts V0 and corresponding to the select gate line SGS is depicted. A conductive layer 28 is provided on the contact V0. The conductive layer 28 is included in the interconnect layer M1. A contact V1 is provided on the conductive layer 28. The conductive layers 27 and 28 and the plurality of contacts V0 and V1 are covered with an insulating layer 34. A conductive layer 29 is provided on the contact V1. The conductive layer 29 is provided in such a manner as to penetrate the insulating layer 35. The bottom of the conductive layer 29 is in contact with the contact V1. The conductive layer 29 is included in the interconnect M2. The upper portion of the conductive layer 29 is exposed in the surface TS of the upper wafer UW. The conductive layer 29 corresponds to a bonding pad BPU of the hookup region HR1. The conductive layer 29 contains, for example, copper.

The set consisting of the conductive layers 27, 28 and 29 and the contacts CC, V0 and V1 corresponds to interconnects and contacts for coupling any of the conductive layers 21-23 to the row decoder module 16. Although not shown, each of the conductive layers 22 and 23 is similarly coupled to the row decoder module 16 via the set consisting of the conductive layers 27, 28 and 29 and the contacts CC, V0 and V1.

(9: Cross-sectional Structure of Semiconductor Memory Device 1)

Figure 13:
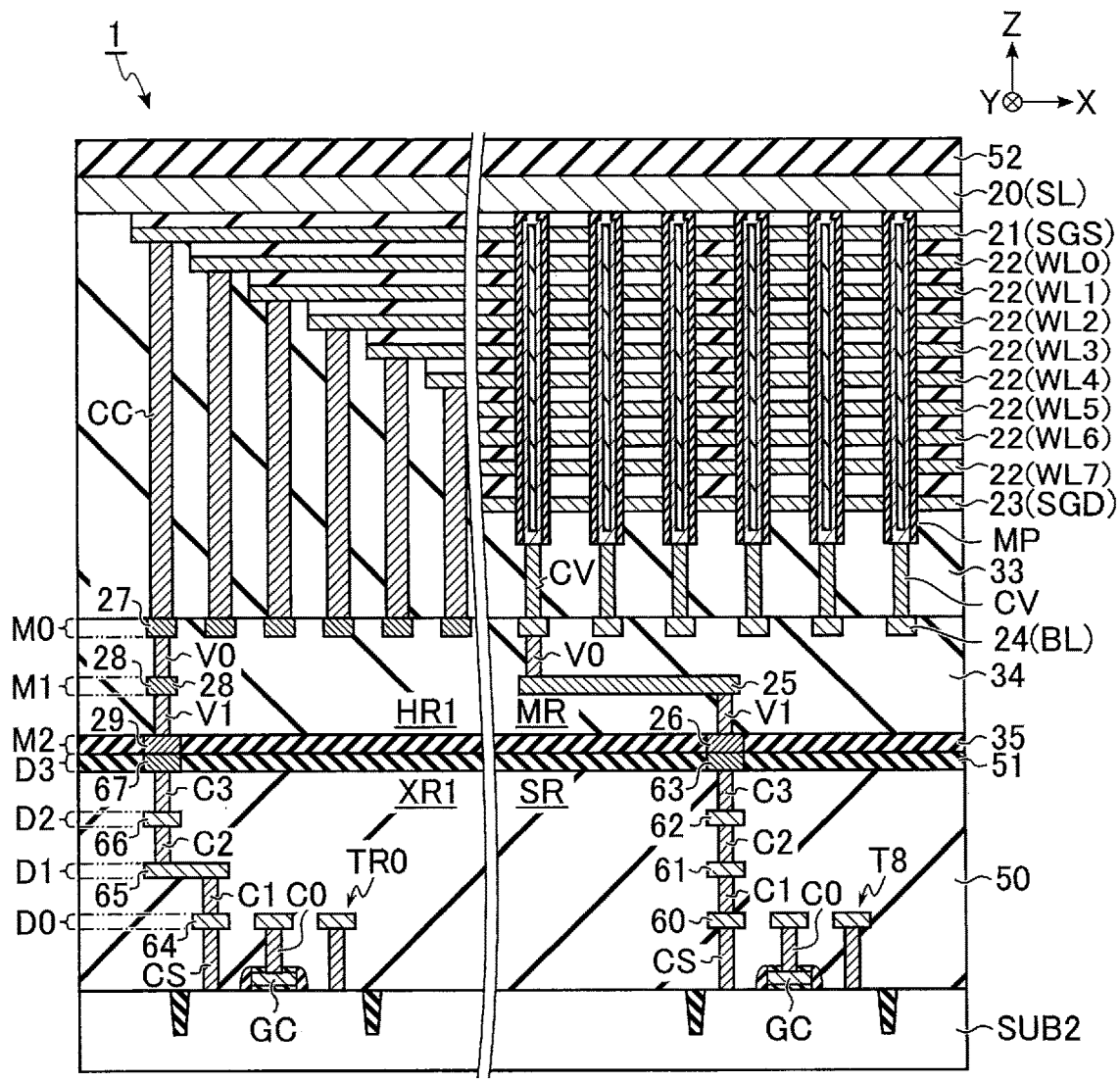
FIG. 13 is a cross-sectional view showing an example of how a cross-sectional structure is in the semiconductor memory device of the first embodiment.

FIG. 13 is a cross-sectional view showing an example of the cross-sectional structure of the semiconductor memory device 1 of the first embodiment. FIG. 13 shows how part of each of the memory region MR, the hookup region HR1, the transfer region XR1 and the sense amplifier region SR is in the semiconductor memory device 1 after the bonding process, and the coordinate axes indicated therein are based on the coordinate axes of the semiconductor wafer SUB2 of the lower wafer LW. As shown in FIG. 13, after the bonding process, the memory region MR of the semiconductor memory device 1 has a structure similar to the structure in which the memory region MR of the memory cell array 10 described with reference to FIG. 9 is inverted upside down. After the bonding process, the hookup region HR1 of the semiconductor memory device 1 has a structure similar to the structure in which the hookup region HR1 of the memory cell array 10 described with reference to FIG. 12 is inverted upside down. Therefore, the terrace portions of the stacked interconnects provided in the hookup region HR1 are arranged to face the semiconductor substrate SUB2 of the lower wafer LW.

After the bonding process, the semiconductor memory device 1 includes insulating layers 50 and 51, conductive layers GC and 60 to 67, and contacts CS and C0 to C3 in correspondence to the lower wafer LW. Further, after the bonding process, the semiconductor memory device 1 is provided with an insulating layer 52 in correspondence to the upper wafer UW. Specifically, the insulating layer 50 is provided on the semiconductor substrate SUB2. The insulating layer 50 includes circuits corresponding to the row decoder module 16, the sense amplifier module 17, etc. The insulating layer 50 covers, for example, the conductive layers GC and 60 to 62 and 64 to 66 and the contact CS and C0 to C3. The insulating layers 50 may be composed of a plurality of insulating layers. An insulating layer 35 is in contact with the insulating layer 51. That is, the insulating layers 51 and 35 are in contact with the boundary portion of the lower wafer LW and the boundary portion of the upper wafer UW.

Each conductive layer GC is provided on the semiconductor substrate SUB2, with a gate insulating film interposed. The conductive layer GC shown in the sense amplifier region SR functions as a gate electrode of the transistor TR8. The conductive layer GC shown in the transfer region XR1 functions as a gate electrode of the transistor TR0. A contact C0 is provided on each conductive layer GC. The two contacts CS shown in the sense amplifier region SR are coupled to the source region and the drain region of the transistor T8 provided on the semiconductor substrate SUB2, respectively. The two contacts CS shown in the transfer region XR1 are coupled to the source region and the drain region of the transistor TR0 provided on the semiconductor substrate SUB2, respectively.

A conductive layer 60 is provided on each of the contacts CS and C0 in the sense amplifier region SR. A conductive layer 61 is provided on the conductive layer 60, with a contact C1 interposed. A conductive layer 62 is provided on the conductive layer 61, with a contact C2 interposed. The conductive layer 62 corresponds to an interconnect BLI, for example. A conductive layer 63 is provided on the conductive layer 62, with a contact C3 interposed. The conductive layer 63 corresponds to a bonding pad BPL provided in the sense amplifier region SR. The conductive layer 63 contains, for example, copper. In the description below, the interconnect layers provided with conductive layers 60, 61, 62 and 63 will be referred to as "D0", "D1", "D2" and "D3", respectively.

A conductive layer 26 provided to face the lower wafer LW is in contact with the conductive layer 63. The conductive layer 26 is coupled to the associated conductive layer 24 (bit line BL) via the contacts V0 and V1 and the conductive layer 25. That is, the contact V0 is coupled to the bit line BL from the side of the semiconductor substrate SUB2. Thus, the conductive layer 24 (bit line BL) is electrically coupled to the transistor T8 provided on the semiconductor substrate SUB2 of the lower wafer LW, which is below the memory cell array 10, by way of the contacts CS, C1 to C3, V0 and V1 and the conductive layers 25, 26 and 60 to 63. Similarly, each of the other conductive layers 24 is coupled to a transistor provided on the semiconductor substrate SUB2 of the lower wafer LW, which is below the memory cell array 10, by way of the contact V0 and the conductive layer 25 coupled from below the memory pillar MP.

A conductive layer 64 is provided on each of the contacts CS and C0 in the transfer region XR1. The conductive layer 64 is included in the interconnect layer D0. A conductive layer 65 is provided on the conductive layer 64, with a contact C1 interposed. The conductive layer 65 is included in the interconnect layer D1. A conductive layer 66 is provided on the conductive layer 65, with a contact C2 interposed. The conductive layer 66 is included in the interconnect layer D2. A conductive layer 67 is provided on the conductive layer 66, with a contact C3 interposed. The conductive layer 67 is included in the interconnect layer D3. The conductive layer 67 corresponds to a bonding pad BPL provided in the transfer region XR1. The conductive layer 67 contains, for example, copper.

A conductive layer 29 provided to face the lower wafer LW is in contact with the conductive layer 67. The conductive layer 29 is coupled to the associated conductive layer 21 (select gate line SGS) via the contacts V0, V1 and CC and the conductive layers 27 and 28. That is, the contact CC is coupled to the select gate line SGS from the side of the semiconductor substrate SUB2. Thus, the conductive layer 21 (select gate line SGS) is electrically coupled to the transistor TR0 via the contacts CS, C1 to C3, V0 and V1 and the conductive layers 27 to 29 and 64 to 67. Similarly, each of the conductive layers 22 and 23 included in the stacked interconnects is coupled to a transistor provided on the semiconductor substrate SUB2 of the lower wafer LW, which is below the memory cell array 10, by way of the contact CC and the conductive layer 27 coupled from below the conductive layers 22 and 23.

The insulating layer 52 is, for example, a layer formed in the wiring process executed after the bonding process. The insulating layer 52 is provided on the conductive layer 20. A contact penetrating the insulating layer 52 can be coupled to the conductive layer 20. That is, the source line SL can be coupled to a circuit (a transistor or the like) on the semiconductor substrate SUB2 via the region located above the insulating layer 52. A pad or the like used for coupling to the memory controller 2 is provided in a region (not shown) above the insulating layer (10: Detailed Structure of the Bonding Portion)

Figure 14:
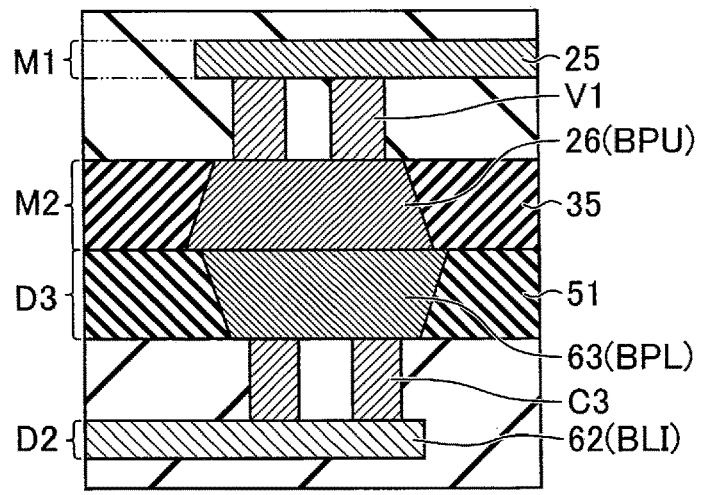
FIG. 14 is a cross-sectional view showing an example of how a detailed cross-sectional structure is in a bonding portion in the semiconductor memory device of the first embodiment.

FIG. 14 is a cross-sectional view showing an example of how a detailed cross-sectional structure is in the bonding portion of the semiconductor memory device 1 of the first embodiment. FIG. 14 shows the conductive layer 63 (bonding pad BPL) in the sense amplifier region SR, the conductive layer 26 (bonding pad BPU) in the memory region MR, and part of the contacts and interconnects coupled to these bonding pads BPL and BPU. As shown in FIG. 14, the conductive layers 63 and 26 have different tapered shapes, based on the etching directions at the time of formation.

Specifically, the conductive layer 63 (bonding pad BPL) formed by use of the lower wafer LW has, for example, a reverse tapered shape. The conductive layer 26 (bonding pad BPU) formed by use of the upper wafer UW has, for example, a tapered shape. As used herein, the term "tapered shape" refers to a shape whose thickness decreases as the distance from the reference substrate increases. The "reverse tapered shape" indicates a shape whose thickness increases as the distance from the reference substrate increases. That is, since the bonding pad BPU formed to have the reverse tapered shape in the front-end process of the upper wafer UW is inverted upside down and are bonded in this state in the bonding process, it is regarded as having the tapered shape where the semiconductor substrate SUB2 of the lower wafer LW is considered as a reference.

The conductive layer 63 (bonding pad BPL) and the conductive layer 26 (bonding pad BPU) opposed to each other between the memory chip and the CMOS chip are displaced in accordance with the alignment during the bonding process and are then bonded with each other. Therefore, a step may be formed between the upper surface of the conductive layer 63 and the lower surface of the conductive layer 26. The pair of bonding pads BPL and BPU opposed to each other in the Z direction between the memory chip and the CMOS chip may have a boundary; alternatively they may be integrated.

The conductive layer 63 (bonding pad BPL) may be coupled to the conductive layer 62 without the contact C3. The conductive layer 63 may be coupled to the conductive layer 62, using a plurality of contacts C3. Similarly, the conductive layer 26 (bonding pad BPU) may be coupled to the conductive layer 25 without the contact V1. The conductive layer 26 may be coupled to the conductive layer 25, using a plurality of contacts V1.

Although not shown, the conductive layer 67 (bonding pad BPL) and the conductive layer 29 (bonding pad BPU) may have a reverse tapered shape and a tapered shape, respectively, like the conductive layers 63 and 26. In the transfer region XR, the conductive layer 67 (bonding pad BPL) may be coupled to the conductive layer 66 without the contact C3. The conductive layer 67 may be coupled to the conductive layer 66, using a plurality of contacts C3. In the hookup region HR, the conductive layer 29 (bonding pad BPU) may be coupled to the conducting layer 28 without the contact V1. The conductive layer 29 may be coupled to the conductive layer 28, using a plurality of contacts V1.

(11: Interconnect Layout Used to Couple Bit Line B1 And Sense Amplifier Section SA)

FIG. 15 is a plan view showing an example of an interconnect layout used for coupling the bit line BL and the sense amplifier unit SA to each other in the semiconductor memory device 1 of the first embodiment. In FIG. 15, the regions corresponding to the memory region. MR and the hookup regions HR1 and HR2 are extracted and shown, and the portions overlapping the transfer regions XR1 and XR2, the sense amplifier region SR, and the peripheral circuit region PERI are shown as broken line regions. In FIG. 15, the lengths of the interconnects (for example, conductive layers 25) between the bit lines BL and the interconnects BLI are indicated by arrows, and part of the bit lines BL provided in the memory region MR and part of the interconnects BLI coupled to the bit lines BL are not illustrated.

As shown in FIG. 15, for example, in the memory region MR, the plurality of bit lines BL are arranged at substantially equal intervals along the X direction. The plurality of bit lines BL include a bit line BL overlapping the sense amplifier region SR, a bit line BL overlapping the transfer region XR1, and a bit line BL overlapping the transfer region XR2. Of the plurality of bit lines BL, the bit lines BL in the vicinity of the hookup region HR1 are arranged overlapping the transfer region XR1, and the bit lines BL in the vicinity of the hookup region HR2 are arranged overlapping the hookup region XR2.

For example, in the sense amplifier region SR, the plurality of interconnects BLI are arranged at substantially equal intervals along the X direction. Further, the plurality of interconnects BLI are arranged, for example, in a plurality of rows. The number of rows in which the interconnects BLI are arranged along the Y direction is based on the number of sense amplifier units SAU arranged in the Y direction.

The interconnects (for example, the conductive layers 25) coupling the bit line BL and the interconnect BLI have different lengths in the X direction; that is, the interconnect coupled to the bit line BL arranged close to the hookup region HR1 or HR2 and the interconnect coupled to the bit line BL arranged in the vicinity of the intermediate portion of the memory region MR have different lengths. For example, the interconnect coupling the bit line BL and the interconnect BLI is made shorter in the X direction as it is closer to the intermediate portion that equally divides the memory region MR in the X direction.

That is, the X-direction length of the interconnects coupling the bit line BL and the interconnect BLI arranged in the vicinity of the hookup region HR1 is more than the X-direction length of the interconnects coupling the bit line BL and the interconnect BLI arranged in the vicinity of the intermediate portion. Similarly, the X-direction length of the interconnects coupling the bit line BL and the interconnect BLI arranged in the vicinity of the hookup region HR2 is more than the X-direction length of the interconnects coupling the bit line BL and the interconnect ELI arranged in the vicinity of the intermediate portion.

(12: Planar Layout of Interconnect Layer M1 in Memory Region MR)

Figure 16:
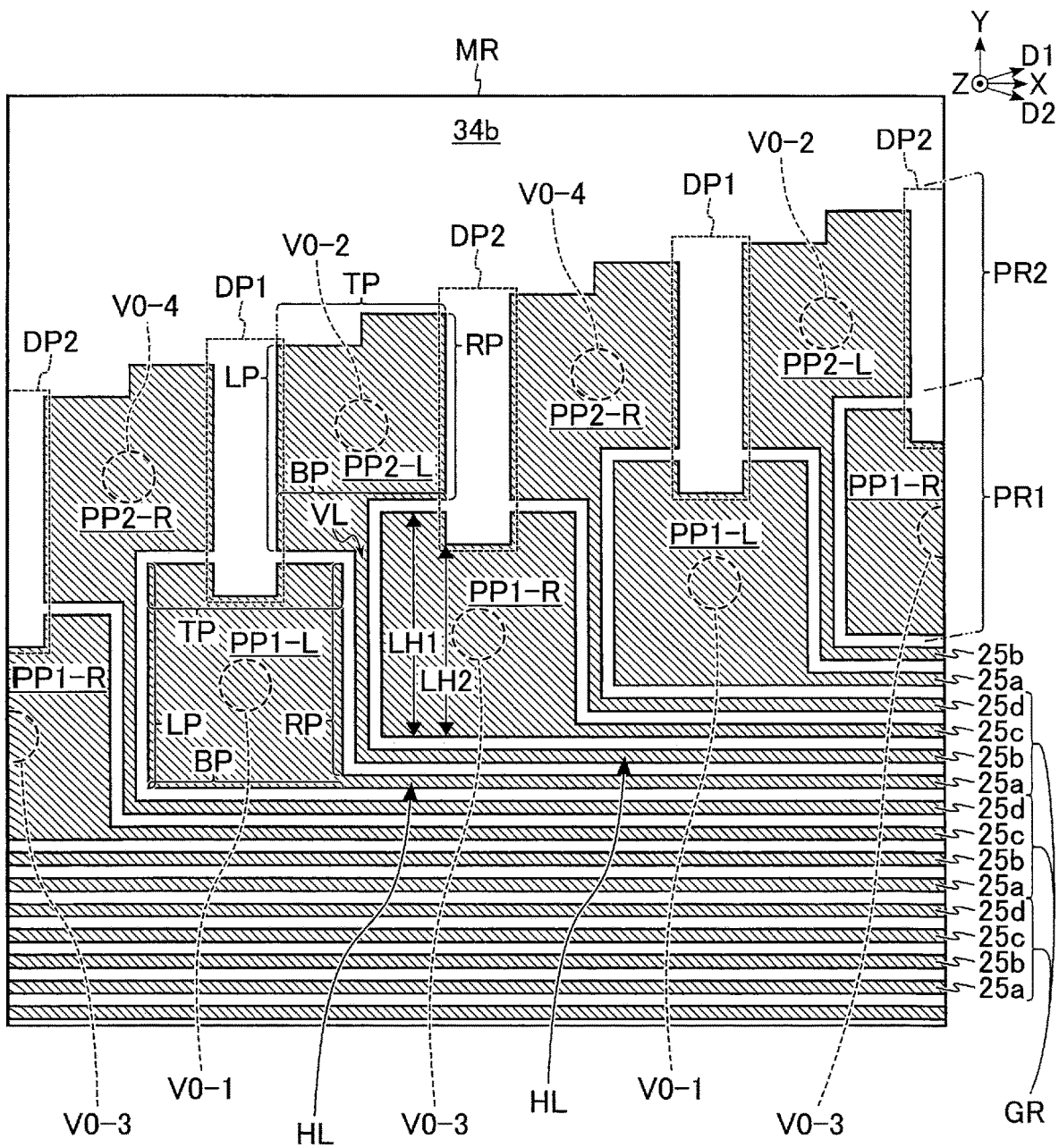
FIG. 16 is a plan view showing an example of a detailed planar layout in which an interconnect layer M1 is provided in the memory region of the memory cell array of the semiconductor memory device of the first embodiment.

FIG. 16 is a plan view showing an example of a detailed planar layout in which the interconnect layer M1 is provided in the memory region MR of the memory cell array 10 of the semiconductor memory device 1 of the first embodiment. FIG. 16 shows part of the memory region MR and depicts a detailed planar layout of a plurality of conductive layers 25 electrically coupled to a plurality of bit lines BL in the first embodiment. An insulating layer 34b is provided in the white portion of the region shown in FIG. 16. In the plan view referenced below, a D1 direction and a D2 direction are additionally shown in the three-dimensional Cartesian coordinate system. Each of the D1 direction and the D2 direction is a direction along the XY plane. The D1 direction and the D2 direction have a line-symmetrical relationship with respect to the X axis.

As shown in FIG. 16, the plurality of conductive layers 25 are separated and insulated by the insulating layer 34b. Each of the plurality of conductive layers 25 includes a portion HL extending in the X direction. The portions HL of the plurality of conductive layers 25 are arranged in the Y direction. The plurality of conductive layers 25 are classified into groups GR each including four conductive layers 25a, 25b, 25c and 25d whose portions HL are arranged in order in the Y direction. That is, in the memory region MR, the portion HL of the conductive layer 25a, the portion HL of the conductive layer 25b, the portion HL of the conductive layer 25c, and the portion HL of the conductive layer 25d are repeatedly arranged in the Y direction.

The conductive layer 25a includes a pad portion PP1_L that includes a portion extending along the Y direction from the end portion of the portion HL of the conductive layer 25a. The conductive layer 25c includes a pad portion PP1_R that includes a portion extending along the Y direction from the end portion of the portion HL of the conductive layer 25c. The pad portions PP1_1, and PP1_R are alternately arranged in the pad region PR1 provided along the D1 direction. That is, the pad region PR1 includes the pad portions PP1-L and PP1-R of each group GR.

The conductive layers 25b and 25d include portions VL extending along the Y direction from the ends of the portions HL of the conductive layers 25b and 25d. The portion VL of the conductive layer 25b includes a portion provided between the pad portions PP1-L and PP1-R of the same group GR. The portion VL of the conductive layer 25d is adjacent to the pad portion PP1-R on the opposite side of the portion VL of the conductive layer 25b. In other words, the portion VL of the conductive layer 25b includes a portion provided between the pad portion PP1-R of the same group and the pad portion PP1-L of the adjacent group GR on the side of the conductive layer 25d.

The conductive layer 25b includes a pad portion PP2_L having a portion extending along the X direction from the end portion of the portion VL of the conductive layer 25b. The conductive layer 25d includes a pad portion PP2_R having a portion extending along the X direction from the end portion of the portion VL of the conductive layer 25d. The pad portions PP2_L and PP2_R are provided along the D1 direction and are arranged alternately in the pad region PR2 adjacent to the pad region PR1 in the Y direction. That is, the pad region PR2 includes the pad portions PP2-L and PP2-R of each group GR.

In each group GR, the pad portions PP1-L and PP2-L are arranged side by side along the Y direction. In each group GR, the pad portions PP1-R and PP2-R are arranged side by side along the Y direction. In other words, in the pad regions PR1 and PR2, the pair of pad portions PP1-L and PP2-L and the pair of pad portions PP1-R and PP2-R are alternately arranged in the D1 direction. The plurality of pad portions PP are arranged in two rows and in a staggered fashion.

A contact V0-1 is coupled to the pad portion PP1-L of the conductive layer 25a. A contact V0-2 is coupled to the pad portion PP2-L of the conductive layer 25b. A contact V0-3 is coupled to the pad portion PP1-R of the conductive layer 25c. A contact V0-4 is coupled to the pad portion PP2-R of the conductive layer 25d. Each of the contacts V0-1 to V0-4 is coupled to the associated bit line BL.

Each pad portion PP has an upper end portion TP, a lower end portion BP, a left end portion LP, and a right end portion RP. The upper end portion TP corresponds to a portion of the pad portion PP that is on the upper side when viewed from above, and includes a portion that is in contact with the insulating layer 34b on the upper side. The lower end portion BP corresponds to a portion of the pad portion PP that is on the lower side when viewed from above, and includes a portion that is in contact with the insulating layer 34b on the lower side. The left end portion LP corresponds to the portion of the pad portion PP that is on the left side when viewed from above, and includes a portion that is in contact with the insulating layer 34b on the left side. The right end portion RP corresponds to the portion of the pad portion PP that is on the right side when viewed from above, and includes a portion that is in contact with the insulating layer 34b on the right side.

In the same group GR, the right end portion RP of the pad portion PP1-L and the left end portion LP of the pad portion PP1-R have portions opposed to each other in the X direction, with the portion VL of the conductive layer 25b interposed. In the same group GR, the upper end portion TP of the pad portion PP1-L and the lower end portion BP of the pad portion PP2-L have portions opposed to each other in the Y direction. In the same group GR, the upper end portion TP of the pad portion PP1-R and the lower end portion BP of the pad portion PP2-L have portions opposed to each other in the Y direction. In the same group GR, the upper end portion TP of the pad portion PP1-R and the lower end portion BP of the pad portion PP2-R have portions opposed to each other in the Y direction. The lower end portion BP of the pad portion PP2-L of a certain group GR and the upper end portion TP of the pad portions PP1-L of the conductive layer 25a of the group GR adjacent on the side of the conductive layer 25d have portions opposed to each other in the Y direction.

The insulating layer 34b has a dividing portion DP between adjacent pad portions PP2-L and PP2-R. In the description below, the dividing portion DP between the adjacent pad portions PP2-L and PP2-R of different groups GR will be referred to as "dividing portion DP1", and the dividing portion DP between the adjacent pad portions PP2-L and PP2-R of the same group GR will be referred to as "dividing portions DP2".

The dividing portion DP1 extends along the Y direction, and part of the upper end portion TP of the pad portion PP1-L is divided thereby. In other words, the dividing portion DP1 of the insulating layer 34b is provided extending from the upper end portion TP of the pad portion PP1-L along the Y direction, and is continuous with the other dividing portions DP via the upper side of the pad region PR2. Thus, the left end portion LP of the pad portion PP2-L of a certain group GR and the right end portion RP of the pad portion PP2-R of the conductive layer 25d of the group GR adjacent on the side of the conductive layer 25a have portions opposed to each other in the X direction, with the dividing portion DP1 interposed. In the insulating layer 34b, the dividing portion DP1 and the portions surrounding the conductive layer 25a and in contact with the dividing portion DP1 are continuously provided.

The dividing portion DP2 extends along the Y direction, and part of the upper end portion TP of the pad portion PP1-R is divided thereby. In other words, the dividing portion DP2 of the insulating layer 34b is provided extending from the upper end portion TP of the pad portion PP1-R along the Y direction, and is continuous with the other dividing portions DP via the upper side of the pad region PR2. Thus, in the same group GR, the right end portion RP of the pad portion PP2-L and the left end portion LP of the pad portion PP2-R have portions opposed to each other in the X direction, with the dividing portion DP2 interposed. In the insulating layer 34b, the dividing portion DP2 and the portions surrounding the conductive layer 25c and in contact with the dividing portion DP2 are continuously provided.

Where the dividing portion DP1 divides part of the upper end portion TP of the pad portion PP1-L, the pad portion PP1-L has a concave shape when viewed from above. Further, that portion of the pad portion PP1-L which is adjacent to the dividing portion DP1 in the X direction on the side of the pad portion PP1-R and that portion (left end portion LP) of the pad portion PP2-L which is adjacent to the dividing portion DP1 in the X direction R are aligned along the Y direction. The pad portion PP1-L includes a first sub portion and a second sub portion adjacent to each other in the X direction, and each of the first sub portion and the second sub portion has one end portion and the other end portion of the pad portion PP1-L as viewed in the Y direction. The first sub portion has a portion adjacent to the pad portion PP2-L in the Y direction, and the second sub portion has a portion adjacent to the dividing portion DP1 in the Y direction. In the pad portion PP1-L, the first sub portion corresponds to portions that are in contact with the right end portion RP of the pad portion PP1-L, and the upper end portion TP and lower end portion BP opposed to the pad portion PP2-L in the Y direction. The second sub portion corresponds to portions that are away from the right end portion RP and left end portion LP of the pad portion PP1-L and in contact with the upper end portion TP and lower end portion BP opposed to the dividing portion DP1 in the Y direction. The length LH2 of the second sub portion of the pad portion PP1-L as viewed in the Y direction is less than the length LH1 of the first sub portion of the pad portion PP1-L as viewed in the Y direction.

Where the dividing portion DP2 divides part of the upper end portion TP of the pad portion PP1-R, the pad portion PP1-R has a concave shape when viewed from above. Further, that portion of the pad portion PP1-R which is adjacent to the dividing portion DP2 in the X direction on the side of the pad portion PP1-L and that portion (right end portion RP) of the pad portion PP2-L which is adjacent to the dividing portion DP2 are aligned along the Y direction. The pad portion PP1-R includes a third sub portion and a fourth sub portion which are adjacent to each other in the Y direction, and each of the third sub portion and the fourth sub portion has one end portion and the other end portion of the pad portion PP1-R as viewed in the Y direction. The third sub portion has a portion adjacent to the pad portion PP2-L in the Y direction, and the fourth sub portion has a portion adjacent to the dividing portion DP2 in the Y direction. In the pad portion PP1-R, the third sub portion corresponds to portions that are in contact with the left end LP of the pad portion PP1-R and the upper and lower end portions TP and BP opposed to the pad portion PP2-L in the Y direction. The fourth sub portion corresponds to portions that are away from the right end portion RP and left end portion LP of the pad portion PP1-R and that are in contact with the upper end portion TP and lower end portion BP opposed to the dividing portion DP2 in the Y direction. The length LH2 of the fourth sub portion of the pad portion PP1-R as viewed in the Y direction is less than the length of the third sub portion of the pad portion PP1-R as viewed in the Y direction. The lengths LH1 of the pad portions PP1-L and PP1-R may be different from each other, and the lengths LH2 of the pad portions PP1-L and PP1-R may be different from each other.

The width of that portion of the insulating layer 34b which is adjacent to the pad portion PP or the width of that portion of the insulating layer 34b which is sandwiched between the conductive layers 25 is, for example, 18 nm or less. In the semiconductor memory device 1 of the first embodiment, the insulating layer 34b has portions of substantially the same dimensions, based on the method of forming the structure of the interconnect layer M1 described later. For example, the insulating layer 34b has substantially the same width at the portions surrounding one of the conductive layers 25a, 25b, 25c and 25d and provided between the conductive layers 25, except at the portions corresponding to the dividing portions DP.

Specifically, the distances between the portions HL of the two adjacent conductive layers 25 are away from each other in the Y direction are substantially equal. More specifically, in the same group GR, the distance between the portion HL of the conductive layer 25a and the portion HL of the conductive layer 25b that are away from each other in the Y direction, the distance between the portion HL of the conductive layer 25b and the portion HL of the conductive layer 25c that are away from each other in the Y direction, the distance between the portion HL of the conductive layer 25c and the portion HL of the conductive layer 25d that are away from each other in the Y direction, and the distance between the portion HL of the conductive layer 25a and the portion HL of the conductive layer 25d of the group GR adjacent in the Y direction on the side of the conductive layer 25a are substantially equal.

In the same group GR, the distance between the pad portion PP1-L of the conductive layer 25a and the portion VL of the conductive layer 25b that are away from each other in the X direction, the distance between the pad portion PP1-R of the conductive layer 25c and the portion VL of the conductive layer 25b are away from each other in the X direction, and the distance between the pad portion PP1-R of the conductive layer 25c and the portion VL of the conductive layer 25d that are away from each other in the X direction are substantially equal. The distance between the pad portion PP1-L of the conductive layer 25a and the portion VL of the conductive layer 25d that are adjacent to each other but belong to different groups GR and that are away from each other in the X direction is substantially equal to the distance between the pad portion PP1-L of the conductive layer 25a and the portion VL of the conductive layer 25b that belong to the same group GR and that are away from each other in the X direction. Further, the distance between the pad portion PP1-L of the conductive layer 25a and the portion VL of the conductive layer 25b that are away from each other in the X direction is substantially equal to the distance between the portions HL of the two adjacent conductive layers 25 that are away from each other in the Y direction.

The distances between the pad portions PP1 and PP2 adjacent to each other in the Y direction are substantially equal. Specifically, in the same group GR, the distance between the first sub portion of the pad portion PP1-L and the pad portion PP2-L that are away from each other in the Y direction is substantially equal to the distance between the third sub portion of the pad portion PP1-R and the pad portion PP2-L that are away from each other in the Y direction. Further, the distance between the portions of the pad portions PP1 and PP2 that are adjacent in the Y direction is substantially equal to the distance between the portions HL of the two adjacent conductive layers 25 that are away from each other in the Y direction.

As described above, the semiconductor memory device 1 of the first embodiment has a structure in which a plurality of pad portions PP arranged side by side in the D1 direction are provided for each of the two-stage pad regions PR1 and PR2. Depending on the arrangement of the plurality of dividing portions DP, the pad portion PP2 may be opposed to only one of the pad portions PP1-L and PP1-R in the Y direction. In the interconnect layer M1 of the semiconductor memory device 1, the structure described in FIG. 16 may be inverted with the X axis as the axis of symmetry. In the structure of the interconnect layer M1 obtained by the inversion with the X axis as the axis of symmetry, each of the pad regions PR1 and PR2 extends along the D2 direction. Similarly, in the interconnect layer M1 of the semiconductor memory device 1, the structure described in FIG. 16 may be inverted with the Y axis as the axis of symmetry, and the structure described in FIG. 16 may be inverted with both X axis and the Y axis as the axes of symmetry. Although the pad portions PP to which the contacts V0 are coupled have been described with reference to FIG. 16, the conductive layer 25 may have a structure similar to that of the pad portions PP in the portion to which the contacts V1 are coupled. That is, in the conductive layer 25, a structure similar to the pad portion PP is provided at each of one end portion and the other end portion, and contacts V0 and V1 can be coupled to the one end portion and the other end portion, respectively.

[1-2] Manufacturing Method

FIG. 17 is a flowchart illustrating an example of a method of manufacturing the semiconductor memory device 1 of the first embodiment. Each of FIG. 18, FIG. 20, FIG. 22, FIG. 24, FIG. 26, FIG. 28 and FIG. 30 is a plan view showing an example of how the structure of the interconnect layer M1 is formed in the memory region MR of the memory cell array of the semiconductor memory device 1 of the first embodiment. Each of FIG. 19, FIG. 21, FIG. 23, FIG. 25, FIG. 27, FIG. 29 and FIG. 31 is a cross-sectional view showing an example of how the structure of the interconnect layer M1 is formed in the semiconductor memory device 1 of the first embodiment. FIG. 19 corresponds to a cross section taken along line XIX-XIX line of FIG. 18. FIG. 21 corresponds to a cross section taken along line XXI-XXI of FIG. 20. FIG. 23 corresponds to a cross section taken along line XXIII-XXIII of FIG. 22. FIG. 25 corresponds to a cross section taken along line XXV-XXV of FIG. 24. FIG. 27 corresponds to a cross section taken along line XXVII-XXVII of FIG. 26. FIG. 29 corresponds to a cross section taken along line XXIX-XXIX of FIG. 28. FIG. 31 corresponds to a cross section taken along line XXXI-XXXI line of FIG. 30. In the description below, a method of forming interconnects (conductive layers 25) in the interconnect layer M1, which method is involved in the method of manufacturing the semiconductor memory device 1 of the first embodiment, will be described with reference to FIG. 17.

First, an insulating layer 34b, a sacrificial layer 70 and a sacrificial layer 80 are stacked (S11). Specifically, the insulating layer 34b is formed on an insulating layer 34a, the sacrificial layer 70 is formed on the insulating layer 34b, and the sacrificial layer 80 is formed on the sacrificial layer 70. The insulating layer 34a is, for example, an insulator such as silicon oxide ($SiO_2$). Each of the sacrificial layers 70 and 80 may be composed of a plurality of stacked layers of different materials. As each of the sacrificial layers 70 and 80, a material such as amorphous silicon (aSi), an oxide of silicon or the like, or a nitride of silicon or the like is used. As the sacrificial layers 70 and 80, materials (composition) capable of providing an etching selection ratio between the sacrificial layer 70 and the sacrificial layer 80 are preferably used.

Figure 18:
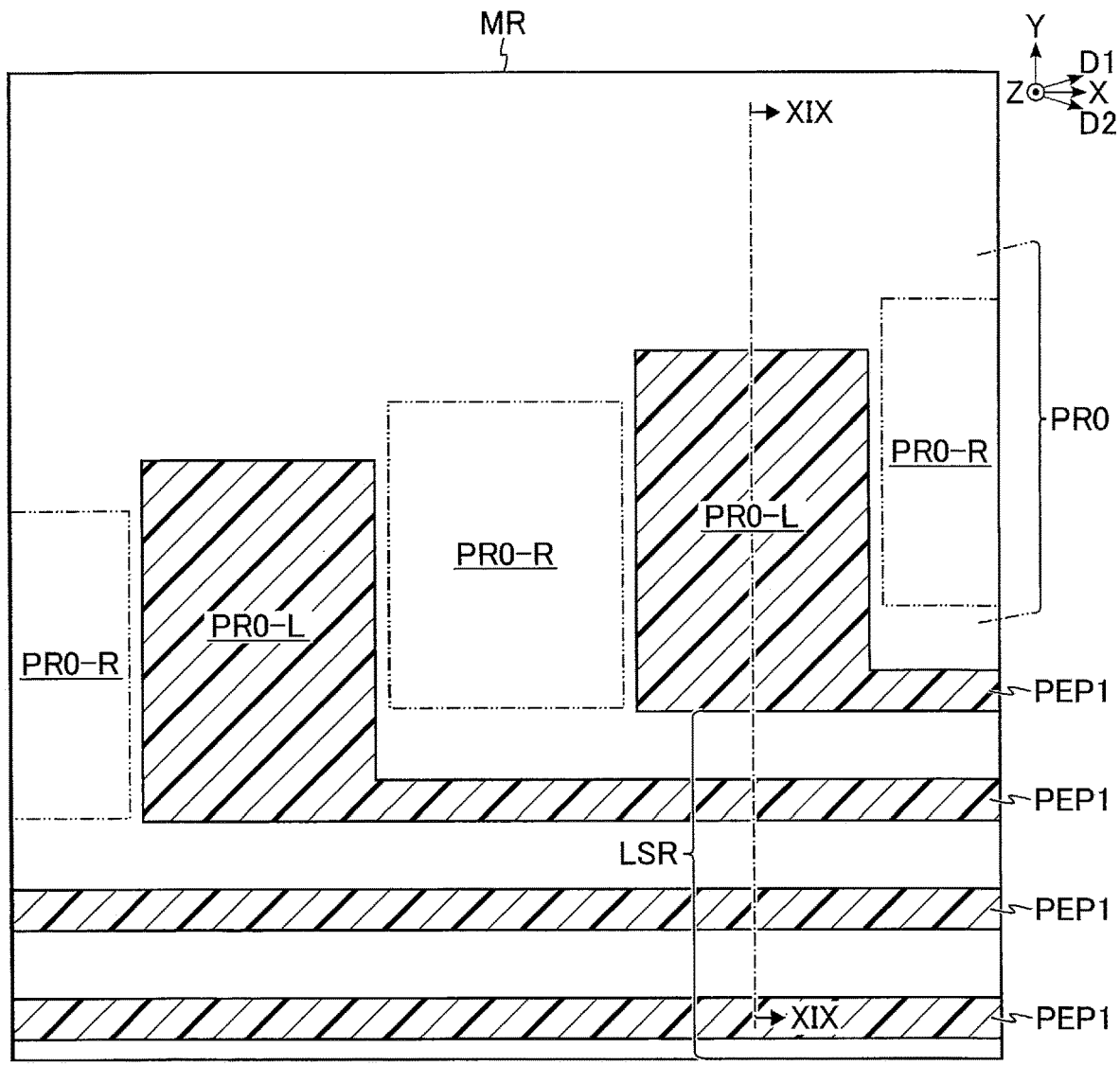
FIG. 18 is a plan view showing an example of a planar layout in which the structure of the interconnect layer M1 is formed in the memory region of the memory cell array of the semiconductor memory device of the first embodiment.
Figure 19:
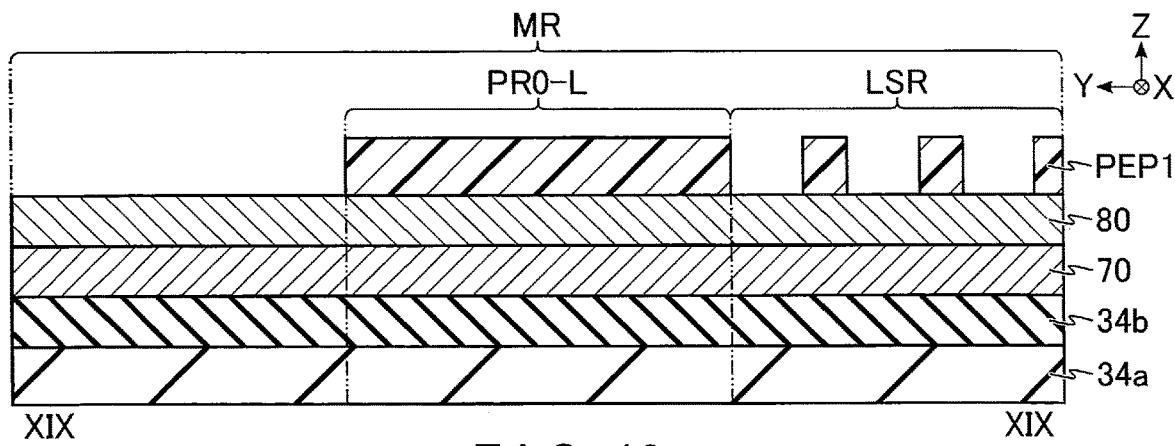
FIG. 19 is a cross-sectional view taken along XIX-XIX line of FIG. 18 and showing an example of a cross-sectional structure of how the structure of the interconnect layer M1 is formed in the semiconductor memory device of the first embodiment.

Next, as shown in FIG. 18, a resist pattern PEP1 having a portion covering part of a region PR0 is formed (first exposure) (S12). Specifically, a resist is first applied to the sacrificial layer 80. Then, the applied resist is exposed to light by an exposure process that uses a photomask having an opening based on a resist pattern PEP1. Next, the exposed portion of the resist is removed by a developing process to form the resist pattern PEP1. The resist pattern PEP1 has a first line-and-space pattern extending in the X direction. In the description below, the region in which the line-and-space pattern is formed by the present manufacturing method will be referred to as "region LSR". A plurality of line patterns included in the first line-and-space pattern have a portion extending in the Y direction and covering part of the region PR0 (region PR0-L) at each end. The region PR0 includes regions PR0-L and PR0-R that are alternately arranged along the D1 direction in the illustrated region. The Y-direction width of the portion of the line pattern covering the region PR0-L is more than the Y-direction width of the pad region PR1 and is less than the Y-direction width of the pad regions PR1 and PR2 combined. The X-direction length of the region PR0-L is more than the X-direction length of the pad portion PP1-L. The X-direction length of the region PR0-R is more than the X-direction length of the pad portion PP1-R. As shown in FIG. 19, the surface of the sacrificial layer 80 is exposed in the opening of the resist pattern PEP1.

Figure 20:
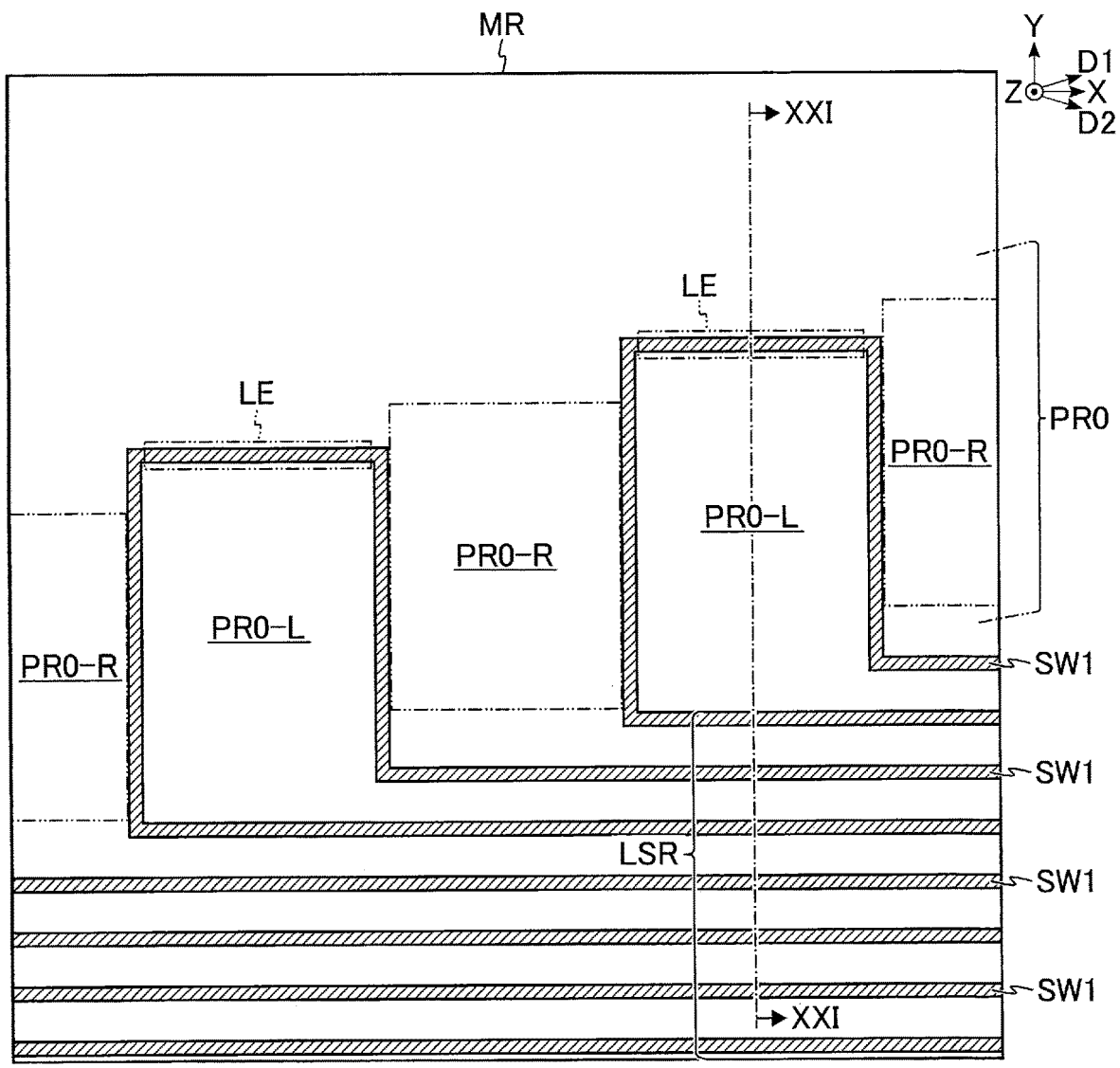
FIG. 20 is a plan view showing an example of a planar layout in which the structure of the interconnect layer M1 is formed in the memory region of the memory cell array of the semiconductor memory device of the first embodiment.
Figure 21:
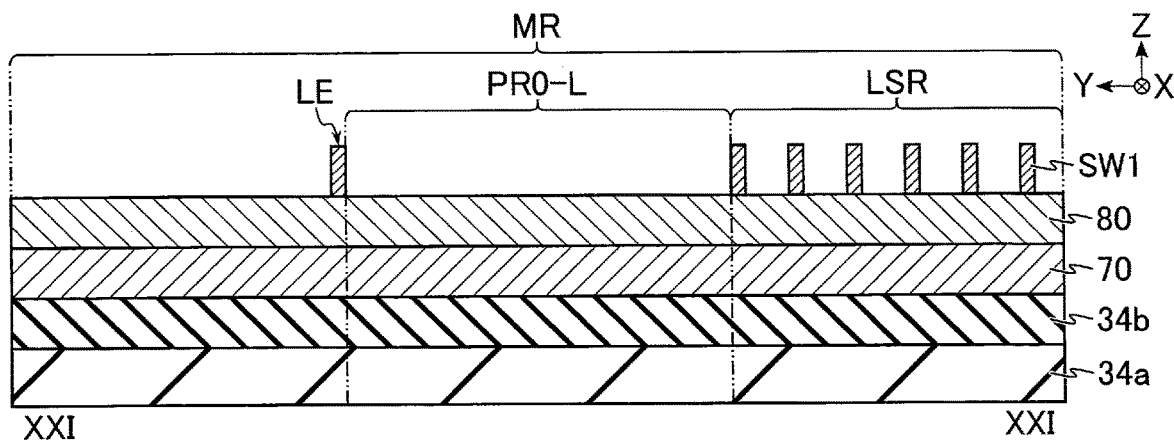
FIG. 21 is a cross-sectional view taken along line XXI-XXI of FIG. 20 and showing an example of a cross-sectional structure depicting how the structure of the interconnect layer M1 is formed in the semiconductor memory device of the first embodiment.

Next, as shown in FIG. 20, a sidewall SW1 is formed using the resist pattern PEP1 as a core material (S13). Specifically, a first material is formed, for example, by CVD (Chemical Vapor Deposition) such that it covers the resist pattern PEP1. Then, by an anisotropic etching treatment (for example, RIE), part of the first material is removed such that the surface of the resist pattern PEP1 and part of the surface of the sacrificial layer 80 are exposed. Thus, the first material remaining on the side surface portion of the resist pattern PEP1 corresponds to the sidewall SW1. Thereafter, the resist pattern PEP1 used as the core material is removed. The sidewall SW1 is formed for each line pattern included in the first line-and-space pattern, and has a loop end portion LE. The loop end portion LE of the sidewall SW1 corresponds to that portion of the sidewall SW1 which is included in the region PR0 and is farthest from the region LSR. As the sidewall SW1 (first material), for example, amorphous silicon (aSi), silicon nitride (SiN), or the like is used. As shown in FIG. 21, the surface of the sacrificial layer 80 is exposed in the opening of the sidewall SW1. The step of forming the sidewall using the core material may be referred to as "sidewall process".

Figure 22:
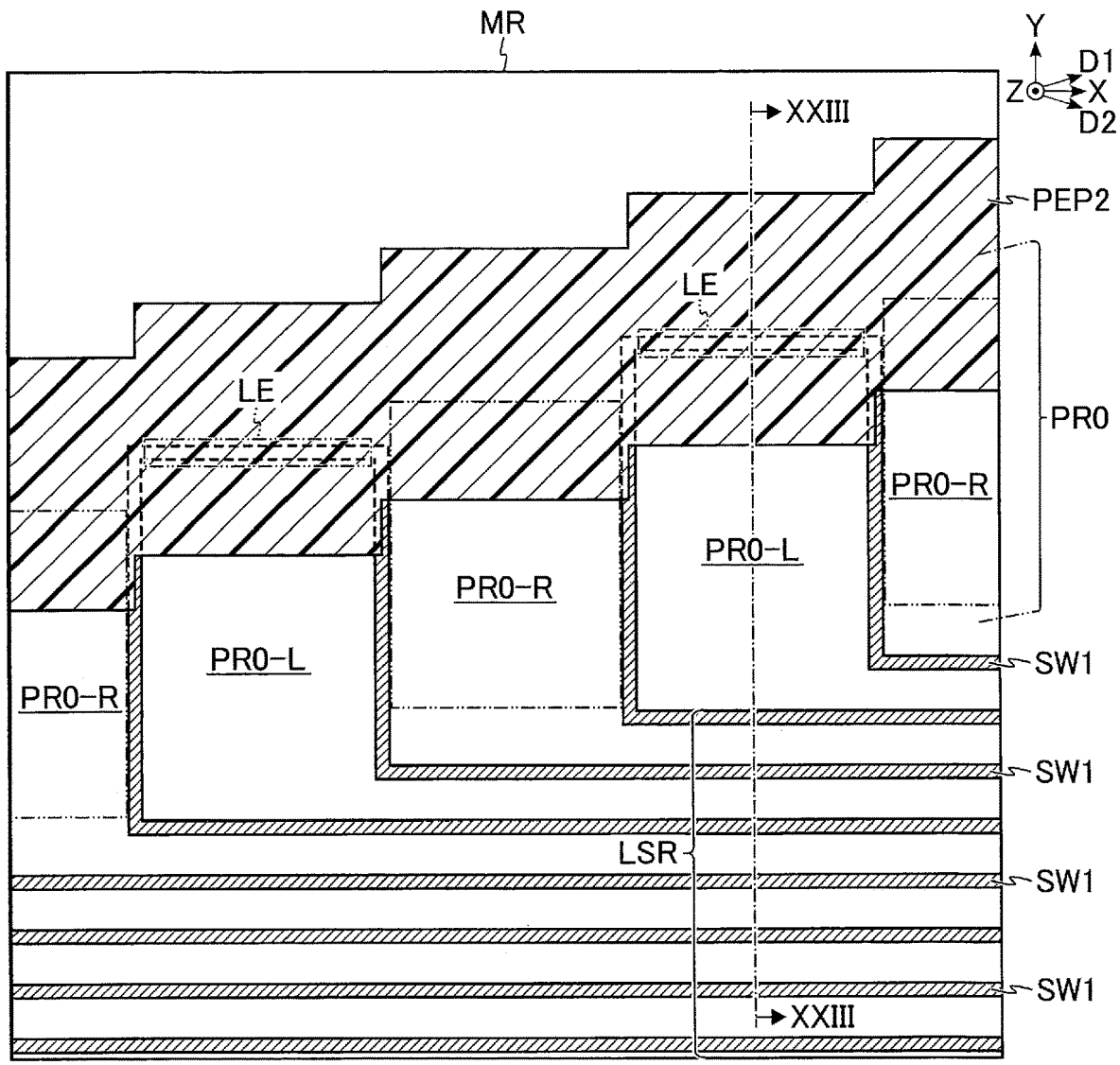
FIG. 22 is a plan view showing an example of a planar layout in which the structure of the interconnect layer M1 is formed in the memory region of the memory cell array of the semiconductor memory device of the first embodiment.
Figure 23:
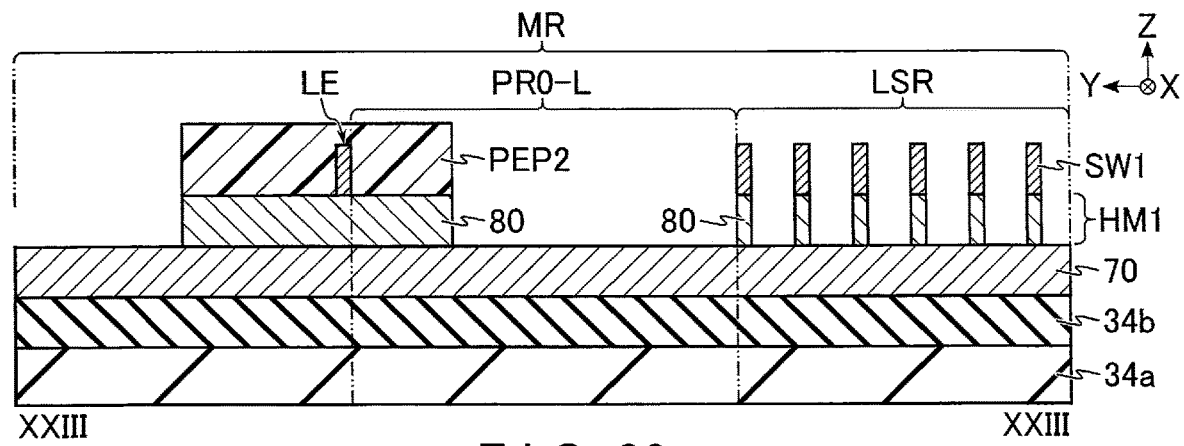
FIG. 23 is a cross-sectional view taken along line XXIII-XXIII of FIG. 22 and showing an example of a cross-sectional structure depicting how the structure of the interconnect layer M1 is formed in the semiconductor memory device of the first embodiment.

Next, as shown in FIG. 22, a resist pattern PEP2 having a portion covering the loop end portion LE of each sidewall SW1 is formed (second exposure) (S14). Specifically, a resist is first applied such that it covers the sacrificial layers 70 and 80. Then, the applied resist is exposed to light by an exposure process that uses a photomask having an opening based on the resist pattern PEP2. Then, the exposed portion of the resist is removed by a developing process to form the resist pattern PEP2. The resist pattern PEP2 overlaps part of the region PR0 and is continuously provided between the loop end portions LE of the adjacent sidewalls SW1. The resist pattern PEP2 overlaps the pad region PR2 and is provided such that it covers a region where each pad portion PP2 is formed later.

Next, as shown in FIG. 23, the sacrificial layer 80 is processed by an etching process that uses the sidewall SW1 and the resist pattern PEP2 as masks, and a hard mask HM1 is formed thereby (S15). That is, the hard mask HM1 corresponds to the processed sacrificial layer 80. The planar shape of the hard mask HM1 corresponds to a shape of the combination of the planar shapes of the resist pattern PEP2 and the sidewall SW1.

Next, the sidewall SW1 and the resist pattern PEP2 are removed (S16).

Then, as shown in FIG. 24, a sidewall SW2 is formed using the hard mask HM1 as a core material (S17). Specifically, a second material is formed, for example, by CVD such that the hard mask HM1 is covered. Then, by an anisotropic etching treatment (for example, RIE), part of the second material is removed such that part of the surface of the sacrificial layer 70 is exposed. As a result, the second material remaining on the side surface portion of the hard mask HM1 corresponds to the sidewall SW2. Thereafter, the hard mask HM1 used as the core material is removed. The sidewall SW2-L formed in the region surrounded by the sidewall SW1 and the resist pattern PEP2 surrounds a pad region PR1-L when viewed from above. The sidewall SW2-R formed in the portion surrounded by the adjacent sidewall SW1 and the resist pattern PEP2 surrounds a pad region PR1-R when viewed from above. The loop end portion LE of the sidewall SW2-L corresponds to the portion of the sidewall SW2-L which is farthest from the region LSR. The loop end portion LE of the sidewall SW2-R corresponds to that portion of the sidewall SW2-R which is farthest from the region LSR. The sidewall SW2-Z that is formed on the side surface portion on the opposite side of the region LSR in the resist pattern PEP2 is continuously formed along the pad region PR2. In the description below, the portion where the sacrificial layer 70 is continuously exposed in the region PR2 will be referred to as a region PR2-W. As the sidewall SW2 (second material), for example, amorphous silicon (aSi), silicon nitride (SiN), or the like is used. As shown in FIG. 25, the surface of the sacrificial layer 70 is exposed in the opening of the sidewall SW2.

Figure 26:
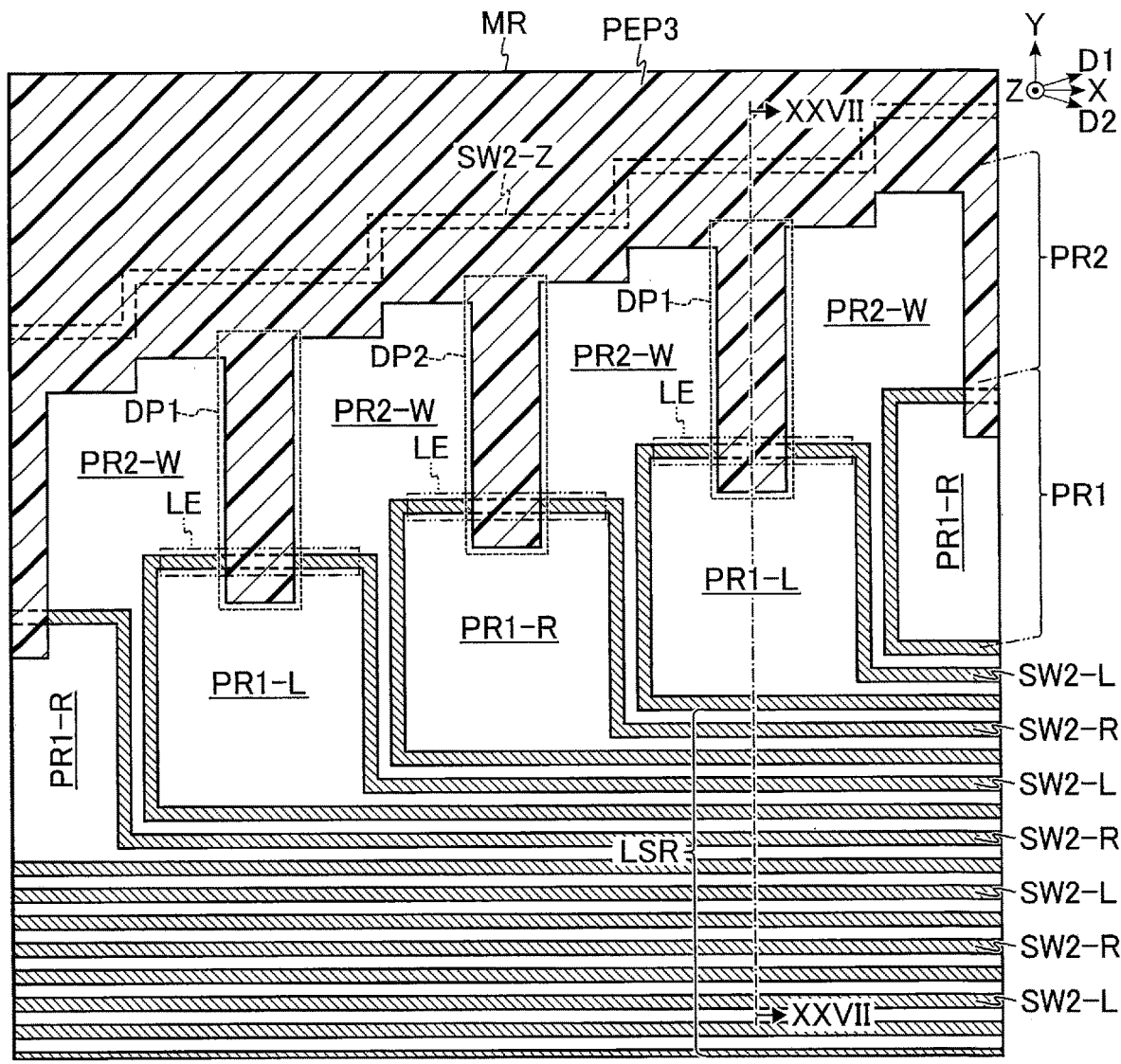
FIG. 26 is a plan view showing an example of a planar layout in which the structure of the interconnect layer M1 is formed in the memory region of the memory cell array of the semiconductor memory device of the first embodiment.
Figure 27:
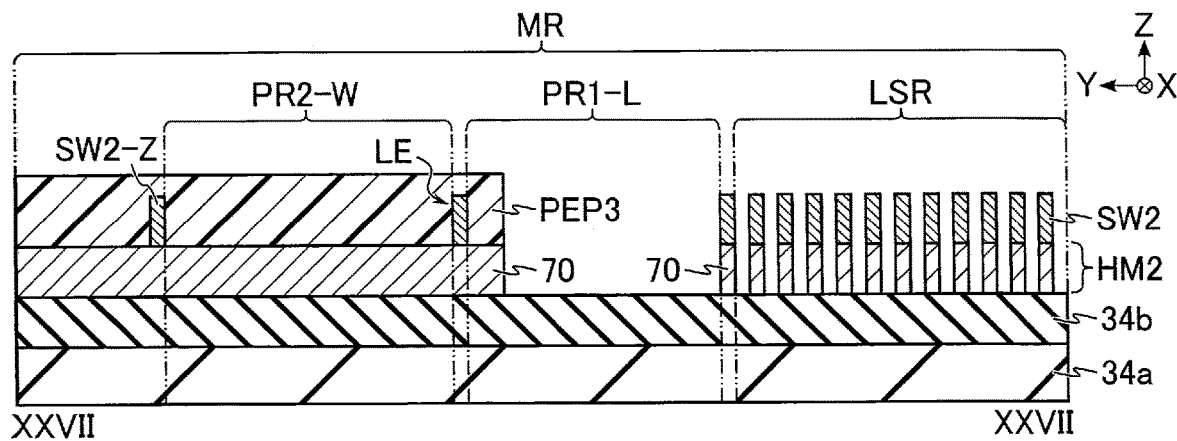
FIG. 27 is a cross-sectional view taken along line XXVII-XXVII of FIG. 26 and showing an example of a cross-sectional structure depicting how the structure of the interconnect layer M1 is formed in the semiconductor memory device of the first embodiment.

Next, as shown in FIG. 26, a resist pattern PEPS having a portion covering the loop end portion LE of each sidewall SW2 and a plurality of dividing portions DP extending from the loop end portions LE toward the sidewall SW-Z is formed (third exposure) (S18). Specifically, a resist is first applied such that it covers the sacrificial layer 70 and the sidewall SW2. Then, the applied resist is exposed to light by an exposure process that uses a photomask having an opening based on the resist pattern PEP3. Then, the exposed portion of the resist is removed by a developing process to form the resist pattern PEP3. The resist pattern PEP3 covers a portion where the interconnect layer M1 does not use a conductor (for example, metal). The resist pattern PEP3 is continuously provided along the region PR2 and has a portion covering the sidewall SW2-Z. The resist pattern PEP3 has a portion with which to cover the regions corresponding to the dividing portions DP1 and DP2. As a result, the regions PR2-W are partitioned by the dividing portions DP1 and DP2. Specifically, the resist pattern PEP3 includes a portion overlapping the loop end portion LE of the sidewall SW2-L and a portion overlapping the loop end portion LE of the sidewall SW2-R.

Next, as shown in FIG. 27, the sacrificial layer 70 is processed by an etching process that uses the sidewall SW2 and the resist pattern PEP3 as masks, and a hard mask HM2 is formed thereby (S19). That is, the hard mask HM2 corresponds to the processed sacrificial layer 70. The planar shape of the hard mask HM2 corresponds to a shape in which the planar shapes of the resist pattern PEP3 and the sidewall SW2 are combined. The surface of the sacrificial layer 34b is exposed in the opening of the hard mask HM2.

Next, the sidewall SW2 and the resist pattern PEP3 are removed (S20).

Next, as shown in FIG. 28, the insulating layer 34b is processed by an etching process that uses the hard mask HM2 as a mask, and a plurality of trench portions 90 are formed in the insulating layer 34b (S21). The plurality of trench portions 90 are classified into groups each including four trench portions 90a, 90b, 90c and 90d arranged in order in the Y direction. The trench portion 90a includes a pad region PR1-L. The trench portion 90b includes a pad region PR2-L. The trench portion 90c includes a pad region PR1-R. The trench portion 90d includes a pad region PR2-R. As shown in FIG. 29, the hard mask HM2 is removed after the plurality of trench portions 90 are formed. The surface of the insulating layer 34a is exposed in the opening of the hard mask HM2. By forming the trench portions 90 in the insulating layer 34b, a second line-and-space pattern is formed in the region LSR of the insulating layer 34b. The line patterns and spaces of the second line-and-space pattern extend in the X direction.

Figure 30:
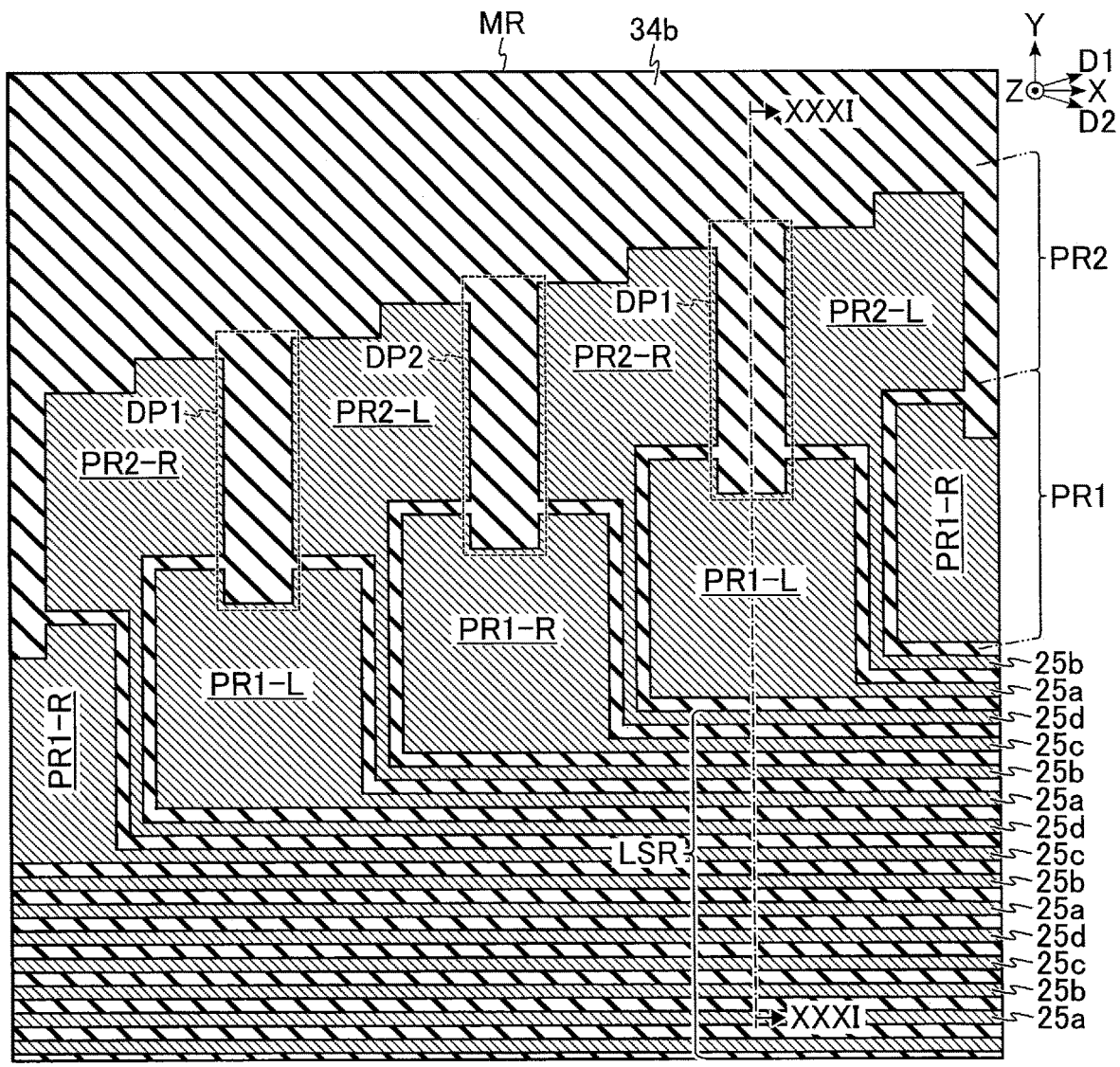
FIG. 30 is a plan view showing an example of a planar layout in which the structure of the interconnect layer M1 is formed in the memory region of the memory cell array provided in the semiconductor memory device of the first embodiment.
Figure 31:
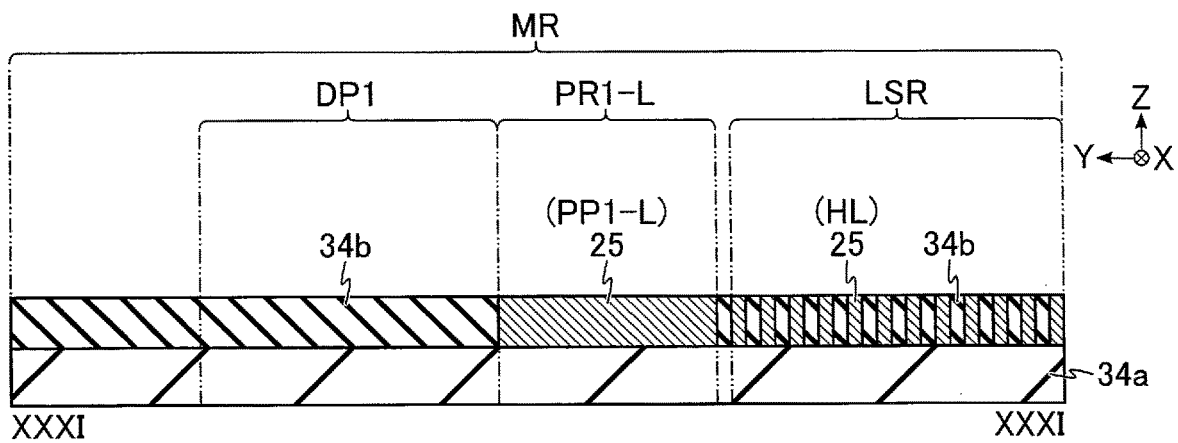
FIG. 31 is a cross-sectional view taken along line XXXI-XXXI of FIG. 30 and showing an example of a cross-sectional structure depicting how the structure of the interconnect layer M1 is formed in the semiconductor memory device of the first embodiment.

Next, as shown in FIG. 30, a conductor is formed in each of the plurality of trench portions 90 (S22). Specifically, each trench portion 90 is embedded with a conductor, for example, by CVD. Then, the conductor provided above the insulating layer 34b is removed by CMP (Chemical Mechanical Polishing), etch back treatment, or the like. The conductors provided in the trench portions 90a, 90b, 90c and 90d correspond to conductive layers 25a, 25b, 25c and 25d, respectively. As the conductor formed in each trench portion 90, a metal such as tungsten or copper is used. As shown in FIG. 31, the conductor formed in each trench portion 90 is provided on the insulating layer 34a. For example, the conductor embedded in the pad region PR1-L corresponds to the pad portion PP1-L. The conductor embedded in the trench portion 90 of the region LSR corresponds to the portion HL of the conductive layer 25. The Y-direction width of the conductor (conductive layer 25) formed in the space portion of the second line-and-space pattern is, for example, 18 nm or less. This dimension is based on the fact that the half-pitch of the resolution limit of a line-and-space pattern that can be formed by an immersion exposure apparatus using ArF as a light source is 36 nm, and indicates that a sidewall process is executed at least twice for the formation of the conductive layer 25.

[1-3] Advantages of First Embodiment

The semiconductor memory device 1 of the first embodiment described above is advantageous in that the manufacturing cost of a semiconductor device can be suppressed. Detailed advantages of the first embodiment will be described.

In order to increase the storage capacity of the semiconductor memory device 1, it is preferable that the wiring pitch of the circuit pattern of the semiconductor memory device 1 is narrow. As a method of shrinking the wiring pitch, a method of forming a wiring by executing a sidewall process twice is known. Further, with respect to the semiconductor memory device 1, the use of the circuit pattern as shown in FIG. 15 is considered, in which a wiring (conductive layer 25) intersecting the extending direction of the bit line BL is used for coupling the bit line BL and the interconnect BLI. The pitch of such a circuit pattern needs to be narrowed, for example, as the pitch of the bit line BL becomes narrower.

The region where the contact pads of the conductive layer 25 are arranged inevitably widens in accordance with a decrease in the pitch of the circuit pattern or an increase in the number of wirings. Therefore, the area of the region where the contact pads are arranged can be a cause of an increase in the chip size.

On the other hand, the semiconductor memory device 1 of the first embodiment includes a plurality of conductive layers 25 that are formed by executing a sidewall process twice. The pad portions PP of the plurality of conductive layers 25 are arranged in a plurality of stages (two stages). Compared with the pad portions PP arranged in one stage, the pad portions PP arranged in two stages can suppress the X-direction width of the region in which the contact pads are arranged. Thus, the semiconductor memory device 1 of the first embodiment can improve the arrangement efficiency of the circuit pattern and can therefore suppress the chip area of the semiconductor memory device 1. Accordingly, the semiconductor memory device 1 of the first embodiment enables suppression of the manufacturing cost of the semiconductor device.

In the method of manufacturing the semiconductor memory device 1 of the first embodiment, a continuous resist pattern PEP2 is formed after a sidewall SW1 is formed. The formation of the continuous resist pattern PEP2 can reduce the performance requirements of an exposure apparatus. Therefore, in the method of manufacturing the semiconductor memory device 1 of the first embodiment, an exposure device of a lower grade can be used in the step of forming the resist pattern PEP2. Therefore, the semiconductor memory device 1 of the first embodiment enables reduction of the cost required for the exposure process (lithography step) and enables suppression of the manufacturing cost of the semiconductor device.

[2] Second Embodiment

In the semiconductor memory device 1 of the second embodiment, four-stage pad regions PR are formed by a manufacturing method similar to that of the first embodiment, and a plurality of pad portions PP are arranged in each of the four-stage pad regions PR. A description will be given of the points in which the semiconductor memory device 1 of the second embodiment differs from that of the first embodiment.

[2-1] Planar Layout of Interconnect Layer M1 in Memory Region MR

Figure 32:
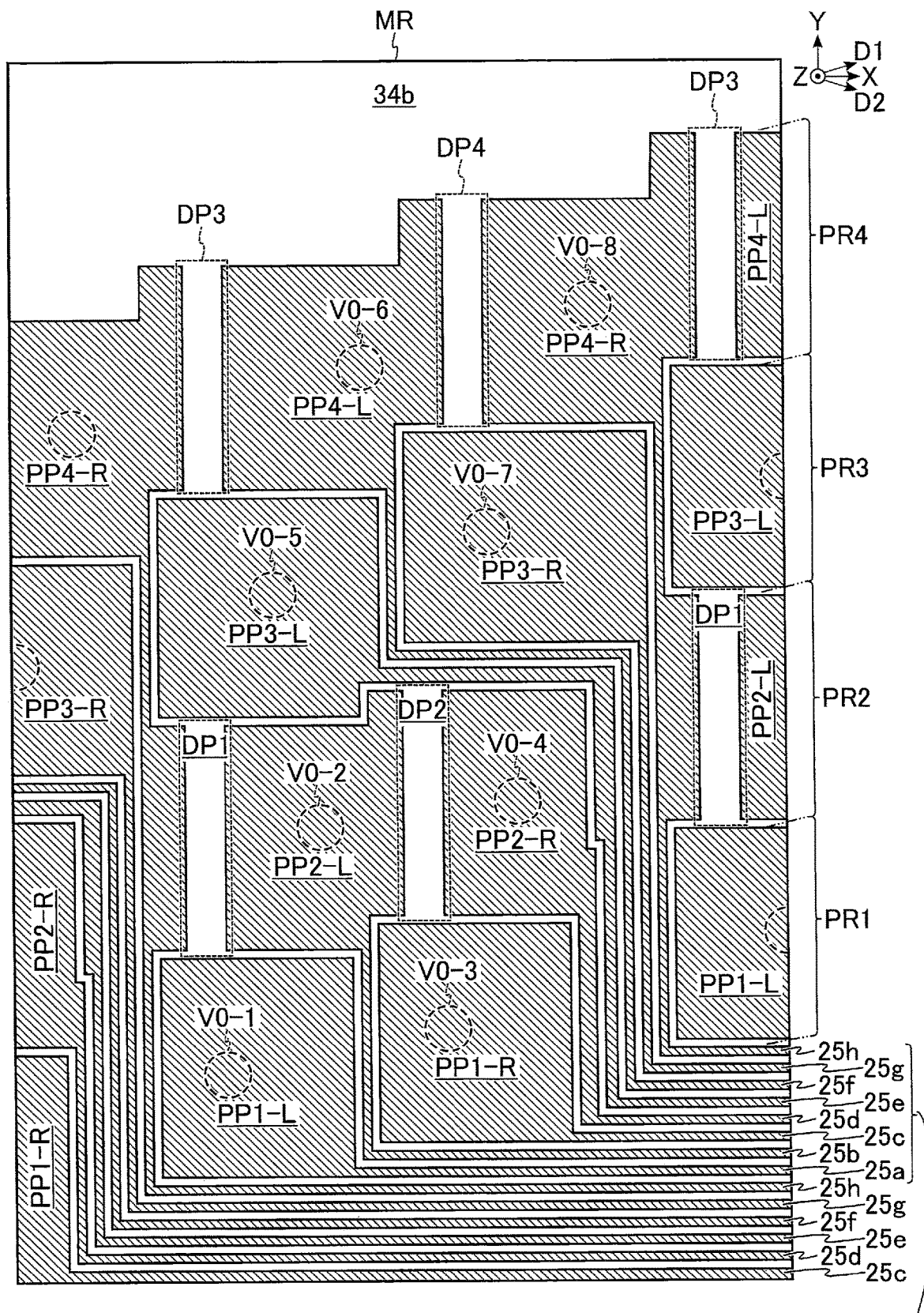
FIG. 32 is a plan view showing an example of a detailed planar layout in which the interconnect layer M1 is provided in the memory region of the memory cell array of a semiconductor memory device according to the second embodiment.

FIG. 32 is a plan view showing an example of a detailed planar layout in which the interconnect layer M1 is provided in the memory region MR of the memory cell array 10 of the semiconductor memory device 1 of the second embodiment. FIG. 32 shows part of the memory region MR and depicts a detailed planar layout of a plurality of conductive layers 25 electrically coupled to a plurality of bit lines BL in the second embodiment. An insulating layer 34b is provided in the white portion of the region shown in FIG. 32.

As shown in FIG. 32, in the second embodiment, a plurality of conductive layers 25 are classified into groups GR each including eight conductive layers 25a, 25b, 25c, 25d, 25e, 25f, 25g and 25h whose portions HL are arranged in order in the Y direction. That is, in the memory region MR, the portion HL of the conductive layer 25a, the portion HL of the conductive layer 25b, the portion HL of the conductive layer 25c, the portion HL of the conductive layer 25d, the portion HL of the conductive layer 25e, the portion HL of the conductive layer 25f, the portion HL of the conductive layer 25g, and the portion HL of the conductive layer 25h are repeatedly arranged in the Y direction.

The structures of the conductive layers 25a, 25b, 25c and 25d of each group GR are similar to those of the first embodiment. The positional relationships between the conductive layers 25e, 25f, 25g and 25h are similar to those between the conductive layers 25a, 25b, 25c and 25d.

The portion HL of the conductive layer 25e is adjacent to the portion HL of the conductive layer 25d of the same group GR in the Y direction, with an insulating layer 34b interposed. The conductive layer 25e includes a pad portion PP3-L. The pad portion PP3-L includes a portion that is adjacent to the pad portion PP2-L of the conductive layer 25b in the Y direction, with an insulating layer 34b interposed. Further, the conductive layer 25e includes a portion extending in the X direction along the conductive layer 25d and a portion extending in the Y direction along the conductive layer 25d. In the conductive layer 25e, the portion HL and the pad portion PP3-L are coupled to each other via the portion provided along the conductive layer 25d.

The portion HL of the conductive layer 25f is adjacent to the portion HL of the conductive layer 25e of the same group GR in the Y direction, with an insulating layer 34b interposed. The conductive layer 25f includes a pad portion PP4-L. The pad portion PP4-L includes a portion that is adjacent to the pad portion PP3-L of the conductive layer 25e in the Y direction, with an insulating layer 34b interposed. Further, the conductive layer 25f includes a portion extending in the X direction along the conductive layer 25e and a portion extending in the Y direction along the conductive layer 25e. In the conductive layer 25f, the portion HL and the pad portion PP4-L are coupled to each other via the portion provided along the conductive layer 25e.

The portion HL of the conductive layer 25g is adjacent to the portion HL of the conductive layer 25f of the same group GR in the Y direction, with an insulating layer 34b interposed. The conductive layer 25g includes a pad portion PP3-R. The pad portion PP3-R includes a portion that is adjacent to the pad portion PP2-R of the conductive layer 25d in the Y direction, with an insulating layer 34b and conductive layers 25e and 35f interposed, and a portion that is adjacent to the pad portion PP3-L of the conductive layer 25e in the X direction, with an insulating layer 34b and a conductive layer 25f interposed. Further, the conductive layer 25g includes a portion extending in the Y direction along the conductive layer 25f. In the conductive layer 25g, the portion HL and the pad portion PP3-R are coupled to each other via the portion provided along the conductive layer 25f.

The portion HL of the conductive layer 25h is adjacent to the portion HL of the conductive layer 25g of the same group GR in the Y direction, with an insulating layer 34b interposed. The conductive layer 25h includes a pad portion PP4-R. The pad portion PP4-R includes a portion that is adjacent to the pad portion PP4-L of the conductive layer 25f in the X direction, with an insulating layer 34b interposed, and a portion that is adjacent to the pad portion PP3-R of the conductive layer 25g in the Y direction, with an insulating layer 34b interposed. Further, the conductive layer 25h includes a portion extending in the Y direction along the conductive layer 25g. In the conductive layer 25h, the portion HL and the pad portion PP4-R are coupled to each other via the portion provided along the conductive layer 25g.

The pad portions PP3_L and PP3_R are alternately arranged in the pad region PR3. The pad region PR3 is a region provided along the D1 direction and adjacent to the pad region PR2 in the Y direction on the opposite side of the pad region PR1. The pad region PR3 includes pad portions PP3-L and PP3-R of each group GR.

The pad portions PP4_L and PP4_R are alternately arranged in the pad region PR4. The pad region PR4 is a region provided along the D1 direction and adjacent to the pad region PR3 in the Y direction on the opposite side of the pad region PR2. The pad region PR4 includes pad portions PP4-L and PP4-R of each group GR.

In each group GR, the pad portions PP1-L, PP2-L, PP3-L, and PP4-L are arranged side by side along the Y direction. In each group GR, the pad portions PP1-R, PP2-R, PP3-R, and PP4-R are arranged side by side along the Y direction. In other words, in the pad regions PR1 to PR4, the set consisting of pad portions PP1-L, PP2-L, PP3-L and PP4-L and the set consisting of the pad portions PP1-R, PP2-R, PP3-R and PP4-R are arranged alternately in the D1 direction. Further, the plurality of pad portions PP are arranged in four rows and in a staggered fashion.

A contact V0-5 is coupled to the pad portion PP3-L of the conductive layer 25e. A contact V0-6 is coupled to the pad portion PP4-L of the conductive layer 25f. A contact V0-7 is coupled to the pad portion PP3-R of the conductive layer 25g. A contact V0-8 is coupled to the pad portion PP4-R of the conductive layer 25h. In the second embodiment, each of the contacts V0-4 to V0-8 is coupled to the associated bit line BL. The contacts V0-4 to V0-8 are displaced from each other in the X direction and can therefore be coupled to different bit lines BL.

In the insulating layer 34b of the second embodiment, a dividing portion DP is provided between the pad portions PP2-L and PP2-R adjacent to each other in the same group GR, between the pad portion PP2-L of a certain group GR and the conductive layer 25h of the group GR adjacent to that group GR, between the adjacent pad portions PP4-L and PP4-R, and between the pad portion PP4-L of a certain group GR and the conductive layer 25h of the group GR adjacent to that group GR. In the description below, the dividing portion DP that is in contact with the left end portion LP of the pad portion PP2-L will be referred to as "dividing portion DP1". The dividing portion DP that is in contact with the left end portion LP of the pad portion PP2-R will be referred to as "dividing portion DP2". The dividing portion DP that is in contact with the left end portion LP of the pad portion PP4-L will be referred to as "dividing portion DP3". The dividing portion DP that is in contact with the left end portion LP of the pad portion PP4-R will be referred to as "dividing portion DP4".

The dividing portion DP1 of the second embodiment extends along the Y direction, and couples the portion of the insulating layer 34b in contact with the upper end portion TP of the pad portion PP1-L to the portion of the insulating layer 34b in contact with the lower end portion BP of the pad portion PP3-L. In the insulating layer 34b, the dividing portion DP1, the portions surrounding the conductive layer 25a and the portions surrounding the conductive layer 25e are continuously provided.

The dividing portion DP2 of the second embodiment extends along the Y direction, and couples the portion of the insulating layer 34b that is in contact with the upper end portion TP of the pad portion PP1-R to the portion of the conductive layer 25e that extends from the pad portion PP3-L in the X direction and that is in contact with the portion of the insulating layer 34b on the side of the pad portion. PP1-R. In the insulating layer 34b, the dividing portion DP2, the portions surrounding the conductive layer 25c, and portions surrounding the conductive layer 25e are continuously provided.

The dividing portion DP3 is provided extending from the upper end portion TP of the pad portion PP3-L along the Y direction, and is continuous with the other dividing portions DP via the upper side of the pad region PR4. In the insulating layer 34b, the dividing portion DP3 and the portions surrounding the conductive layer 25e are continuously provided.

The dividing portion DP4 is provided extending from the upper end portion TP of the pad portion PP3-R along the Y direction, and is continuous with the other dividing portions DP via the upper side of the pad region PR4. In the insulating layer 34b, the dividing portion DP4 and the portions surrounding the conductive layer 25g are continuously provided.

That is, in the insulating layer 34b of the second embodiment, the dividing portions DP1, DP2, DP3, and DP4 are continuously provided. The dividing portion DP of the second embodiment may divide part of the conductive layer 25, as in the first embodiment.

In the semiconductor memory device 1 of the second embodiment, the insulating layer 34b includes portions of substantially the same dimensions, based on the formation method of the structure of the interconnect layer M1, as in the first embodiment. For example, the insulating layer 34b has substantially the same width at the portions surrounding any of the conductive layers 25a, 25b, 25c, 25d, 25e, 25f, 25g and 25h and provided between the conductive layers 25, except at the portions corresponding to the dividing portions DP.

As described above, the semiconductor memory device 1 of the second embodiment has a structure in which a plurality of pad portions PP arranged side by side in the D1 direction are provided for each of the two-stage pad regions PR1, PR2, PR3 and PR4. The other structures of the semiconductor memory device 1 of the second embodiment are similar to those of the first embodiment.

[2-2] Manufacturing Method

The series of steps of the manufacturing method of the semiconductor memory device 1 of the second embodiment is similar to those illustrated in FIG. 17. The method of manufacturing the semiconductor memory device 1 of the second embodiment differs from the method of the first embodiment mainly in terms of the shape of the formed patterns. FIGS. 33 to 39 are plan views showing an example of a planar layout in which the structure of an interconnect layer M1 is formed in the memory region MR of the memory cell array 10 of the semiconductor memory device 1 of the second embodiment. In the description below, a method of forming interconnects (conductive layers 25) in the interconnect layer M1, which method is involved in the method of manufacturing the semiconductor memory device 1 of the second embodiment, will be described with reference to FIG. 17.

First, an insulating layer 34b, a sacrificial layer 70, and a sacrificial layer 80 are stacked (S11), as in the first embodiment.

Figure 33:
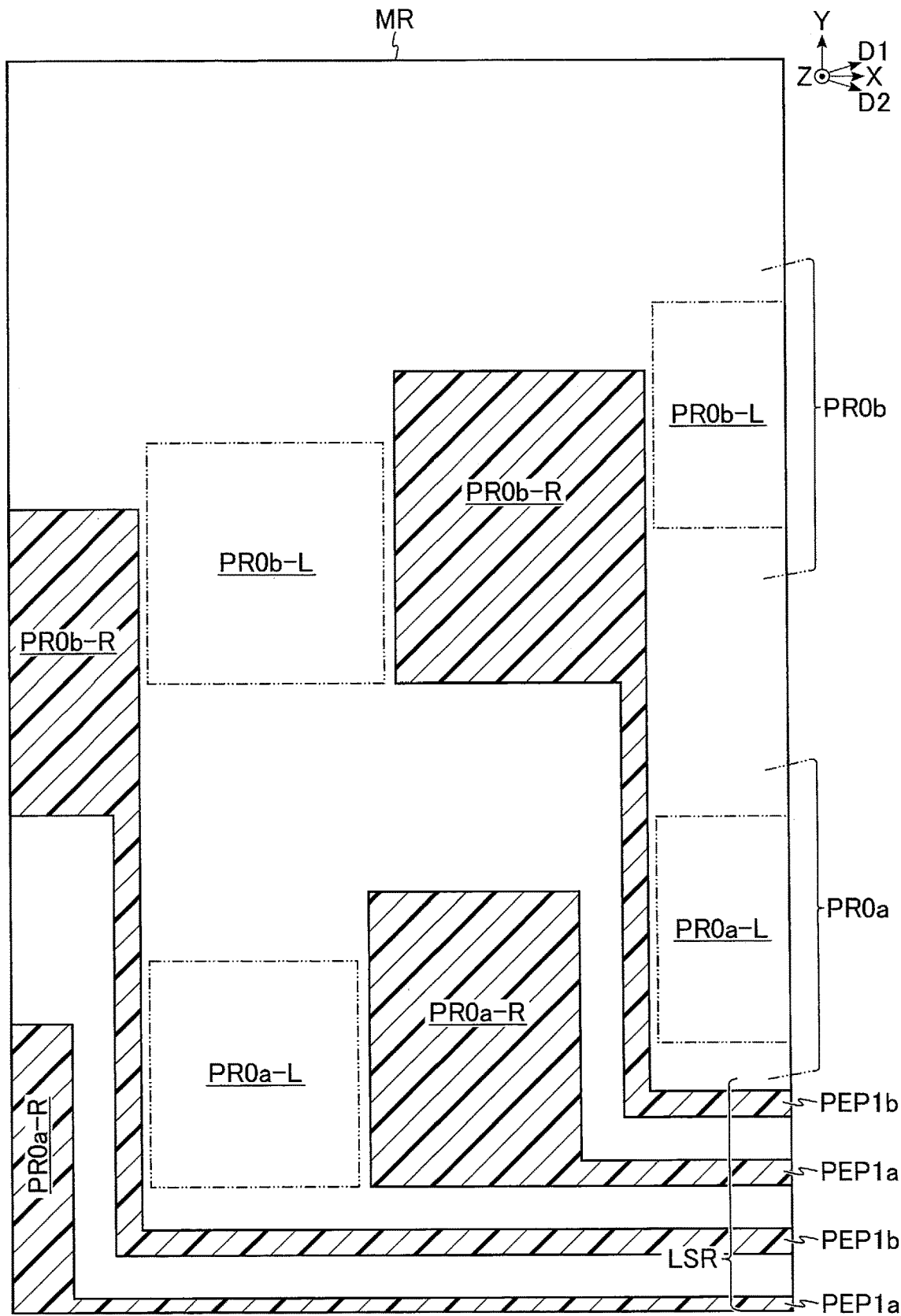
FIG. 33 is a plan view showing an example of a planar layout in which the structure of an interconnect layer M1 is formed in the memory region of the memory cell array of the semiconductor memory device of the second embodiment.

Next, as shown in FIG. 33, resist patterns PEP1a and PEP1b having portions covering regions PR0a and PR0b are formed (S12). The region PR0a includes regions PR0a-L and PR0a-R that are alternately arranged along the D1 direction in the illustrated region. The region PR0b includes regions PR0b-L and PR0b-R that are arranged farther from the region LSR than the region PR0a and alternately arranged along the D1 direction. The resist patterns PEP1a and PEP1b have portions covering the regions PR0a-R and PR0b-R, respectively.

Figure 34:
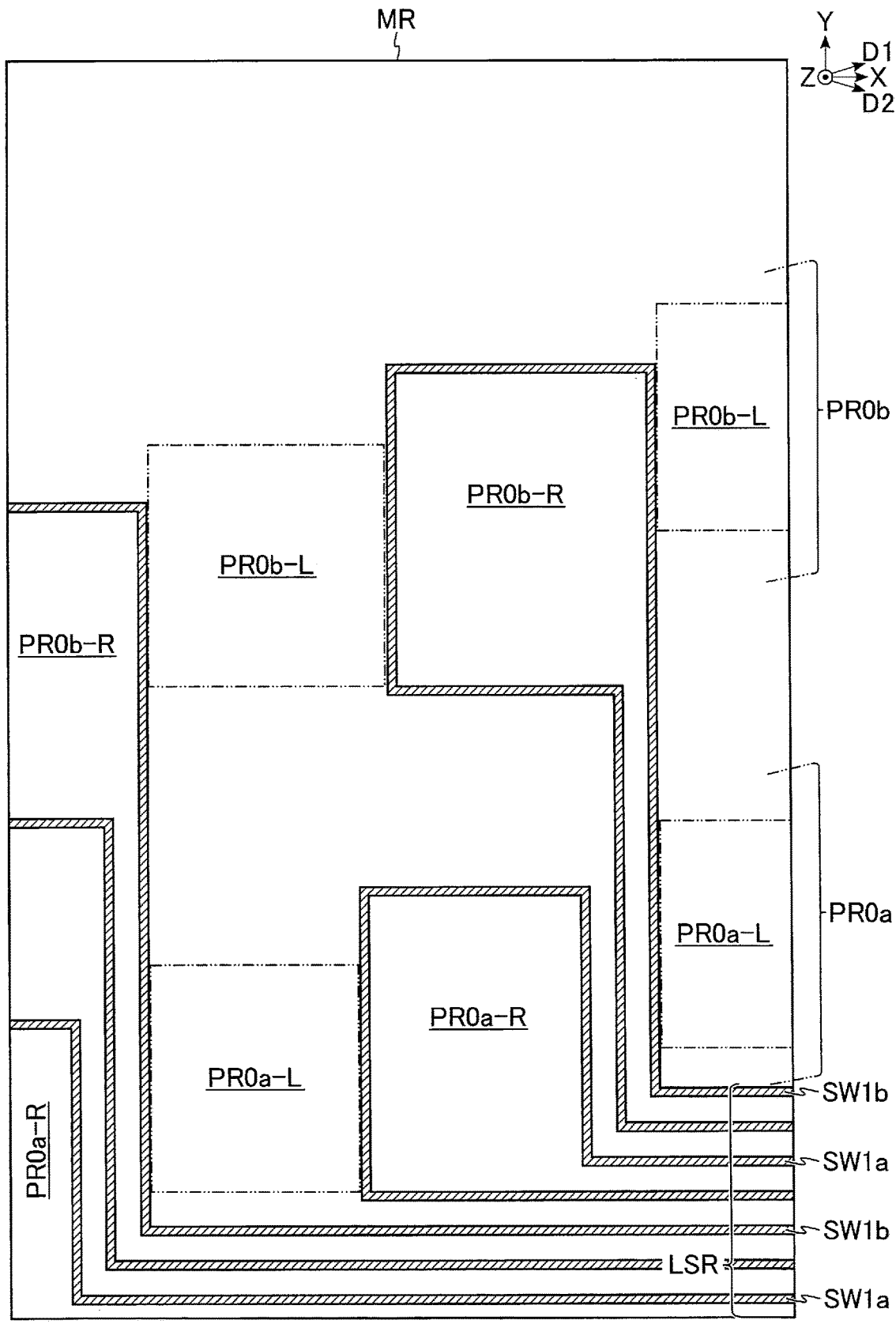
FIG. 34 is a plan view showing an example of a planar layout in which the structure of an interconnect layer M1 is formed in the memory region of the memory cell array of the semiconductor memory device of the second embodiment.

Next, as shown in FIG. 34, sidewalls SW1a and SW1b of the resist patterns PEP1a and PEP1b are formed (S13). The sidewall SW1a is formed based on the resist pattern PEP1a and surrounds the region PR0a-R. The sidewall SW1b is formed based on the resist pattern PEP1b and surrounds the region PR0b-R.

Next, as shown in FIG. 35, resist patterns PEP2a and PEP2b are formed (S14). The resist pattern PEP2a is provided so as to cover the region where the pad portions PP2-L and PP2-R are formed, separates the regions PR0a-L and PR0b-L from each other, and covers the loop end portion LE of the sidewall SW1a. The resist pattern PEP2b is provided so as to cover the region where the pad portions PP4-L and PP4-R are formed, overlaps part of the region PR0b, and is continuous between the loop end portions LE of the adjacent sidewall SW1b.

Next, the sacrificial layer 80 is processed by an etching process that uses the sidewall SW1 and the resist pattern PEP2 as masks, and a hard mask HM1 is formed thereby (S15). The planar shape of the hard mask HM1 corresponds to a shape in which the respective planar shapes of the resist patterns PEP2a and PEP2b and the sidewalls SW1a and SW1b are combined.

Next, the sidewall SW1 and the resist pattern PEP2 are removed (S16).

Next, as shown in FIG. 36, sidewalls SW2a, SW2b, SW2c and SW2d of the hard mask HM1 are formed (S17). The sidewall SW2a formed in the portion surrounded by the sidewalls SW1a and SW1b and the resist pattern PEP2a surrounds the pad region PR1-L when viewed from above. The sidewall SW2b formed in the portion surrounded by the sidewall SW1a and the resist pattern PEP2a surrounds the pad region PR1-R when viewed from above. The sidewall SW2c formed in the portion surrounded by the sidewalls SW1a and SW1b and the resist patterns PEP2a and PEP2b surrounds the pad region PR3-L when viewed from above. The sidewall SW2d formed in the portion surrounded by the sidewall SW1b and the resist pattern PEP2b surrounds the pad region PR3-R when viewed from above. The sidewall SW2z that is formed on the side surface portion on the opposite side of the region LSR in the resist pattern PEP2b is continuously formed along the pad region PR4. In the description below, the portion where the sacrificial layer 70 is continuously exposed in the region PR4 will be referred to as a region PR4-W. The portion of the region PR2 sandwiched between the sidewall SW2a and SW2b and the sidewall SW2c in the Y direction will be referred to as a region PR2-D. The regions PR2-D are arranged side by side in the D1 direction in the region PR2.

Figure 37:
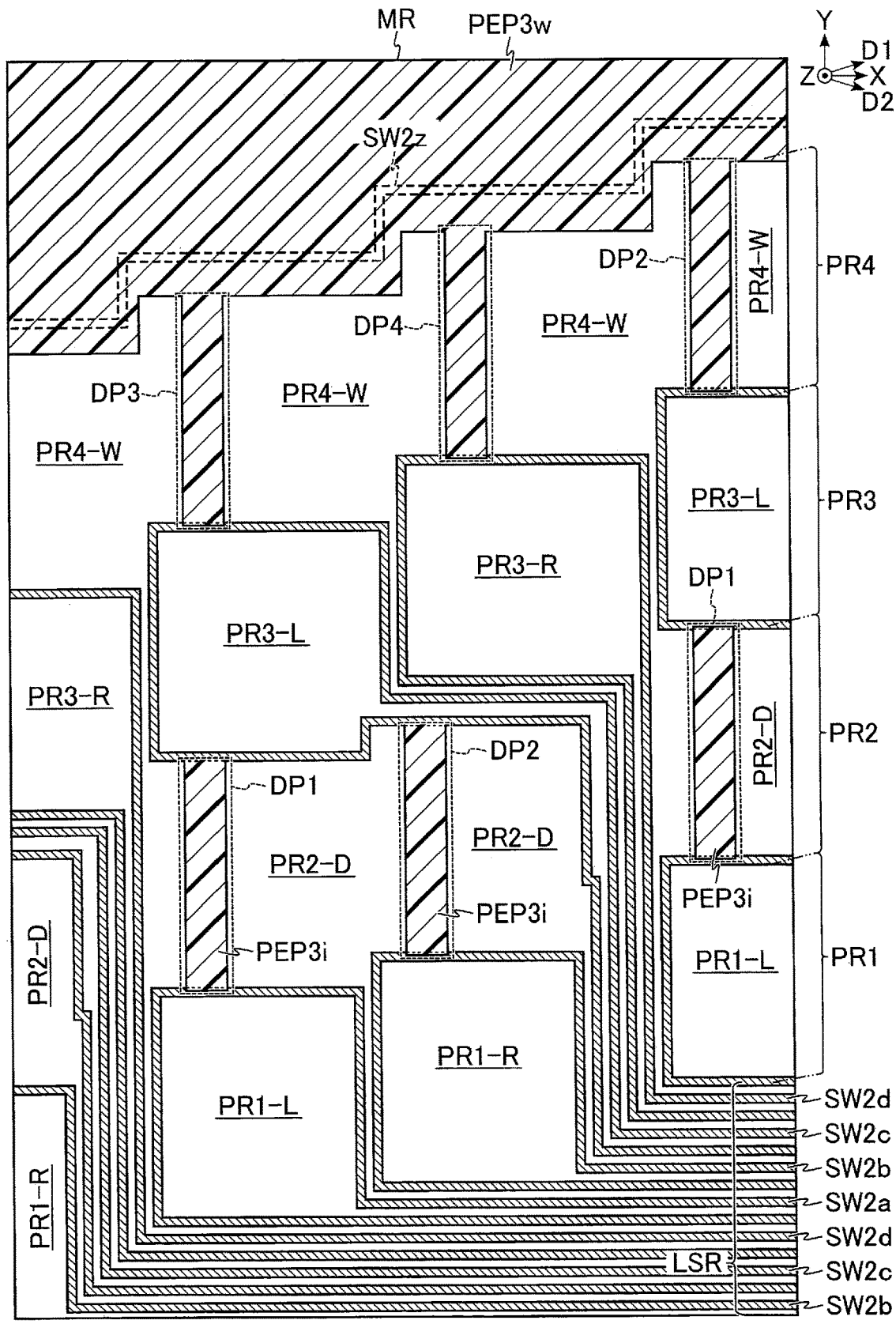
FIG. 37 is a plan view showing an example of a planar layout in which the structure of the interconnect layer M1 is formed in the memory region of the memory cell array of the semiconductor memory device of the second embodiment.

Next, as shown in FIG. 37, a resist pattern PEP3 is formed (S18). The resist pattern PEP3 has portions that cover the sidewall SW2z and are continuously provided along the region PR4. Further, the resist pattern PEP3 has portions that cover the regions corresponding to the dividing portions DP1, DP2, DP3 and DP4. Thus, the regions PR2-D are partitioned by the dividing portions DP1 and DP2. The regions PR4-W are partitioned by the dividing portions DP3 and DP4.

Next, the sacrificial layer 70 is processed by an etching process that uses the sidewall SW2 and the resist pattern PEP3 as masks, and a hard mask HM2 is formed thereby (S19).

Next, the sidewall SW2 and the resist pattern PEP3 are removed (S20).

Figure 38:
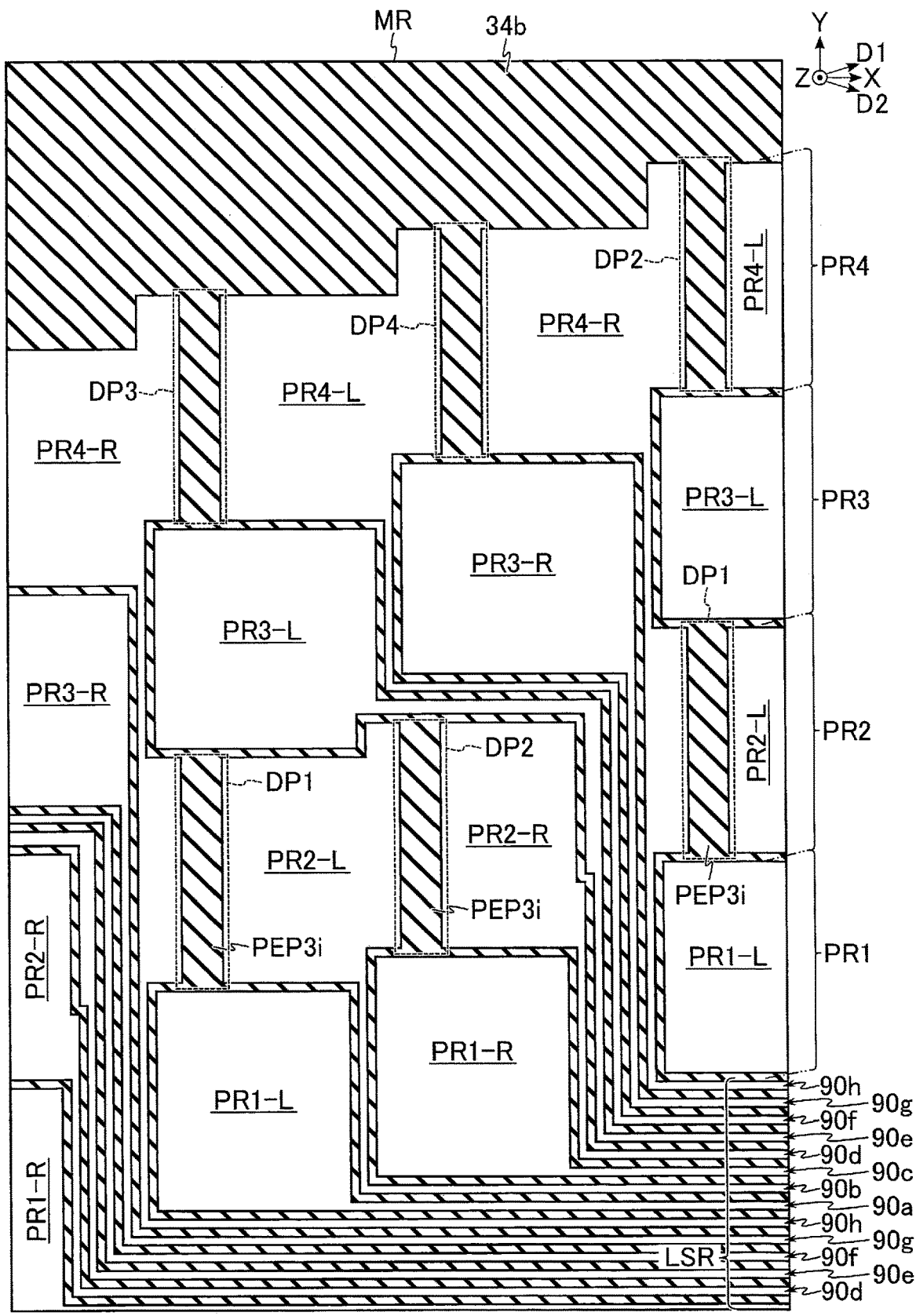
FIG. 38 is a plan view showing an example of a planar layout in which the structure of the interconnect layer M1 is formed in the memory region of the memory cell array of the semiconductor memory device of the second embodiment.

Next, as shown in FIG. 38, the insulating layer 34b is processed by an etching process that uses the hard mask HM2 as a mask, and a plurality of trench portions 90 are formed thereby (S21). The plurality of trench portions 90 are classified into groups each including eight trench portions 90a, 90b, 90c, 90d, 90e, 90f, 90g and 90h arranged in order in the Y direction. The trench portion 90a includes a pad region PR1-L. The trench portion 90b includes a pad region PR2-L. The trench portion 90c includes a pad region PR1-R. The trench portion 90d includes a pad region PR2-R. The trench portion 90e includes a pad region PR3-L. The trench portion 90f includes a pad region PR4-L. The trench portion 90g includes a pad region PR3-R. The trench portion 90h includes a pad region PR4-R. The pad regions PR2-L and PR2-R correspond to the regions PR2-D partitioned by the dividing portions DP1 and DP2. The pad regions PR4-L and PR4-R correspond to the regions PR4-W partitioned by the dividing portions DP3 and DP4.

Figure 39:
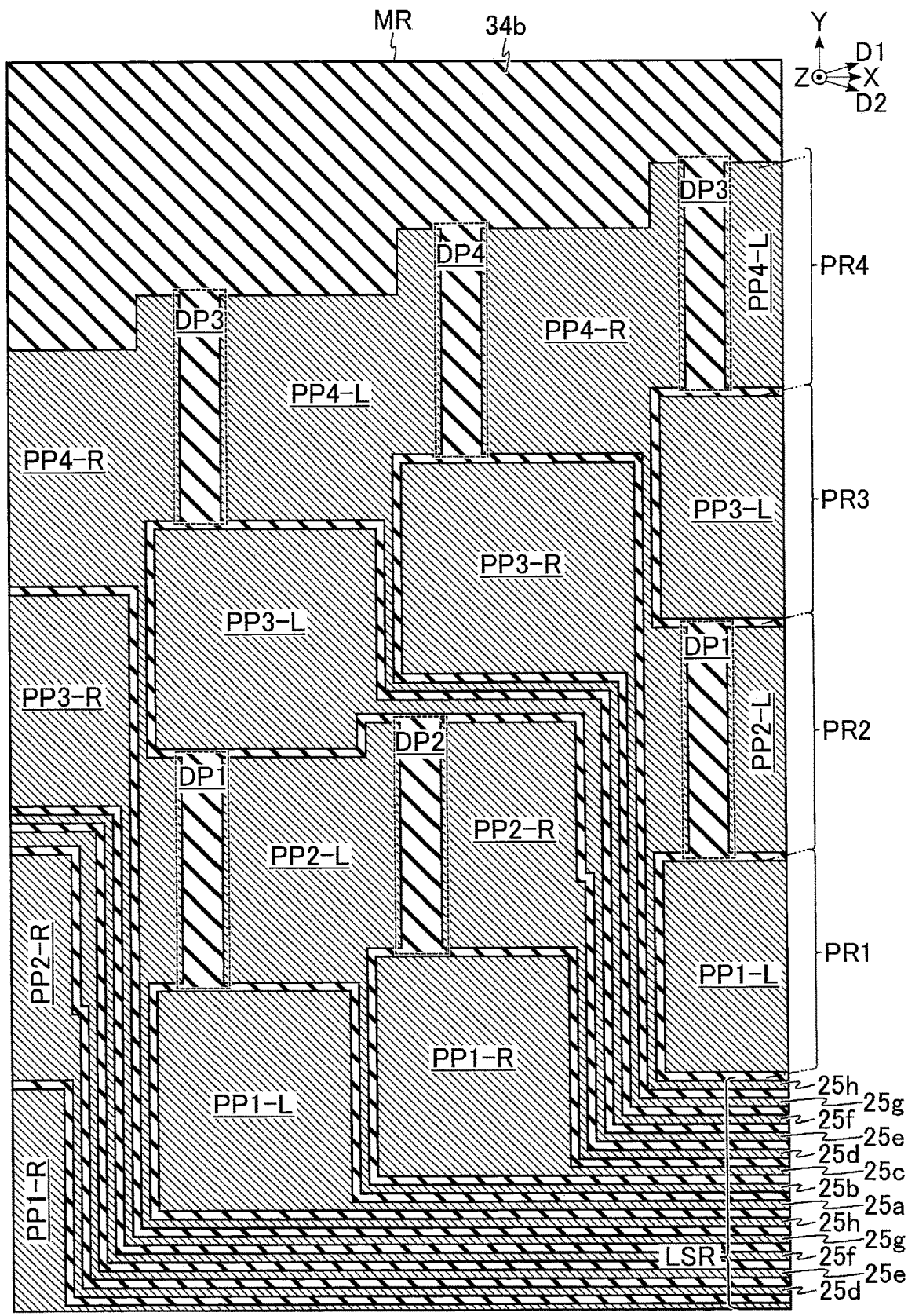
FIG. 39 is a plan view showing an example of a planar layout in which the structure of the interconnect layer M1 is formed in the memory region of the memory cell array of the semiconductor memory device of the second embodiment.

Next, as shown in FIG. 39, a conductor is formed in each of the plurality of trench portions 90 (S22). The conductors provided in the trench portions 90a, 90b, 90c, 90d, 90e, 90f, 90g and 90h correspond to the conductive layers 25a, 25b, 25c, 25d, 25e, 25f, 25g and 25h, respectively. In the other aspects, the manufacturing method of the semiconductor memory device 1 of the second embodiment is similar to that of the first embodiment.

[2-3] Advantages of Second Embodiment

The semiconductor memory device 1 of the second embodiment includes a plurality of conductive layers 25 that are formed by executing a sidewall process twice. The pad portions PP of the plurality of conductive layers 25 are arranged in four stages. Compared with the pad portions PP arranged in two stages, the pad portions PP arranged in four stages can suppress the X-direction width of the region in which the contact pads are arranged. Thus, the semiconductor memory device 1 of the second embodiment can improve the arrangement efficiency of the circuit pattern more remarkably than that of the first embodiment and can therefore suppress the chip area of the semiconductor memory device 1. Accordingly, the semiconductor memory device 1 of the second embodiment enables suppression of the manufacturing cost of the semiconductor device.

In the semiconductor memory device 1 of the second embodiment, the order in which the eight conductive layers and eight bit lines BL included in each group GR are coupled is less restricted than in the first embodiment. Specifically, in the second embodiment, the adjacent bit lines BL do not necessarily have to be coupled to the adjacent conductive layer 25. Thus, the semiconductor memory device 1 of the second embodiment can further optimize the wiring layout of the plurality of interconnect layers, and can suppress the area of the circuit pattern.

[3] Line Widths of Line-And-Space Pattern

Figure 40:
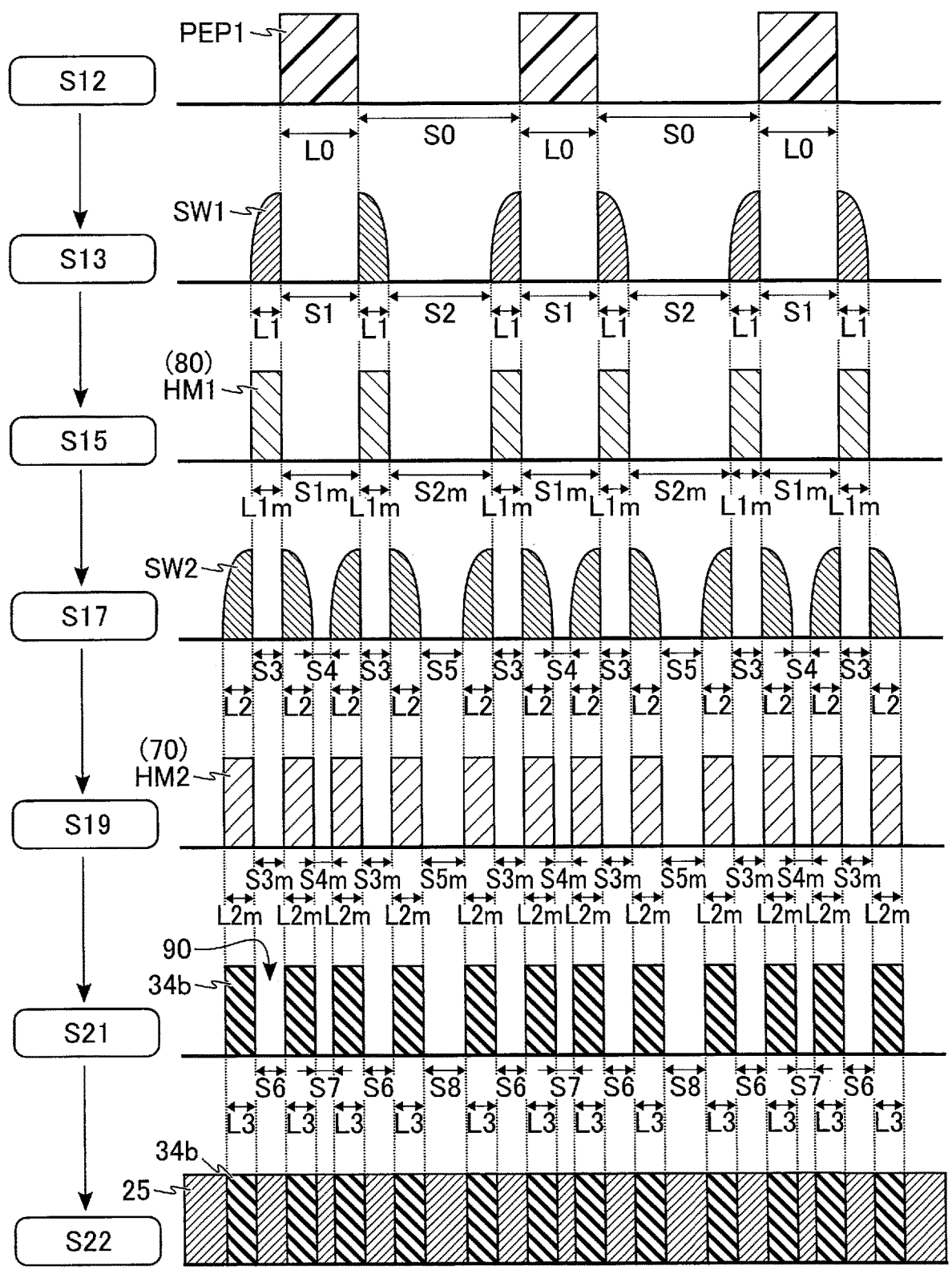
FIG. 40 is a schematic diagram for illustrating line widths of a line-and-space pattern.

FIG. 40 is a schematic diagram for illustrating line widths of a line-and-space pattern. FIG. 40 also illustrates how the line widths correspond to the steps of S12 to S22 shown in FIG. 17. In what follows, a description will be given with reference to FIG. 40 as to how the line widths and space widths of a line pattern tend to be when a sidewall process is executed twice.

The line-and-space pattern of the resist pattern PEP1 formed by the first exposure process in step S12 has, for example, a line width L0 and a space width S0.

The sidewall SW1 formed by the first sidewall process in step S13 has, for example, a line width L1. The dimension of the line width L1 is based on the film thickness of the first material formed in step S13. The line-and-space pattern formed by the sidewall SW1 includes a portion having a space width S1 based on the line width of the resist pattern PEP1 used as the core material, and a portion having a space width S2 based on the distance between the adjacent core materials and the line width L1 of the sidewall SW1. The space widths S1 and S2 may differ due to the influence of process variations or the like.

The line-and-space pattern of the hard mask HM1 (sacrificial layer 80) formed in step S15 has, for example, a line width L1m. The dimension of the line width L1m is based on the line width L1 of the sidewall SW1 used as a mask during the etching process. Further, the line-and-space pattern formed by the hard mask HM1 includes a portion having a space width S1m based on the space width S1 and a portion having a space width S2m based on the space width S2.

The sidewall SW2 formed by the second sidewall process in step S17 has, for example, a line width L2. The dimension of the line width L2 is based on the film thickness of the second material formed in step S17. The line-and-space pattern formed by the sidewall SW2 includes a portion having a space width S3 based on the line width of the hard mask HM1 used as the core material, and a portion having a space width S4 or S5 based on the distance between the adjacent core materials and the line width L2 of the sidewall SW2. The space width S4 corresponds to the space formed in the portion where the resist pattern PEP1 was formed. The space width S5 corresponds to the space formed in the portion where the resist pattern PEP1 was not formed. The space widths S3 to S5 may differ due to the influence of process variations or the like.

The line-and-space pattern of the hard mask HM2 (sacrificial layer 70) formed in step S19 has, for example, a line width L2m. The dimension of the line width L2m is based on the line width L2 of the sidewall SW2 used as a mask during the etching process. Further, the line-and-space pattern formed by the hard mask HM2 includes a portion having a space width S3m based on the space width S3, a portion having a space width S4m based on the space width S4 and a portion having a space width S5m based on the space width S5.

The line-and-space pattern of the insulating layer 34b including the trench portion 90 formed in step S21 has, for example, a line width L3. The dimension of the line width L3 is based on the line width L2m of the hard mask HM2 used as a mask during the etching process. Further, the line-and-space pattern formed by the insulating layer 34b includes a portion having a space width S6 based on the space width S3m, a portion having a space width S7 based on the space width S4m and a portion having a space width S8 based on the space width Sym.

The wiring widths of the conductive layers 25 formed in step S21 are based on the dimensions of the trench portion 90. Therefore, the wiring widths of the conductive layers 25 (for example, the conductive layers 25b and 25d) formed in the trench portion 90 of the space width S6 are substantially equal. Similarly, the wiring widths of the conductive layers 25 (for example, the conductive layer 25a) formed in the trench portion 90 of the space width S7 are substantially equal. The wiring widths of the conductive layers 25 (for example, the conductive layer 25c) formed in the trench portion 90 of the space width S8 are substantially equal. Further, the widths of the insulating layers 34b between the adjacent conductive layers 25 in the region LSR are substantially equal because they are based on the dimensions determined by the processing in step S21.

As described above, the line widths and space widths of the line pattern formed by executing a sidewall process twice have a certain tendency in accordance with the process variations. Based on such a dimensional tendency, it can be specified that wirings are formed by executing a sidewall process twice.

[4] Others

By application of the manufacturing method of the semiconductor memory device 1 described in each of the above embodiments, the semiconductor memory device 1 can be designed to have a structure in which a plurality of pad portions PP arranged along the D1 direction are provided in each of the pad regions PR of 2×k stages (k is an integer of 1 or more).

Such a semiconductor memory device 1 includes a plurality of interconnects (for example, conductive layers 25) each of which includes a portion HL extending in the X direction and a pad portion PP coupled to the end of the portion HL, and which are provided apart from each other. A contact is coupled to the pad portion of each of the plurality of interconnects. The plurality of interconnects are classified into groups CR each including (4×k (k is an integer of 1 or more)) interconnects in which the respective portions HL are arranged in order in the Y direction.

The pad portion PP (for example, the pad portion PP1_L) of the (4×k−3)th interconnect and the pad portion PP (for example, the pad portion PP2_L) of the (4×k−2)th interconnect have portions opposed to each other in the Y direction. The pad portion PP of the (4×k−3)th interconnect and the pad portion PP (for example, the pad portion PP1_R) of the (4×k−1)th interconnect have portions opposed to each other in the X direction, with the (4×k−2)th interconnect interposed. The pad portion PP of the (4×k−2)th interconnect and the pad portion PP (for example, the pad portion PP2_R) of the (4×k)th interconnect have portions opposed to each other in the X direction. The pad portion PP of the (4×k−1)th interconnect and the pad portion PP of the (4×k)th interconnect have portions opposed to each other in the Y direction.

Where k is 2 or more, the pad portion (for example, the pad portion PP2-L of (4×(K−1)−2)th interconnect (K is an integer not less than 2 and not more than k) included among the (4×k) interconnects of the same group GR and the pad portion (for example, the pad portion PP3-L) of the (4×K−3)th interconnect also included among the (4×k) interconnects have portions opposed to each other in the Y direction. The pad portion (for example, the pad portion PP2-R) of the (4×(K−1))th interconnect and the pad portion (for example, the pad portion PP3-R) of the (4×K−1)th interconnect have portions opposed each other in the Y direction, with the (4×K−3)th interconnect and the (4×K−2)th interconnect interposed.

In each group GR, the pad portion PP of the (4×k−3)th interconnect and the pad portion PP of the (4×k−1)th interconnect are arranged side by side along the Y direction. Similarly, in each group GR, the pad portion PP of the (4×k−2)th interconnect and the pad portion PP of the (4×k)th interconnect are arranged side by side along the Y direction. In other words, in the (2×k)-stage pad region PR, the pair consisting of the pad portion PP of the (4×k−3)th interconnect and the pad portion PP of the (4×k−2)th interconnect and the pair consisting of the pad portion PP of the (4×k−1) interconnect and the pad portion PP of the (4×k)th interconnect are arranged alternately in the D1 direction, for example.

According to the manufacturing method of the semiconductor memory device 1 of each of the above embodiments, the Y-direction width of the portion HL of the (4×k−2)th interconnect of each group GR is substantially equal to the Y-direction width of the portion HL of the (4×k)th interconnect of each group GR, differs from the Y-direction width of the portion HL of the (4×k−3)th interconnect of each group GR, and also differs from the Y-direction width of the portion HL of the (4×k−1)th interconnect of each group GR. The Y-direction width of the portion HL of the (4×k−3)th interconnect of each group GR differs from the Y-direction width of the portion HL of the (4×k−1)th interconnect of each group GR.

The Y-direction widths of the insulating layers provided between the two interconnects which are among the plurality of interconnects and which have portions HL adjacent to each other are substantially the same. The Y-direction distance between the pad portion PP of the (4×k−3)th interconnect and the pad portion PP of the (4×k−2)th interconnect, the Y-direction distance between the pad portion of the (4×k−1)th interconnect and the pad portion PP of the (4×k)th interconnect, the X-direction distance between the pad portion PP the (4×k−3)th interconnect and the portion VL of the (4×k−2)th interconnect, which is between the pad portion PP of (4×k−3)th interconnect and the pad portion PP of the (4×k−1)th interconnect, and the X-direction distance between the pad portion PP of (4×k−1)th interconnect and the portion VL of the (4×k−2)th interconnect are substantially equal to each other.

In connection with the above embodiments, reference was made to the case where each dividing portion DP is linear and extends along the Y direction, but this is not restrictive. It suffices that each dividing portion DP separates at least two adjacent pad portions PP (PP-L and PP-R), and each dividing portion may have a curved portion. In the second embodiment, the dividing portion DP may divide part of the pad portion PP. That is, each pad portion PP may have a portion having a concave shape extending along the dividing portions DP adjacent in the Y direction, regardless of the number of stages of the pad portions PP.

In the above embodiments, reference was made to the example in which the conductive layer 25 has the structure of the pad portion PP, but this is not restrictive. The structure of the pad portion PP may be applied to other interconnects. For example, the structure and arrangement of the pad portion PP described in connection with the above embodiments may be applied to the interconnect (conductive layer 28 or the like) that couples the stacked interconnect and the row decoder module 16 to each other. Further, a device using the interconnect having the structure of the pad portion PP described in connection with the above embodiments is not limited to the semiconductor memory device such as a NAND flash memory. A structure similar to that of the conductive layer 25 described in connection with the above embodiments can be applied to any type of interconnect as long as the interconnect is formed by executing a sidewall process twice.

The manufacturing processes described in connection with the above embodiments are merely an example, and other processes may be inserted between the manufacturing processes described above. For example, a slimming process may be executed for the resist pattern PEP1 between steps S12 and S13. In connection with the above embodiments, reference was made to the case where a positive resist is used as the resist of the exposure process, but this is not restrictive. In the exposure process, each resist pattern PEP described in connection with the above embodiments may be formed using a negative resist.

In the above embodiment, each of the circuit configuration, planar layout, and cross-sectional structure of the semiconductor memory device 1 can be appropriately changed according to the design of the semiconductor memory device 1. For example, in connection with the first embodiment, reference was made to the case where the memory chip is provided on the CMOS chip, but the CMOS chip may be provided on the memory chip. That is, the memory chip may be assigned to the lower wafer LW, and the CMOS chip may be assigned to the upper wafer UW.

In the above embodiments, the semiconductor layer 41 of the memory pillar MP and the source line SL may be coupled via the side surface of the memory pillar MP. The memory pillar MP may have a structure in which two or more pillars are coupled in the Z direction. The memory pillar MP may have a structure in which a pillar corresponding to the select gate line SGD and a pillar corresponding to the word line WL are coupled to each other. A plurality of contacts coupled in the Z direction may be used for coupling the memory pillar MP to the bit line BL, for coupling the contact CC to the conductive layer 27, and for coupling the contact C3 and the conductive layer 66. A conductive layer may be inserted between the coupling portions of the plurality of contacts. This also applies to other contacts. The numbers of interconnect layers and contacts provided in the semiconductor memory device 1 can be appropriately changed in accordance with the circuit design of the semiconductor memory device 1.

The drawings referred to in connection with the above embodiments show a case where the memory pillars MP have the same diameter as viewed in the Z direction, but this is not restrictive. The memory pillars MP may have a tapered shape, a reverse tapered shape or a bowing shape. Similarly, each of the slits SLT and SHE may have a tapered shape, a reverse tapered shape or a bowing shape. Further, each contact may have a tapered shape, a reverse tapered shape or a bowing shape. The cross-sectional structure of each of the memory pillar MP and the contacts CC and C3 may be circular or elliptical.

In the present specification, the term "coupling" means that elements are electrically coupled, and does not exclude the case where another element is interposed in between. In addition, "electrical coupling" may use an insulator as long as the insulator does not affect the proper operation accomplished by the electrical coupling. The "columnar" indicates that the structure is provided in a hole formed in the manufacturing process of the semiconductor memory device 1. The "diameter" indicates the inner diameter of a hole or the like in a cross section parallel to the surface of the semiconductor substrate. "Width" indicates, for example, the width of a component as viewed in the X or Y direction. The "semiconductor layer" may be referred to as a "conductive layer".

As used herein, the "region" may be regarded as the configuration included by the semiconductor substrate SUB2. For example, where the semiconductor substrate SUB2 is so defined as to include the memory region MR and the hookup region HR, the memory region MR and the hookup region HR are associated with different regions above the semiconductor substrate SUB2, respectively. The "height" corresponds, for example, to the Z-direction distance between a measurement-target component and the semiconductor substrate SUB2. As a reference of "height", a structure other than the semiconductor substrate SUB2 may be used. "Plane position" indicates the position of a component in a plane layout. "Top (planar) view" corresponds to, for example, what the semiconductor substrate SUB2 looks like when viewed from above.

While certain embodiments have been described, these embodiments have been presented by way of example only, and are not intended to limit the scope of the embodiments. Indeed, the novel embodiments described herein may be embodied in a variety of other forms; furthermore, various omissions, substitutions and changes in the form of the embodiments described herein may be made without departing from the spirit. The accompanying claims and their equivalents are intended to cover such forms or modifications as would fall within the scope and spirit.

The invention claimed is:

1. A semiconductor device comprising:
a first conductor including a first portion and a first pad portion, the first portion extending in a first direction, the first pad portion including a portion extending from an end portion of the first portion in a second direction that intersects the first direction;
a second conductor including a second portion, a third portion and a second pad portion and provided away from the first conductor, the second portion extending in the first direction, the third portion extending in the second direction from an end portion of the second portion, the second pad portion including a portion extending from an end portion of the third portion in the first direction;
a first insulator adjacent to the second pad portion in the first direction;
a first contact coupled to the first pad portion; and
a second contact coupled to the second pad portion, wherein
the first pad portion includes a first sub portion and a second sub portion adjacent to each other in the first direction, each of the first sub portion and the second sub portion includes one end portion and another end portion of the first pad portion, as viewed in the second direction, the first sub portion is adjacent to the second pad portion in the second direction, the second sub portion is adjacent to the first insulator in the second direction, and
a length of the second sub portion of the first pad portion, as viewed along the second direction, is less than a length of the first sub portion of the first pad portion, as viewed along the second direction.

2. The semiconductor device of claim 1, wherein
the first sub portion of the first pad portion includes a portion adjacent to the first insulator in the first direction, and
the portion of the first sub portion of the first pad portion adjacent to the first insulator and a portion of the second pad portion adjacent to the first insulator are aligned along the second direction.

3. The semiconductor device of claim 1, further comprising:
a third conductor including a fourth portion and a third pad portion, the fourth portion extending in the first direction, the third pad portion including a portion extending in the second direction from an end portion of the fourth portion;
a second insulator being adjacent to the second pad portion in the first direction on an opposite side of the first insulator; and
a third contact coupled to the third pad portion, wherein
the third pad portion includes a third sub portion and a fourth sub portion adjacent to each other in the first direction, each of the third sub portion and the fourth sub portion includes one end portion and another end portion of the third pad portion, as viewed in the second direction, the third sub portion is adjacent to the second pad portion in the second direction, the fourth sub portion is adjacent to the second insulator in the second direction, and
a length of the fourth sub portion of the third pad portion, as viewed along the second direction, is less than a length of the third sub portion of the third pad portion, as viewed along the second direction.

4. The semiconductor device of claim 3, wherein
the third sub portion of the third pad portion includes a portion adjacent to the second insulator in the first direction, and
the portion of the third sub portion of the third pad portion adjacent to the second insulator and a portion of the second pad portion adjacent to the second insulator are aligned along the second direction.

5. The semiconductor device of claim 3, wherein
a distance between the first pad portion and the third portion of the second conductor, as viewed along the first direction, and a distance between the third pad portion and the third portion of the second conductor, as viewed along the first direction, are substantially equal.

6. The semiconductor device of claim 5, wherein
a distance between the first portion of the first conductor and the second portion of the second conductor, as viewed along the second direction, and a distance between the second portion of the second conductor and the fourth portion of the third conductor, as viewed along the second direction, are substantially equal.

7. The semiconductor device of claim 5, wherein
a distance between the first sub portion of the first pad portion and the second pad portion, as viewed along the second direction, and a distance between the third sub portion of the third pad portion and the second pad portion, as viewed along the second direction, are substantially equal.

8. The semiconductor device of claim 3, further comprising:
a fourth conductor including a fifth portion, a sixth portion and a fourth pad portion and provided away from the third conductor, the fifth portion extending in the first direction, the sixth portion extending in the second direction from an end portion of the fifth portion and being adjacent to the third pad portion on a side opposite to the third portion of the second conductor, the fourth pad portion including a portion extending in the first direction from an end portion of the sixth portion and being adjacent to the second pad portion in the first direction, with the second insulator interposed; and
a fourth contact coupled to the fourth pad portion.

9. The semiconductor device of claim 8, further comprising:
a third insulator provided between the first conductor and the second conductor;
a fourth insulator provided between the second conductor and the third conductor; and
a fifth insulator provided between the third conductor and the fourth conductor, wherein
the first insulator, the second insulator, the third insulator, the fourth insulator and the fifth insulator are continuously provided.

10. The semiconductor device of claim 8, wherein
a distance between the first pad portion and the third portion of the second conductor, as viewed along the first direction, a distance between the third pad portion and the third portion of the second conductor, as viewed along the first direction, a distance between the third pad portion and the sixth portion of the fourth conductor, as viewed along the first direction, a distance between the first portion of the first conductor and the second portion of the second conductor, as viewed along the second direction, a distance between the second portion of the second conductor and the fourth portion of the third conductor, as viewed along the second direction, and a distance between the fourth portion of the third conductor and the fifth portion of the fourth conductor, as viewed along the second direction, are substantially equal.

11. The semiconductor device of claim 8, further comprising:
a fifth conductor including a seventh portion, a fifth pad portion and an eighth portion, the seventh portion extending in the first direction and being adjacent to the fifth portion of the fourth conductor in the second direction, with an insulator interposed, the fifth pad portion including a portion adjacent to the second pad portion in the second direction, with an insulator interposed, the eighth portion including a portion coupling the seventh portion and the fifth pad portion to each other and extending along the fourth conductor;

a sixth conductor including a ninth portion, a sixth pad portion and a tenth portion, the ninth portion extending in the first direction and being adjacent to the seventh portion of the fifth conductor in the second direction, with an insulator interposed, the sixth pad portion including a portion adjacent to the fifth pad portion in the second direction, with an insulator interposed, the tenth portion including a portion coupling the ninth portion and the sixth pad portion to each other and extending along the fifth conductor;
a seventh conductor including an eleventh portion, a seventh pad portion and a twelfth portion, the eleventh portion extending in the first direction and being adjacent to the ninth portion of the sixth conductor in the second direction, with an insulator interposed, the seventh pad portion including a portion adjacent to the fifth pad portion in the first direction, with an insulator and the tenth portion of the sixth conductor interposed, the twelfth portion including a portion coupling the eleventh portion and the seventh pad portion to each other and extending along the sixth conductor;
an eighth conductor including a thirteenth portion, an eighth pad portion and a fourteenth portion and extending in the first direction, the thirteenth portion being adjacent to the eleventh portion of the seventh conductor in the second direction, with an insulator interposed, the eighth pad portion including a portion adjacent to the sixth pad portion in the first direction, with an insulator interposed, and a portion adjacent to the seventh pad portion in the second direction, with an insulator interposed, the fourteenth portion including a portion coupling the thirteenth portion and the eighth pad portion to each other and extending along the seventh conductor;
a fifth contact coupled to the fifth pad portion;
a sixth contact coupled to the sixth pad portion;
a seventh contact coupled to the seventh pad portion; and
an eighth contact coupled to the eighth pad portion.

12. A semiconductor memory device, comprising:
a semiconductor device recited in claim 1;
a substrate;
a plurality of word lines provided above the substrate and being away from each other in a third direction intersecting both the first direction and the second direction;
a pillar provided through the plurality of word lines; and
a bit line electrically coupling the pillar and the first pad portion to each other.

13. The semiconductor memory device of claim 12, wherein
the bit line extends in the second direction.

14. The semiconductor memory device of claim 12, further comprising:
a transistor provided on the substrate;
a ninth conductor electrically coupled to the transistor and having a reverse tapered shape; and
a tenth conductor provided on the ninth conductor, electrically coupled to the first conductor, and having a tapered shape, wherein
the bit line is provided in a layer between the tenth conductor and the plurality of word lines, and
the first conductor is provided in a layer between the bit line and the tenth conductor.

* * * * *